(12) United States Patent
Sim et al.

(10) Patent No.: US 9,379,123 B2
(45) Date of Patent: Jun. 28, 2016

(54) SEMICONDUCTOR MEMORY DEVICES AND METHODS OF FABRICATING THE SAME

(71) Applicant: Samsung Electronics Co., Ltd., Suwon-si (KR)

(72) Inventors: Jae-Hwang Sim, Hwaseong-si (KR); Jinhyun Shin, Suwon-si (KR); Jong-Min Lee, Ulsan (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/848,423

(22) Filed: Sep. 9, 2015

(65) Prior Publication Data

US 2015/0380421 A1    Dec. 31, 2015

Related U.S. Application Data

(62) Division of application No. 14/096,195, filed on Dec. 4, 2013, now Pat. No. 9,166,012.

(30) Foreign Application Priority Data

Dec. 4, 2012   (KR) .................. 10-2012-0139774

(51) Int. Cl.
*H01L 21/764* (2006.01)
*H01L 27/115* (2006.01)
*H01L 29/423* (2006.01)

(52) U.S. Cl.
CPC ........ *H01L 27/11524* (2013.01); *H01L 21/764* (2013.01); *H01L 29/42324* (2013.01)

(58) Field of Classification Search
None
See application file for complete search history.

(56) References Cited

U.S. PATENT DOCUMENTS

| 7,279,377 | B2 | 10/2007 | Rueger et al. | |
| 7,795,080 | B2* | 9/2010 | Orimoto | H01L 27/115 438/128 |
| 7,927,963 | B2 | 4/2011 | Brown et al. | |
| 8,008,149 | B2* | 8/2011 | Kuniya | H01L 21/7682 257/316 |
| 8,383,479 | B2 | 2/2013 | Purayath et al. | |
| 8,492,224 | B2 | 7/2013 | Purayath et al. | |
| 8,546,909 | B2* | 10/2013 | Noda | H01L 21/28273 257/316 |
| 8,603,890 | B2* | 12/2013 | Purayath | H01L 21/764 257/E21.573 |
| 8,952,439 | B2* | 2/2015 | Suzuki | H01L 29/42324 257/312 |
| 2006/0194390 | A1* | 8/2006 | Imai | H01L 21/7682 438/257 |
| 2007/0235783 | A9 | 10/2007 | Sandhu et al. | |
| 2010/0230741 | A1* | 9/2010 | Choi | H01L 21/76229 257/324 |

(Continued)

FOREIGN PATENT DOCUMENTS

JP   2008 283095   11/2008
KR   1020010063713 A   7/2001

(Continued)

*Primary Examiner* — Bilkis Jahan
(74) *Attorney, Agent, or Firm* — Myers Bigel & Sibley, P.A.

(57) ABSTRACT

Provided are a semiconductor memory device and a method of fabricating the same. the semiconductor memory device may include a semiconductor substrate with a first trench defining active regions in a first region and a second trench provided in a second region around the first region, a gate electrode provided on the first region to cross the active regions, a charge storing pattern disposed between the gate electrode and the active regions, a blocking insulating layer provided between the gate electrode and the charge storing pattern and extending over the first trench to define a first air gap in the first trench, and an insulating pattern provided spaced apart from a bottom surface of the second trench to define a second air gap in the second trench.

15 Claims, 45 Drawing Sheets

(56) References Cited

U.S. PATENT DOCUMENTS

| | | |
|---|---|---|
| 2011/0155954 A1 | 6/2011 | Yersin et al. |
| 2011/0303967 A1* | 12/2011 | Harari .................. H01L 21/764 257/321 |
| 2011/0309425 A1* | 12/2011 | Purayath ............... H01L 21/764 257/316 |
| 2011/0309426 A1 | 12/2011 | Purayath et al. |
| 2012/0104485 A1 | 5/2012 | Yang et al. |
| 2012/0122297 A1 | 5/2012 | Na et al. |
| 2012/0132985 A1* | 5/2012 | Kai ................... H01L 27/11521 257/326 |
| 2012/0193698 A1 | 8/2012 | Noda et al. |

FOREIGN PATENT DOCUMENTS

| | | |
|---|---|---|
| KR | 1020040070799 A | 8/2004 |
| KR | 1020100020792 A | 2/2010 |
| TW | 2006-34981 | 10/2006 |
| WO | WO 2011/160001 A1 | 12/2011 |

\* cited by examiner

SEMICONDUCTOR MEMORY DEVICES AND METHODS OF FABRICATING THE SAME

CROSS-REFERENCE TO RELATED APPLICATIONS

This application claims priority under 35 U.S.C. §120 as a divisional application of U.S. patent application Ser. No. 14/096,195, filed Dec. 4, 2013, which in turn claims priority under 35 U.S.C. §119 from Korean Patent Application No. 10-2012-0139774 filed on Dec. 4, 2012 in the Korean Intellectual Property Office, the entire content of each of which is incorporated herein by reference.

BACKGROUND OF THE INVENTION

Some embodiments of the inventive concept relate to semiconductor memory devices and methods of fabricating the same, and in particular, to semiconductor memory devices with an air gap and a method of fabricating the same.

Due to their small-size, multifunctionality, and/or low-cost characteristics, semiconductor memory devices are considered important elements in the electronic industry. Some semiconductor memory devices may include a memory device for storing data, a logic device for processing data, and a hybrid device capable of performing various memory storage and data processing functions simultaneously.

As the electronics industry has advanced, the required level for the performance characteristics of semiconductor memory devices has increased. For example, the requirement for semiconductor memory devices of high speed may be increasing, and/or the requirement for high reliability of semiconductor memory devices may be increasing. However, patterns in semiconductor memory devices may be increasingly made smaller (finer) due to the trend of increasing the integration density of semiconductor memory devices. Decreasing the pattern size (line width) of semiconductor memory devices has made it more and more difficult to realize semiconductor memory devices having high operating speeds and/or excellent reliability.

SUMMARY

Some embodiments of the inventive concept provide semiconductor memory devices with improved electric characteristics.

Other example embodiments of the inventive concept provide methods of fabricating a semiconductor memory device with improved electric characteristics.

According to some embodiments of the inventive concept, a semiconductor memory device may include a semiconductor substrate with a first trench defining active regions in a first region and a second trench provided in a second region around the first region, a gate electrode provided on the first region to cross the active regions, a data storing pattern disposed between the gate electrode and the active regions, a blocking insulating layer provided between the gate electrode and the data storing pattern and extending over the first trench to define a first air gap in the first trench, and an insulating pattern provided spaced apart from a bottom surface of the second trench to define a second air gap in the second trench. The first and second trenches may have substantially the same depth, and a vertical height of the first air gap may be greater than that of the second air gap.

According to some other embodiments of the inventive concept, a semiconductor memory device may include a semiconductor substrate a plurality of first active regions and a second active region that are perpendicular to each other and are defined by a trench; a common source provided in the second active region; a plurality of drains provided in the first active regions, respectively; gate lines provided between the common source and the drains to cross the first active regions; data storing patterns interposed between the gate lines and the first active regions; and an air gap provided between the bottom surface of the trench and the gate lines to extend parallel to the first active regions. A vertical height of the air gap may be smaller near the common source and the drains than between the data storing patterns.

According to still other example embodiments of the inventive concept, a semiconductor memory device may include a semiconductor substrate including active regions that are defined by a trench; a gate electrode crossing the active regions and the trench; a data storing pattern between the gate electrode and the active regions; a blocking insulating layer provided between the data storing pattern and the gate electrode to extend on the trench; and an air gap provided in the trench below the blocking insulating layer. The uppermost position of the air gap is located between a top surface of the data storing pattern and a bottom surface of the data storing pattern, and a portion of the blocking insulating layer may be exposed by the air gap.

According to example embodiments of the inventive concept, a method of fabricating a semiconductor memory device may include forming patterns on a semiconductor substrate to be adjacent to each other, forming a trench in the semiconductor substrate between the patterns, forming a sacrificial pattern to define an air gap in the trench and cover lower sidewalls of the patterns, forming a blocking insulating layer and a gate electrode on the patterns to extend on the sacrificial pattern, and removing the sacrificial pattern through the air gap to form an extended air gap between the patterns. The extended air gap may be formed to expose a bottom surface of the blocking insulating layer.

According to other example embodiments of the inventive concept, a method of fabricating a semiconductor memory device may include preparing a semiconductor substrate with first and second regions adjacent to each other, patterning the semiconductor substrate to form a trench crossing the first and second regions, forming a first sacrificial layer on the semiconductor substrate to fill the trench, forming a sacrificial mask pattern on the first sacrificial layer to expose the first sacrificial layer of the second region, and anisotropically etching the sacrificial mask pattern and the first sacrificial layer to form a first sacrificial pattern in the trench. Here, a top surface of the first sacrificial pattern is located higher on the first region than on the second region. The method may further include forming a porous insulating layer on the first sacrificial patterns of the first and second regions, removing the first sacrificial patterns through pores of the porous insulating layer to form an air gap in the trench, and forming a gate electrode on the first region to cross the trench on the porous insulating layer. A vertical height of the air gap may be greater on the first region than on the second region.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

Figure 1:
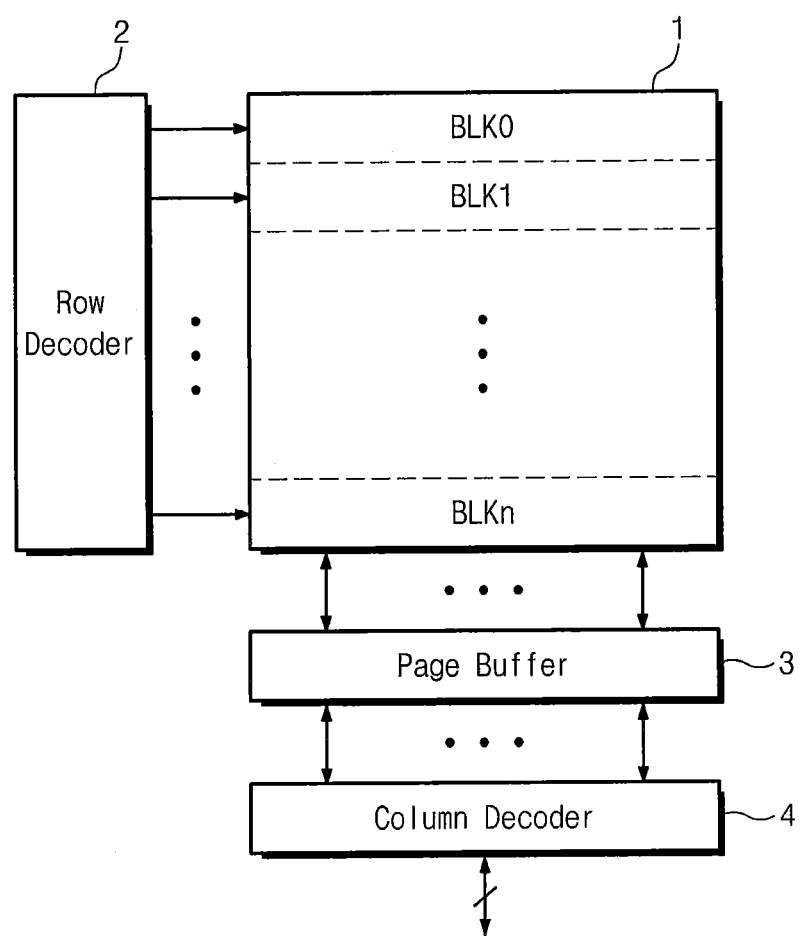
FIG. 1 is a block diagram of a semiconductor memory device according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Some embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
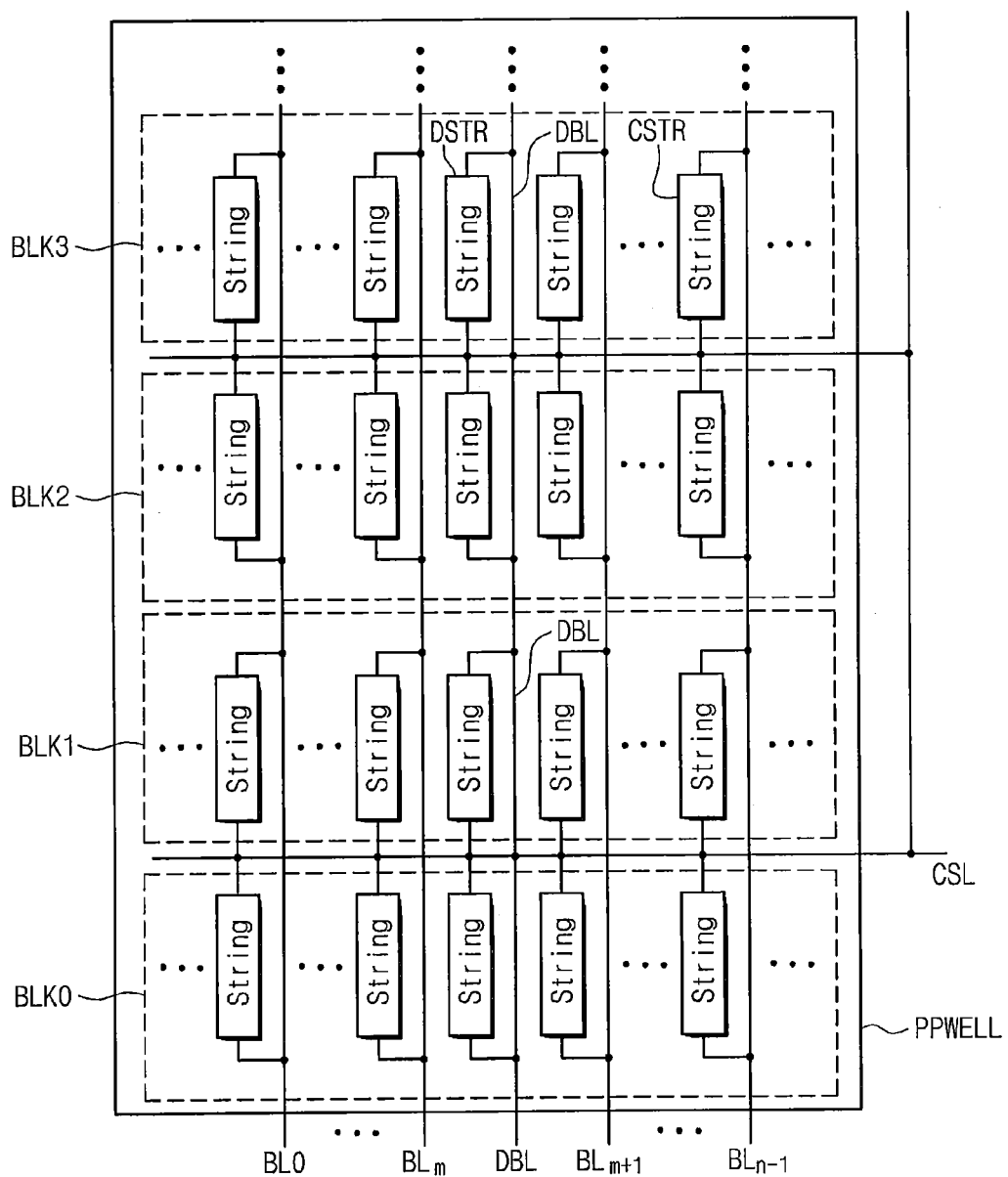
FIG. 2 is a block diagram illustrating a cell array of a semiconductor memory device according to some embodiments of the inventive concept.
Figure 3:
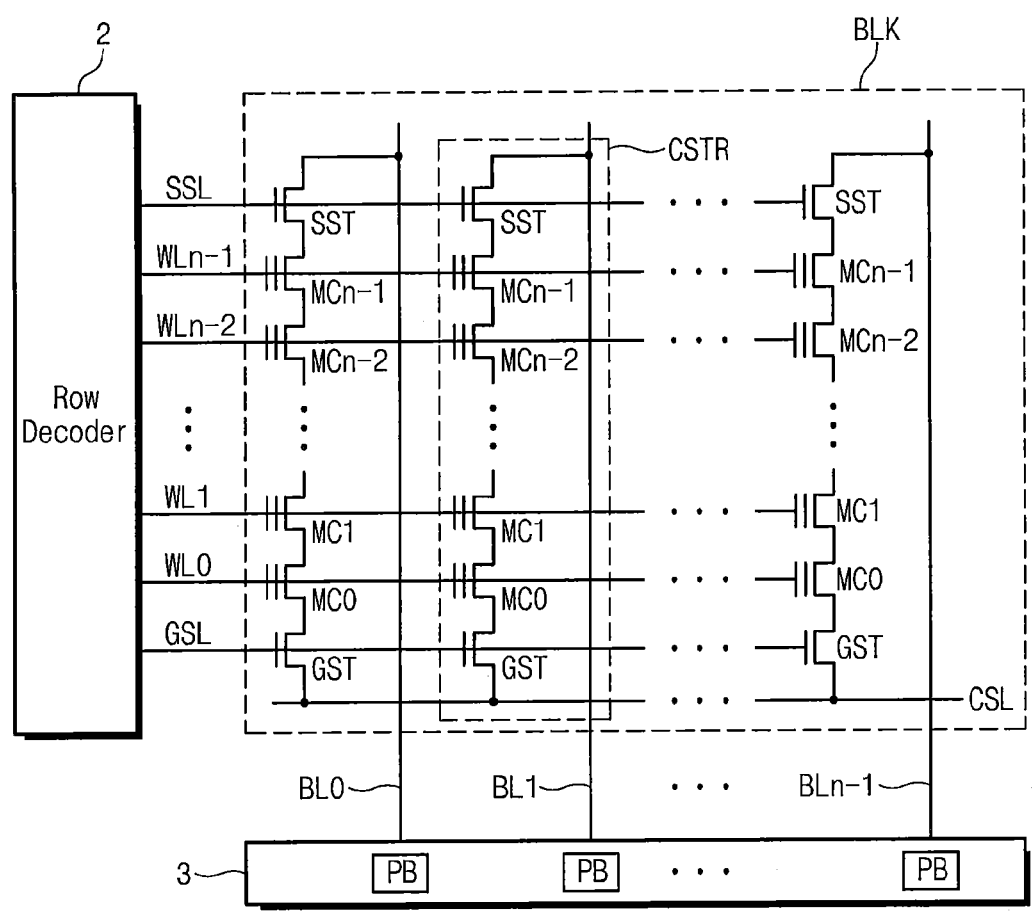
FIG. 3 is a schematic circuit diagram illustrating a semiconductor memory device according to some embodiments of the inventive concept.

FIG. 1 is a block diagram of a semiconductor memory device according to some embodiments of the inventive concept. FIG. 2 is a block diagram illustrating a cell array of a semiconductor memory device according to some embodiments of the inventive concept. FIG. 3 is a schematic circuit diagram illustrating a semiconductor memory device according to some embodiments of the inventive concept.

Referring to FIGS. 1 through 3, a semiconductor memory device according to some embodiments of the inventive concept may be an NAND FLASH memory device. The semiconductor memory device may include a memory cell array 1, a row decoder 2, a page buffer 3, and a column decoder 4.

The memory cell array may include a plurality of memory blocks BLK0-BLKn that are constituted by word lines, bit lines, and memory cells to store data.

Referring to FIG. 2, each of the memory block BLK0-BLKn may include a plurality of cell strings CSTR. Common source lines CSL may be provided below the bit lines BL0-BLn−1 to orthogonally cross the bit lines BL0-BLn−1. The cell strings CSTR may be applied with a common source voltage through the common source lines CSL.

Referring to FIG. 3, each of the cell strings CSTR may include at least one string selection transistor SST and at least one ground selection transistor GST. A plurality of memory cells or memory cell transistors MC0-MCn−1 may be provided to connect the string selection transistor SST to the ground selection transistor GST in series. Each of the cell strings CSTR may be electrically connected to the corresponding one of the bit lines BL0-BLm−1.

The row decoder 2 may select one of the memory blocks BLK0-BLKn and select one of the word lines $WL0$-$WL_{n-1}$ of the selected memory block, based on address information. The row decoder 2 may provide word line voltages, which may be generated by a voltage generating circuit (not shown), to the selected word line and non-selected word lines, in response to control of a control circuit (not shown).

The page buffer 3 may store data into the memory cells MC0-MCn−1 or read out data from the memory cells MC0-MCn−1, depending on an operation mode of the device. For example, the page buffer 3 may serve as a write driver, for a programming operation, and as a sense amplifier, for a reading operation. The page buffer 3 may be connected to the bit lines BL0-BLn−1, respectively, as shown in FIG. 3, or to pairs of the bit lines, respectively.

The column decoder 4 may be configured to provide an electric path for data transmission between the page buffer and an external circuit (e.g., memory controller).

Referring to FIGS. 1 through 3, reading and programming operations of the NAND FLASH memory devices may be performed in units of page, while an erase operation may be performed in units of block. The NAND FLASH memory device may be fabricated using a CMOS process technology, and semiconductor components (e.g., PMOS and NMOS transistors) of a peripheral circuit may be integrated on a P-type semiconductor substrate. In order to perform the erase operation in units of block, the memory cells or the memory cell array may be formed on a pocket P-well region PPWELL, which may be separated from the P-type semiconductor substrate by a deep N-well interposed therebetween. The deep N-well may be formed using an ion implantation process. The pocket P-well region PPWELL may be applied with 0V in the reading and programming operations and with a high voltage (e.g., of 20V) in the erase operation.

A semiconductor memory device and a method of fabricating the same, according to some embodiments of the inventive concept, will be described in detail with reference to FIGS. 4 through 18.

Figure 4:
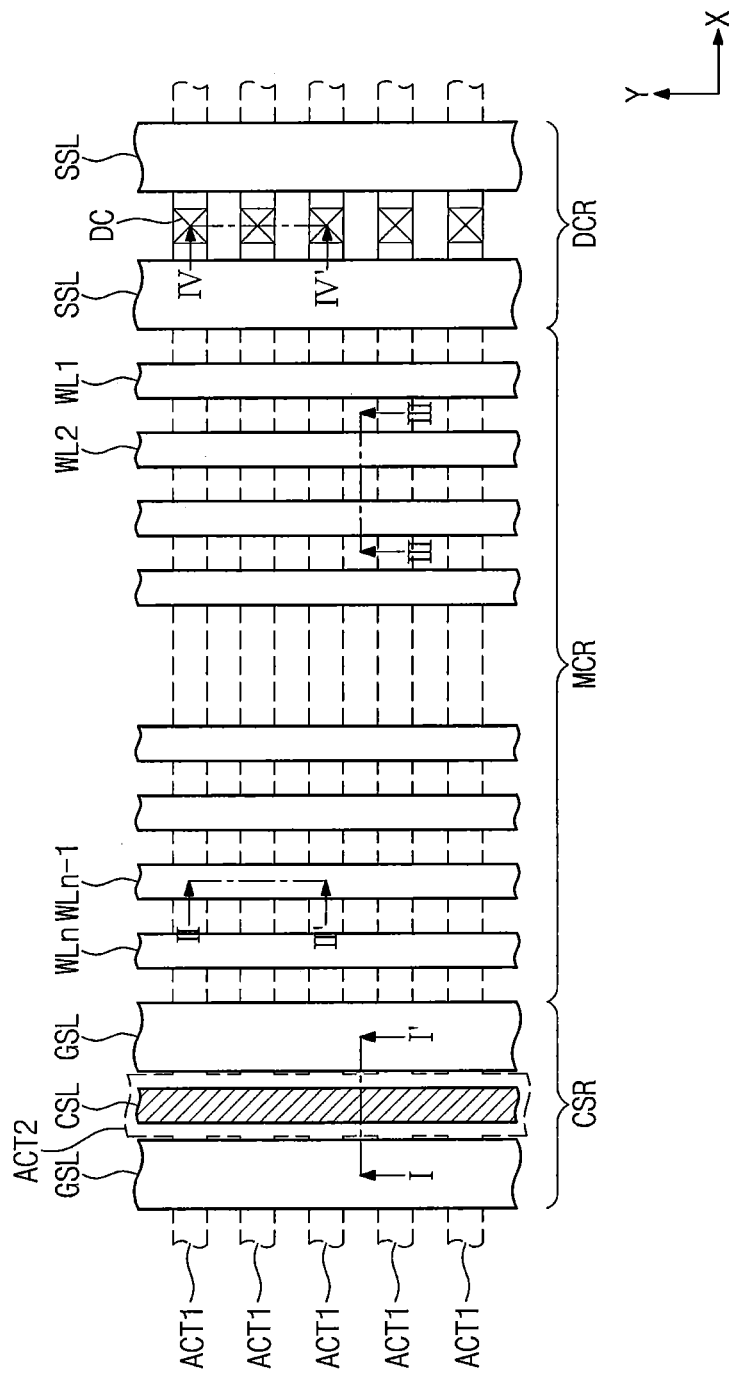
FIG. 4 is a plan view illustrating a cell array region of a semiconductor memory device according to some embodiments of the inventive concept.
Figure 16:
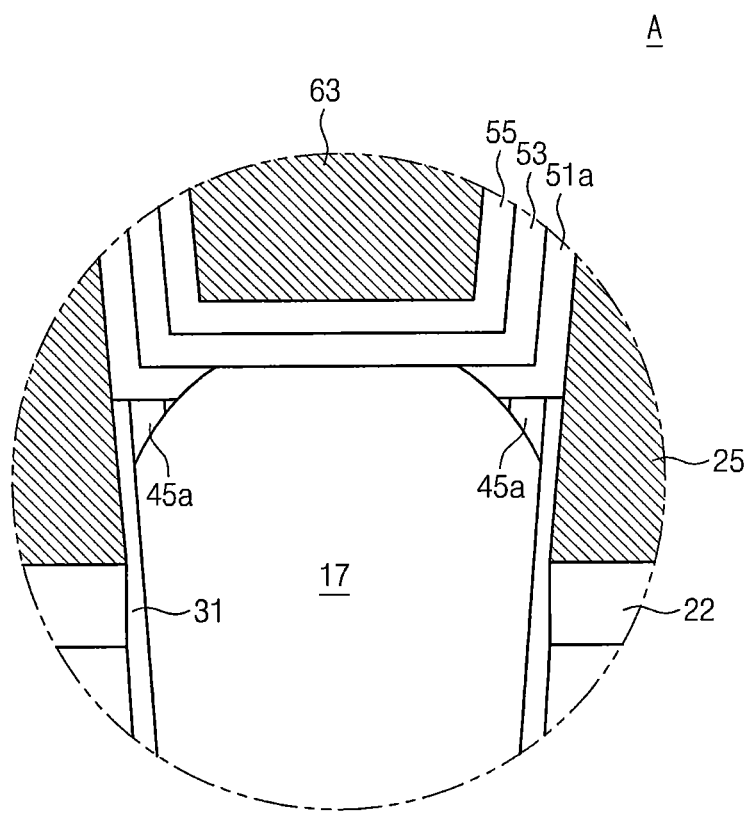
FIG. 16 is an enlarged view of a portion A of FIG. 15 according to some embodiments of the inventive concept.
Figure 17:
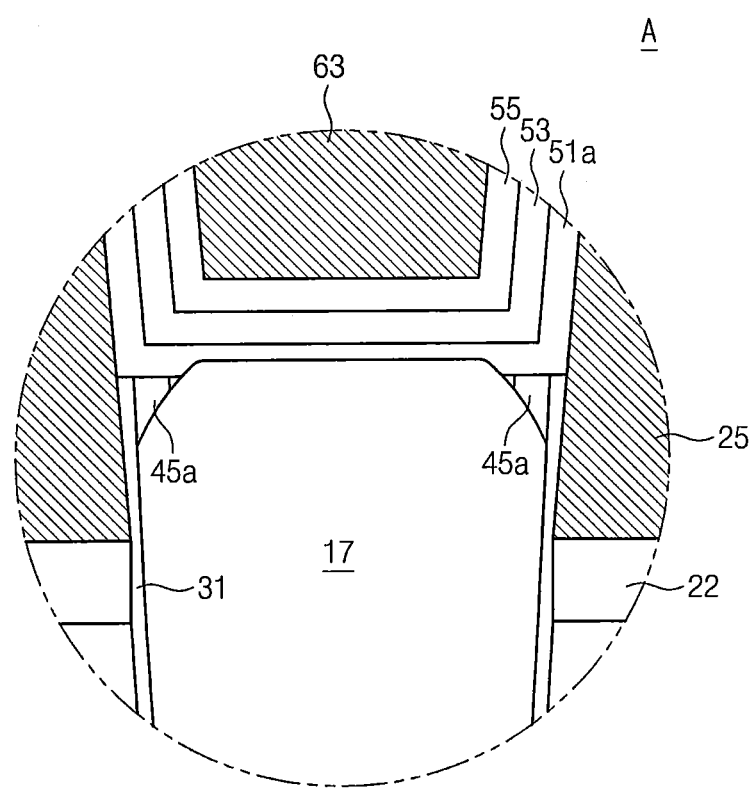
FIGS. 17 and 18 are enlarged views of the portion A of FIG. 15 according to modifications of some embodiments of the inventive concept.
Figure 18:
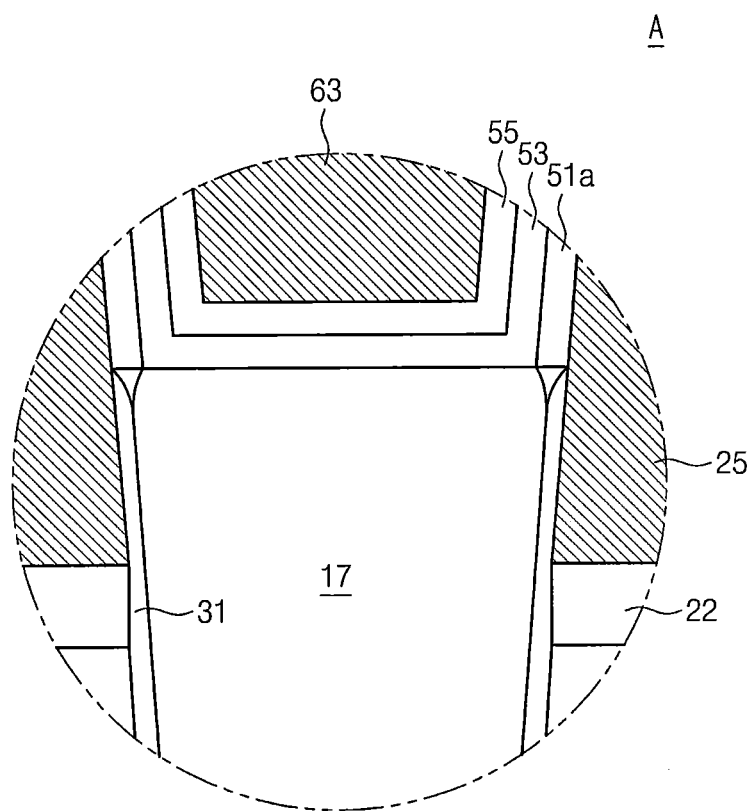

FIG. 4 is a plan view illustrating a cell array region of a semiconductor memory device according to some embodiments of the inventive concept. FIGS. 5 through 15 are sectional views taken along lines I-I', II-II', III-III', and IV-IV' of FIG. 4 and provided to describe a method of fabricating a semiconductor memory device according to some embodiments of the inventive concept. FIG. 16 is an enlarged view of a portion A of FIG. 15 according to some embodiments of the inventive concept. FIGS. 17 and 18 are enlarged views of the portion A of FIG. 15 according to modifications of some embodiments of the inventive concept.

Figure 5:
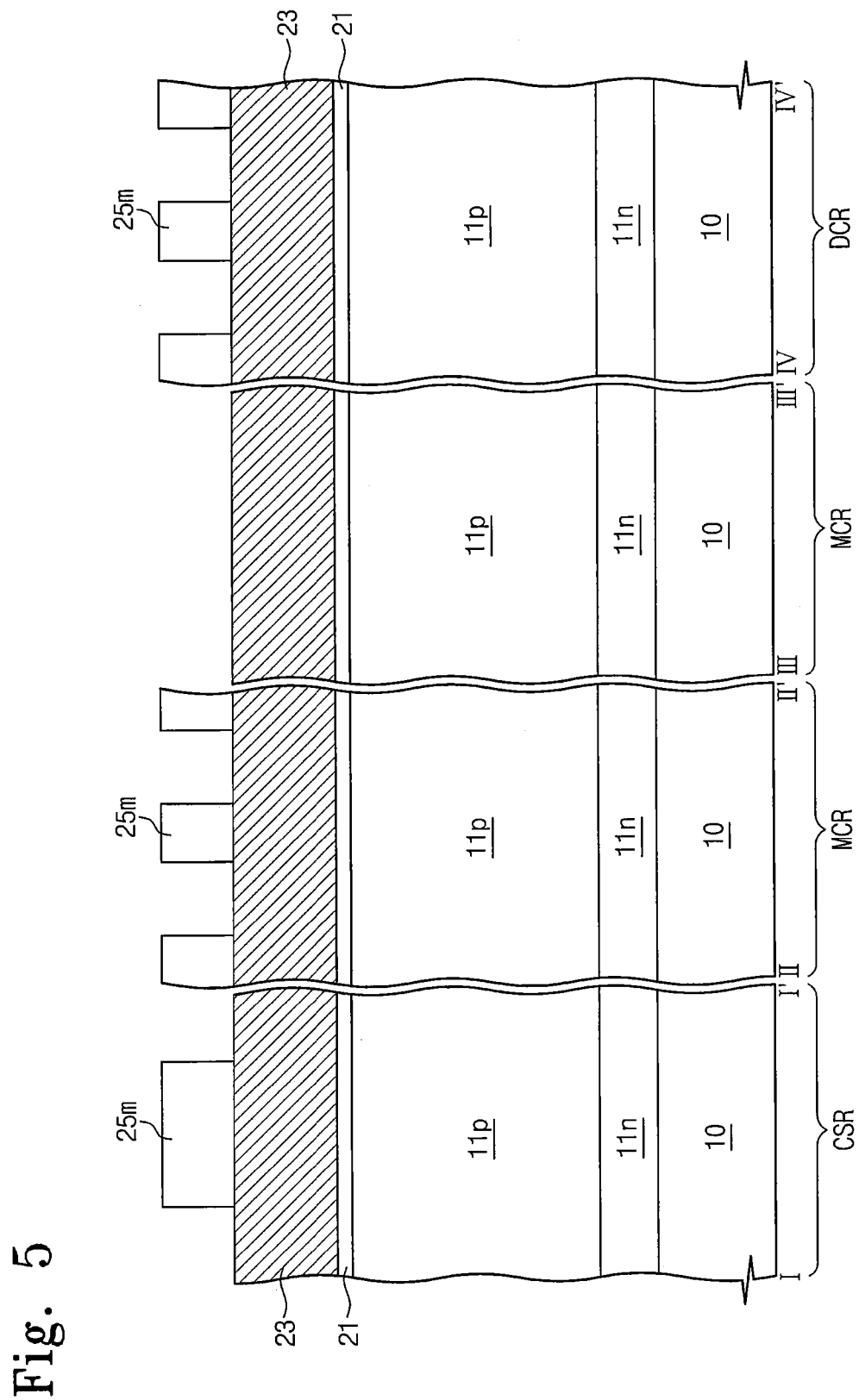
FIGS. 5 through 15 are sectional views taken along lines I-I', II-II', III-III', and IV-IV' of FIG. 4 and provided to describe a method of fabricating a semiconductor memory device according to some embodiments of the inventive concept.

Referring to FIGS. 4 and 5, a tunnel insulating layer 21 and a floating gate conductive layer 23 may be sequentially stacked on a semiconductor substrate 10.

In some embodiments, the cell array region of the semiconductor substrate 10 may include a common source region CSR, a bit line contact region DCR, and a memory cell region MCR therebetween. The semiconductor substrate 10 may have a first conductivity type, and the cell array region of the semiconductor substrate 10 may include a well doped region 11n having a second conductivity type and a pocket-well doped region 11p formed in the well doped region 11n to have the first conductivity type. In some embodiments, the memory cell arrays may be formed on the pocket-well doped region 11p.

The semiconductor substrate 10 may be one of, for example, a bulk silicon wafer, a silicon-on-insulator (SOI) wafer, a germanium wafer, a germanium-on-insulator (GOI) wafer, a silicon-germanium wafer, and/or a substrate including an epitaxial layer.

The tunnel insulating layer 21 may be formed on wholly the top surface of the semiconductor substrate 10. For example, the tunnel insulating layer 21 may be a silicon oxide ($SiO_2$) layer formed by thermal oxidation process. In some embodiments, the tunnel insulating layer 21 may be formed of at least one of high-k materials (such as $Al_2O_3$, $HfO_2$, $ZrO_2$, $La_2O_3$, $Ta_2O_3$, $TiO_2$, $SrTiO_3$ (STO), or $(Ba,Sr)TiO_3$ (BST)) and/or any combination thereof. The tunnel insulating layer 21 may be formed using a chemical vapor deposition (CVD) and/or an atomic layer deposition (ALD).

The floating gate conductive layer 23 may be formed by depositing a polysilicon layer on the tunnel insulating layer 21. In some embodiments, the floating gate conductive layer 23 may be doped with impurities, such as phosphorus or boron, during the deposition of the polysilicon layer. Some embodiments provide that the floating gate conductive layer 23 may be formed of a conductive material (e.g., metal silicides, metal nitrides, or metals), whose work-function is greater than that of the doped polysilicon layer.

Next, a mask pattern 25m may be formed on the floating gate conductive layer 23. The mask pattern 25m may include first mask patterns extending along a first direction (e.g., x-direction of FIG. 4) and a second mask pattern connected to the first mask patterns and elongated along a second direction (e.g., y-direction of FIG. 4) or perpendicular to the first direction. The first mask patterns may be provided on the memory cell region MCR and the bit line contact region DCR, and the second mask pattern may be provided on the common source region CSR. The mask pattern may be formed to expose a portion of the floating gate conductive layer 23 on the memory cell region MCR and the bit line contact region DCR.

Figure 6:
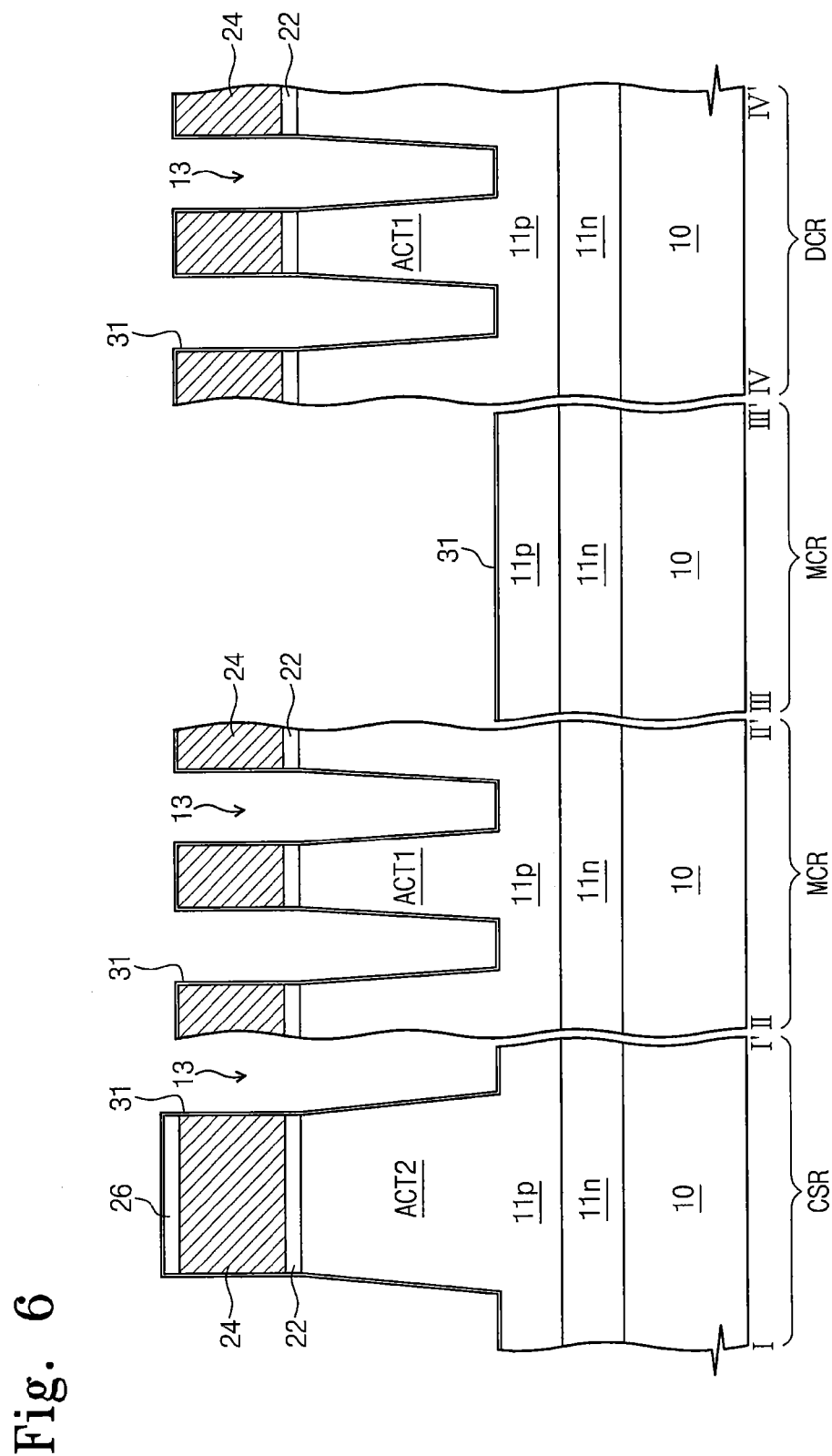

Referring to FIGS. 4 and 6, trenches 13 may be formed to define a tunnel insulating pattern 22, a floating gate pattern 24, and an active region on the semiconductor substrate 10.

Each of the trenches 13 may be formed to have a line shape, in plan view, and a downward tapered profile, in a vertical sectional view. For example, the trench 13 may be formed to have a bottom width smaller than a top width. In addition, the trench 13 may be formed to have an aspect ratio of about 2 or more, and the aspect ratio of the trench 13 may increase with increasing an integration density of the semiconductor device.

In some embodiments, the active region defined by the trenches 13 may include first active regions ACT1 and a second active region ACT2. For example, the first active regions ACT1 may be parallel to the first direction, and the second active region ACT2 may be parallel to the second direction or cross the first active regions ACT1.

The trenches 13 may be formed by anisotropically etching the tunnel insulating layer 21, the floating gate conductive layer 23, and the semiconductor substrate 10, using the mask patterns 25m as an etch mask. As the result of the anisotropic etching process, the tunnel insulating pattern 22 and the floating gate pattern 24 may be formed on the first and second active regions ACT1 and ACT2 of the semiconductor substrate 10. Since the tunnel insulating pattern 22 and the floating gate pattern 24 are patterned using the etching process for forming the first and second active regions ACT1 and ACT2, the tunnel insulating pattern 22 and the floating gate pattern 24 may be formed to have a line shape like as the first active regions ACT1.

During the formation of the trenches 13, the mask patterns 25m may be removed from the tops of the first active regions ACT1. For the mask pattern 25m on the second active region ACT2, a portion 26 of the mask pattern may remain on the floating gate pattern 24. However, in certain embodiments, the mask pattern 25m may be removed from the top of the floating gate pattern 24 by an additional process.

After the formation of the trenches 13, an insulating liner 31 may be formed on an inner surface of the trench 13. The insulating liner 31 may be formed to cover conformally exposed surfaces of the trench 13 and the floating gate pattern 24. The formation of the insulating liner 31 may include sequentially forming an oxide liner and a nitride liner.

The oxide liner may be formed by a thermal oxidation process. Thermal oxidation process may be performed on an exposed inner surface of the trench 13 by a dry oxidation using $O_2$ or a wet oxidation using $H_2O$. The formation of the oxide liner may contribute to cure and/or reduce defects (e.g., dangling bonds) on the inner surface of the trench 13 and damage caused by the anisotropic etching process.

By virtue of the nitride liner, it is possible to prevent the oxide liner from thickening and reduce a stress to be exerted to the inner surface of the trench 13. The nitride liner may be formed using a deposition technique with a good step coverage property, such as CVD or ALD.

Figure 7:
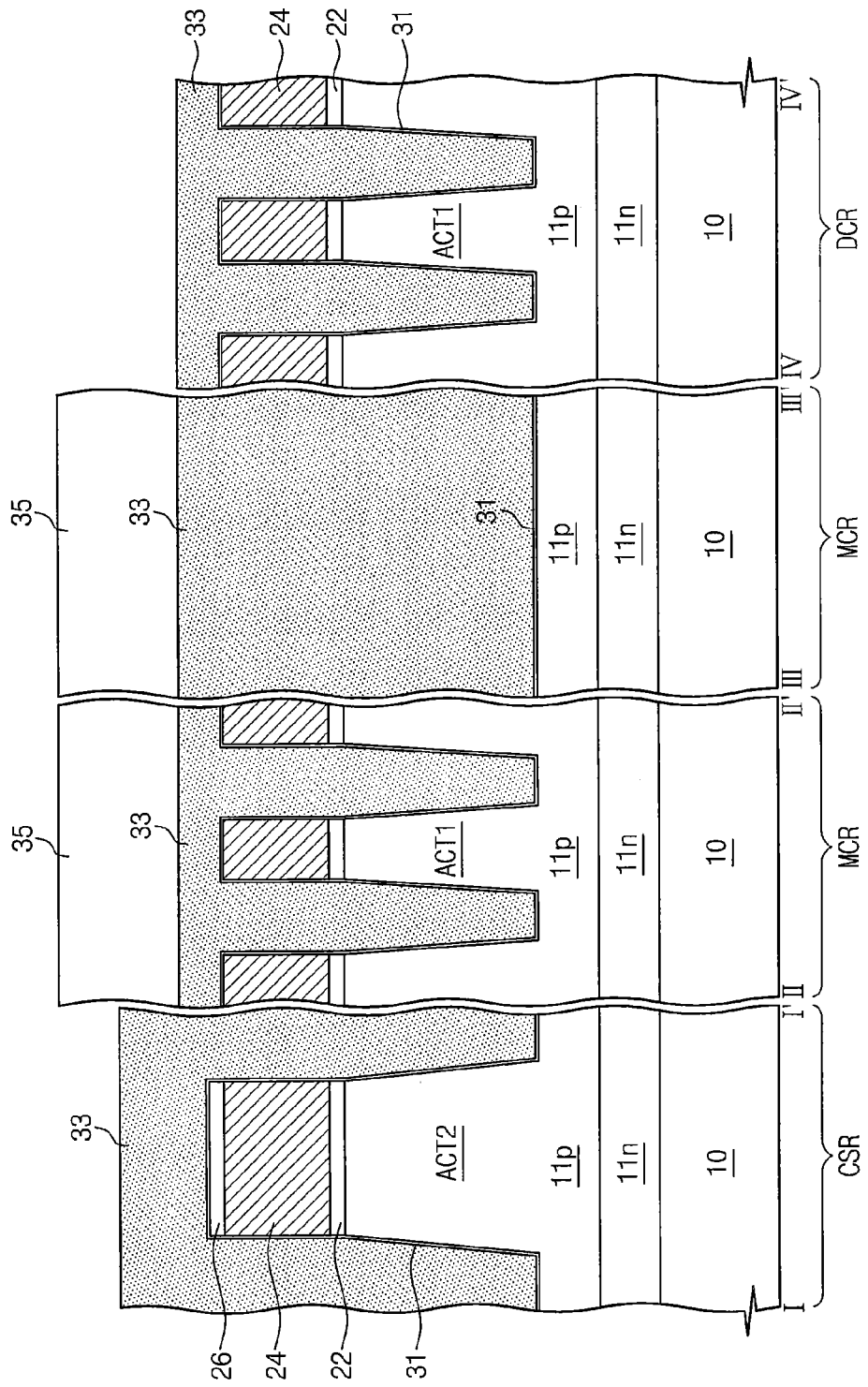

Referring to FIGS. 4 and 7, a first sacrificial layer 33 may be formed to fill the trenches 13.

The first sacrificial layer 33 may be formed of a material having an etch selectivity with respect to the floating gate pattern 24. In example embodiments, the first sacrificial layer 33 may be formed of a carbon-based material. For example, the first sacrificial layer 33 may be formed of a layer consisting of carbon and hydrogen atoms or of carbon, hydrogen and oxygen atoms. In addition, the first sacrificial layer 33 may be formed in such a way that it has a relatively high carbon content of about 80-99 weight percent.

In some embodiments, the first sacrificial layer 33 may be formed of a spin-on-hardmask (SOH) layer or an amorphous carbon layer (ACL). The SOH layer may include a carbon-based SOH layer or a silicon-based SOH layer. In other embodiments, the first sacrificial layer 33 may be formed of a photoresist layer or an amorphous silicon layer.

The first sacrificial layer 33 may be formed by a spin-coating method, thereby filling the trenches 13 and between the floating gate patterns 24. The first sacrificial layer 33 may be coated to be thicker than a depth of the trench 13. As the result of the spin-coating method, the first sacrificial layer 33 may have a top surface with a low roughness.

In some embodiments, the first sacrificial layer 33 may be formed by coating a layer to a thickness of about 800-1000 Å on the semiconductor substrate 10 with the trenches 13 and baking the resulting structure at a temperature of about 100-500° C. for about 30-300 sec. Here, the baking operation may be performed two or more times at different temperatures.

In some embodiments, as the result of the use of the spin-coating method, there is a difference in top height of the first sacrificial layer 33 between on the common source region CSR and on the memory cell region MCR. For example, the first sacrificial layer 33 may have a spatially non-uniform top surface. This may lead to non-uniformity in subsequent processes to be performed to the first sacrificial layer 33. For example, the air gap 15 may burst in a subsequent process. Accordingly, a sacrificial mask pattern 35 may be formed on the first sacrificial layer 33. The sacrificial mask pattern 35 may be formed to cover the first sacrificial layer 33 in the memory cell region MCR and expose the top surface of the first sacrificial layer 33 in the common source region CSR and the bit line contact region DCR. The sacrificial mask pattern 35 may have a top surface that is higher than the top surface of the first sacrificial layer 33 located on the common source region CSR and the bit line contact region DCR.

In some embodiments, when the same etching gas is used to etch the sacrificial mask pattern 35 and the first sacrificial layer 33 and, in this case, the sacrificial mask pattern 35 may be formed of a material having an etch selectivity ranging from 1:1 to 1:2 with respect to the first sacrificial layer 33. Accordingly, the sacrificial mask pattern 35 may be removed during the etching of the first sacrificial layer 33. The sacrificial mask pattern 35 may be formed of, for example, a photoresist layer or an amorphous carbon layer.

Figure 8:
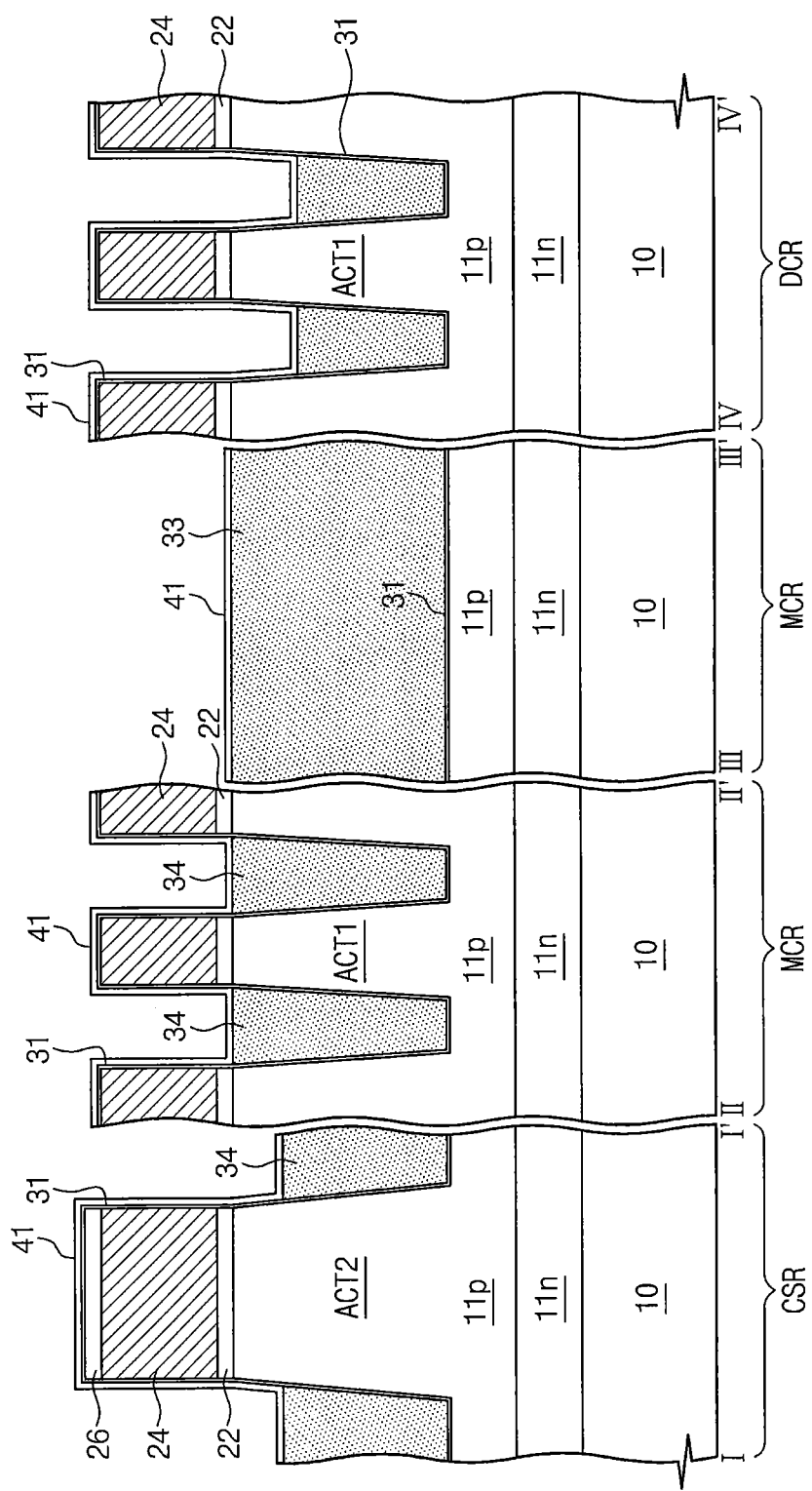

Referring to FIGS. 4 and 8, the first sacrificial layer 33 and the sacrificial mask pattern 35 may be anisotropically etched to form first sacrificial patterns 34 locally in the trenches 13.

In the memory cell region MCR, the first sacrificial layer 33 may be etched through the anisotropic etching process, after removing the sacrificial mask pattern 35. Accordingly, an etching amount of the first sacrificial layer 33 may be greater in the common source region CSR and the bit line contact region DCR than in the memory cell region MCR. In example embodiments, during the anisotropic etching process, the sacrificial mask pattern 35 may be etched to an etch rate that is equivalent to or faster than that of the sacrificial layer. As a result, the top surface of the first sacrificial pattern 34 on the common source region CSR and the bit line contact region DCR may be located below the top surface of the first sacrificial pattern 34 on the memory cell region MCR. In certain embodiments, the top surface of the first sacrificial pattern 34 on the memory cell region MCR may be located between top surfaces of the tunnel insulating pattern 22 and the semiconductor substrate 10. The top surface of the first sacrificial pattern 34 on the common source region CSR and the bit line contact region DCR may be located below the top surface of the semiconductor substrate 10. According to some embodiments of the inventive concept, the vertical position of the top surface of the first sacrificial pattern 34 may determine a volume of an air gap 15 to be formed in a subsequent process.

Thereafter, a porous insulating layer 41 may be formed on the first sacrificial pattern 34. The porous insulating layer 41 may be formed to cover conformally top surfaces of the first sacrificial pattern 34 and the floating gate pattern 24.

The porous insulating layer 41 may be an insulating layer with a plurality of pores. The porous insulating layer 41 may be a porous low-k dielectric. The porous insulating layer 41 may be formed by, for example, forming a carbon-doped silicon oxide layer and performing a thermal treatment thereto. As the result of thermal treatment, carbon atoms in a silicon oxide layer may be combined with silicon atoms to form a cage-like structure having a lower density than $SiO_2$. A silicon oxide layer having the cage-like structure may be a SiCOH layer. The SiCOH layer may be formed using trimethylsilane (3MS, $(CH_3)_3$—Si—H), tetramethylsilane (4MS, $(CH_3)_4$—Si), and/or vinyltrimethylsilane (VTMS, $CH_2$=CH—$Si(CH_3)_3$), among others, as a precursor. An oxygen-containing oxidant gas (e.g., hydrogen peroxide) may be used for oxidizing the precursor. The carbon-doped silicon oxide layer may be formed using a PECVD or ALD process. The carbon-doped silicon oxide layer may be converted into the porous insulating layer 41 (e.g., p-SiCOH) by thermal treatment process. In some embodiments, the porous insulating layer 41 may be formed by forming a porous silicon layer and thermally treating the porous silicon layer. The porous insulating layer 41 may be formed in such a way that pores therein have a size or a diameter that ranges from several ten nanometers to several hundred nanometers. The porous insulating layer 41 may have a porosity of 5-50 vol %. In a subsequent wet etching process using HF etching solution, the porous insulating layer 41 may have an etch rate higher than a blocking insulating layer GI to be formed subsequently. For example, the porous insulating layer 41 may have an etch rate of about 100 to 200 Å/min, when the porous insulating layer 41 is etched using a 200:1 dilute HF solution.

Figure 9:
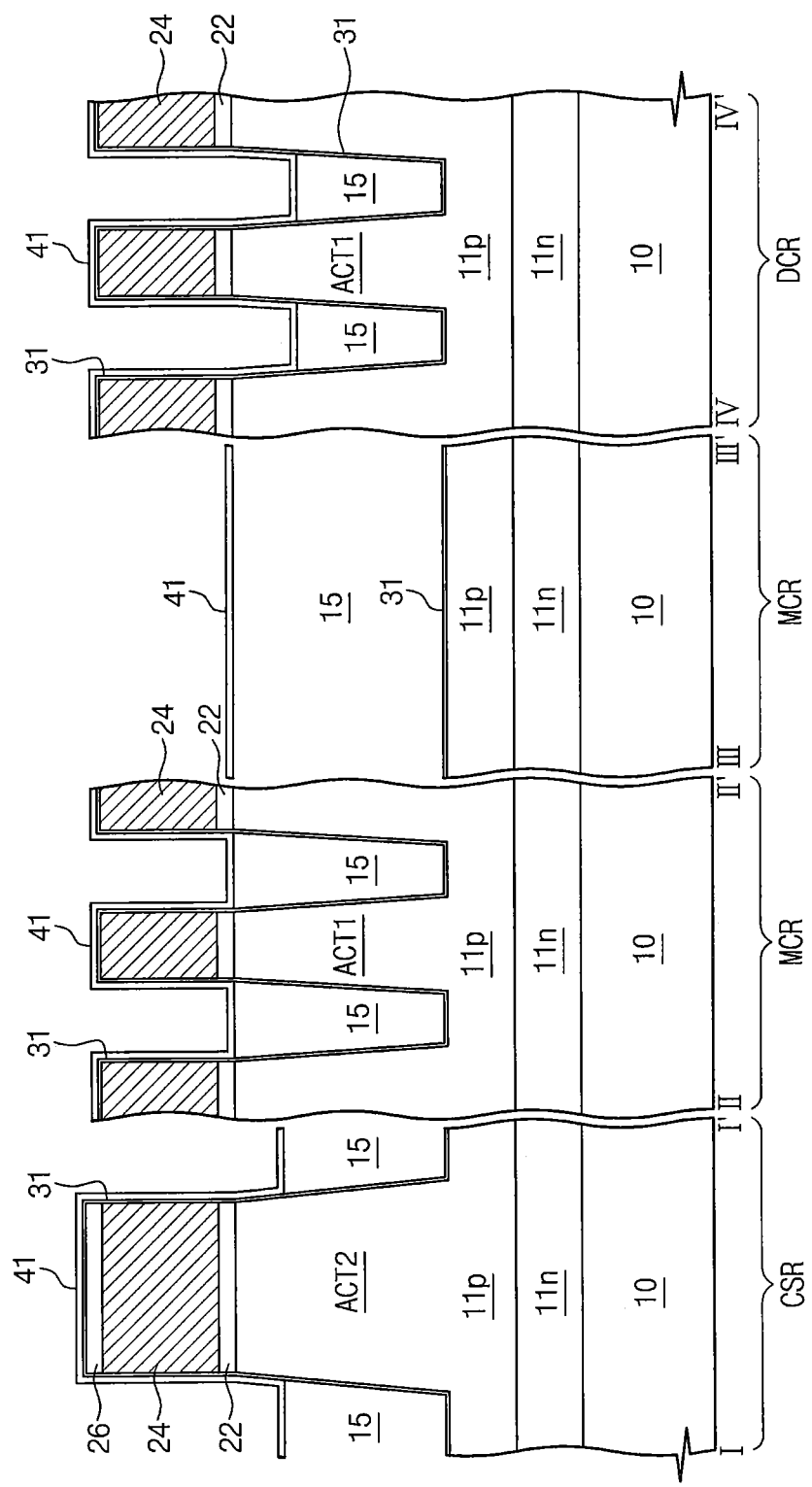

Referring to FIGS. 4 and 9, the first sacrificial pattern 34 may be removed through the pores of the porous insulating layer 41. In the case where the first sacrificial pattern 34 is formed of the SOH layer or a photoresist layer, the removal of the first sacrificial pattern 34 may be performed using an ashing process, in which oxygen, ozone, or UV is used, or using a wet cleaning process. For example, in the case where the first sacrificial pattern 34 is formed of the SOH layer, the removal of the first sacrificial pattern 34 may be performed using a fluorine-based etching gas mixed with $O_2$ gas and/or with $O_2$ gas and Ar gas. Here, the fluorine-based etching gas may contain $C_3F_6$, $C_4F_6$, $C_4F_8$, and/or $C_5F_8$. In the case where the first sacrificial pattern 34 is formed of an amorphous silicon layer, the removal of the first sacrificial pattern 34 may be performed by an isotropic etching process using a chlorine-containing gas.

As the result of the removal of the first sacrificial pattern 34, an air gap 15 may be formed below the porous insulating layer 41. The air gap 15 may be delimited by the trench 13 and the porous insulating layer 41. In some embodiments, the air gap 15 may be delimited by the insulating liner 31 provided on inner surface of the trench 13 and the porous insulating layer 41. The air gap 15 may be formed between the first active regions ACT1 of the semiconductor substrate 10. According to some embodiments of the inventive concept, a vertical height of the air gap 15 may be determined by that of the first sacrificial pattern 34, and thus, if the first sacrificial pattern 34 is sufficiently thick, the air gap 15 may be provided between the floating gate patterns 24.

Further, in some embodiments, a vertical height of the air gap 15 on the memory cell region MCR may be different from that on the common source region CSR and the bit line contact region. For example, the top of the air gap 15 may be defined by a bottom surface of the porous insulating layer 41, and thus, the top of the air gap 15 on the memory cell region MCR may be located between the top surfaces of the semiconductor substrate 10 and the tunnel insulating layer 21. Further, the top of the air gap 15 on the common source region CSR and the bit line contact region DCR may be located below the top surface of the semiconductor substrate 10.

In some embodiments, after the formation of the air gap 15, a densification process may be performed on the porous insulating layer 41. The densification process may be performed using a rapid thermal treatment process. For example, during the rapid thermal treatment process, the first porous insulating layer 40 may be heated to a temperature of about 800° C. to 1000° C. in an atmosphere of $N_2O$, NO, $N_2$, $H_2O$ or $O_2$. As the result of the densification process, the porous insulating layer 41 provided with the pores may have an increased density. For example, the size or the number of the pores may be reduced.

Figure 10:
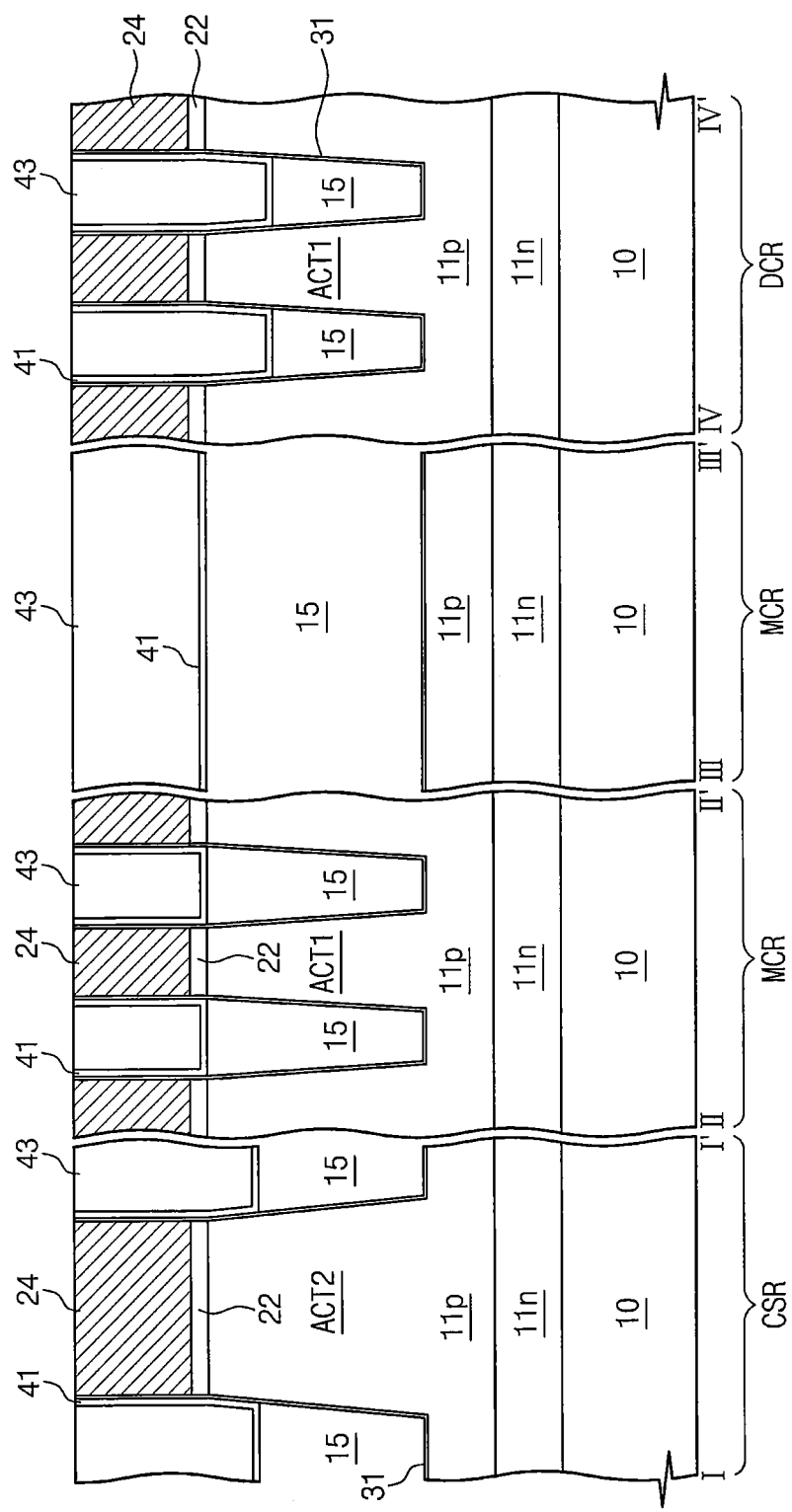

Referring to FIGS. 4 and 10, a second sacrificial layer 43 may be formed to cover the porous insulating layer 41. The second sacrificial layer 43 may be formed to fill a space between the floating gate patterns 24. Further, the second sacrificial layer 43 may be formed to cover the top surface of the floating gate pattern 24. The second sacrificial layer 43 may be formed of a silicon oxide layer with a good gap-fill property. The second sacrificial layer 43 may be formed of at least one of, for example, high density plasma (HDP) oxide, Tetra Ethyl Ortho Silicate (TEOS), Plasma Enhanced TEOS (PE-TEOS), $O_3$-TEOS, Undoped Silicate Glass (USG), PhosphoSilicate Glass (PSG), Borosilicate Glass (BSG), BoroPhosphoSilicate Glass (BPSG), Fluoride Silicate Glass (FSG), Spin On Glass (SOG), Tonen SilaZene (TOSZ) and/or any combination thereof.

Figure 11:
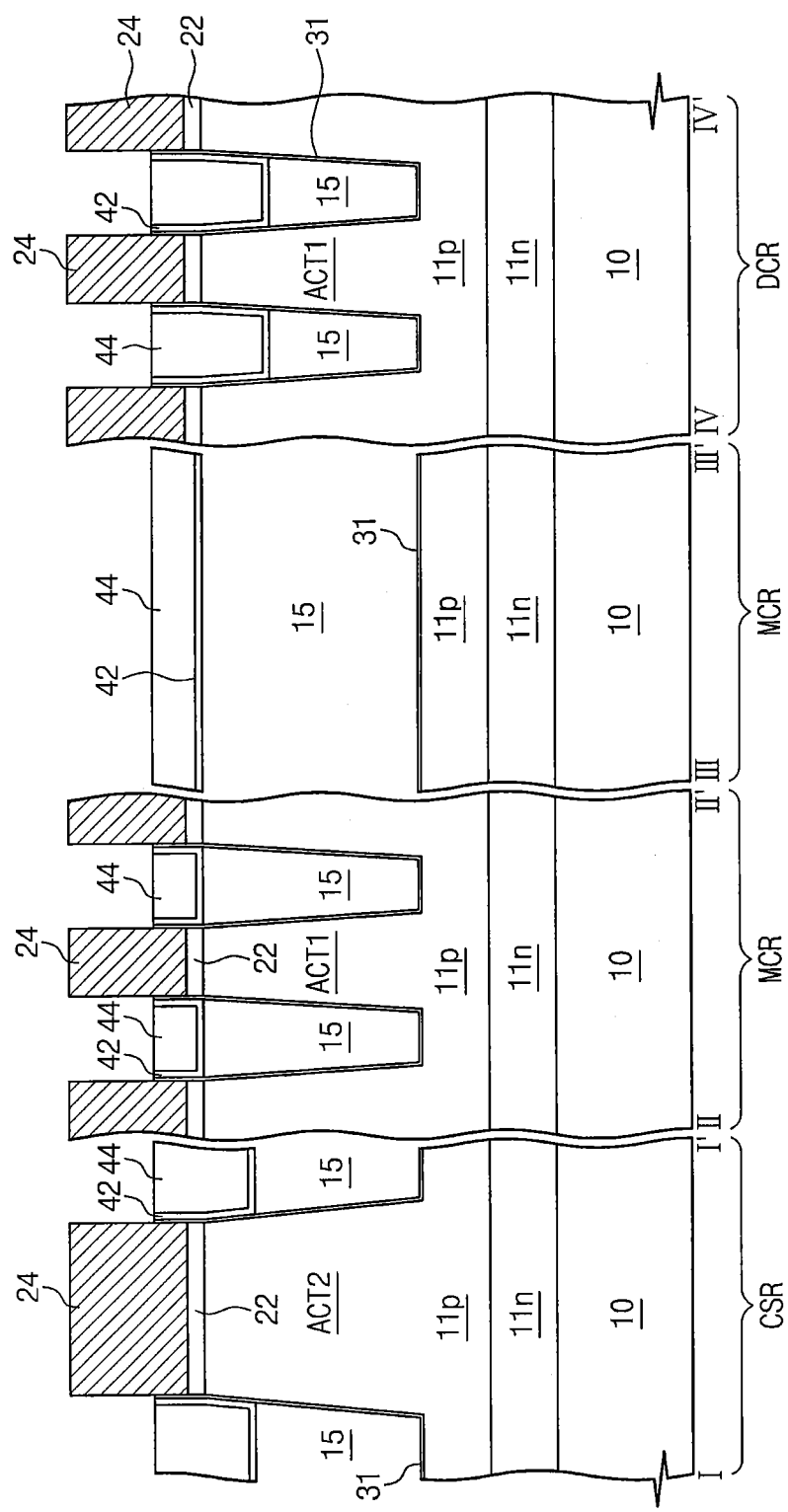

Referring to FIGS. 4 and 11, the second sacrificial layer 43 and the porous insulating layer 41 may be recessed to expose top and side surfaces of the floating gate patterns 24. The recess process may be performed using an isotropic and/or anisotropic etching process. As the result of the recess process, a porous insulating pattern 42 and a second sacrificial pattern may be formed between the floating gate patterns 24. The porous insulating pattern 42 and the second sacrificial pattern 44 may be formed to have top surfaces that are located between top surfaces of the floating gate pattern 24 and the tunnel insulating pattern 22. Further, the porous insulating pattern 42 and the second sacrificial pattern 44 may be thicker on the common source region CSR and the bit line contact region DCR than on the memory cell region MCR. In other words, the porous insulating pattern 42 may have a bottom surface, whose vertical level is lower on the common source region CSR and the bit line contact region DCR than on the memory cell region MCR. The porous insulating pattern 42 may be formed to cover a sidewall of the tunnel insulating pattern 22.

In certain embodiments, corners of the floating gate pattern 24 may be rounded during the process of etching the second sacrificial layer 43 and the porous insulating layer 41. In addition, an additional process (e.g., thermal treatment or plasma treatment) may be performed to treat surfaces of the floating gate patterns 24.

Figure 12:
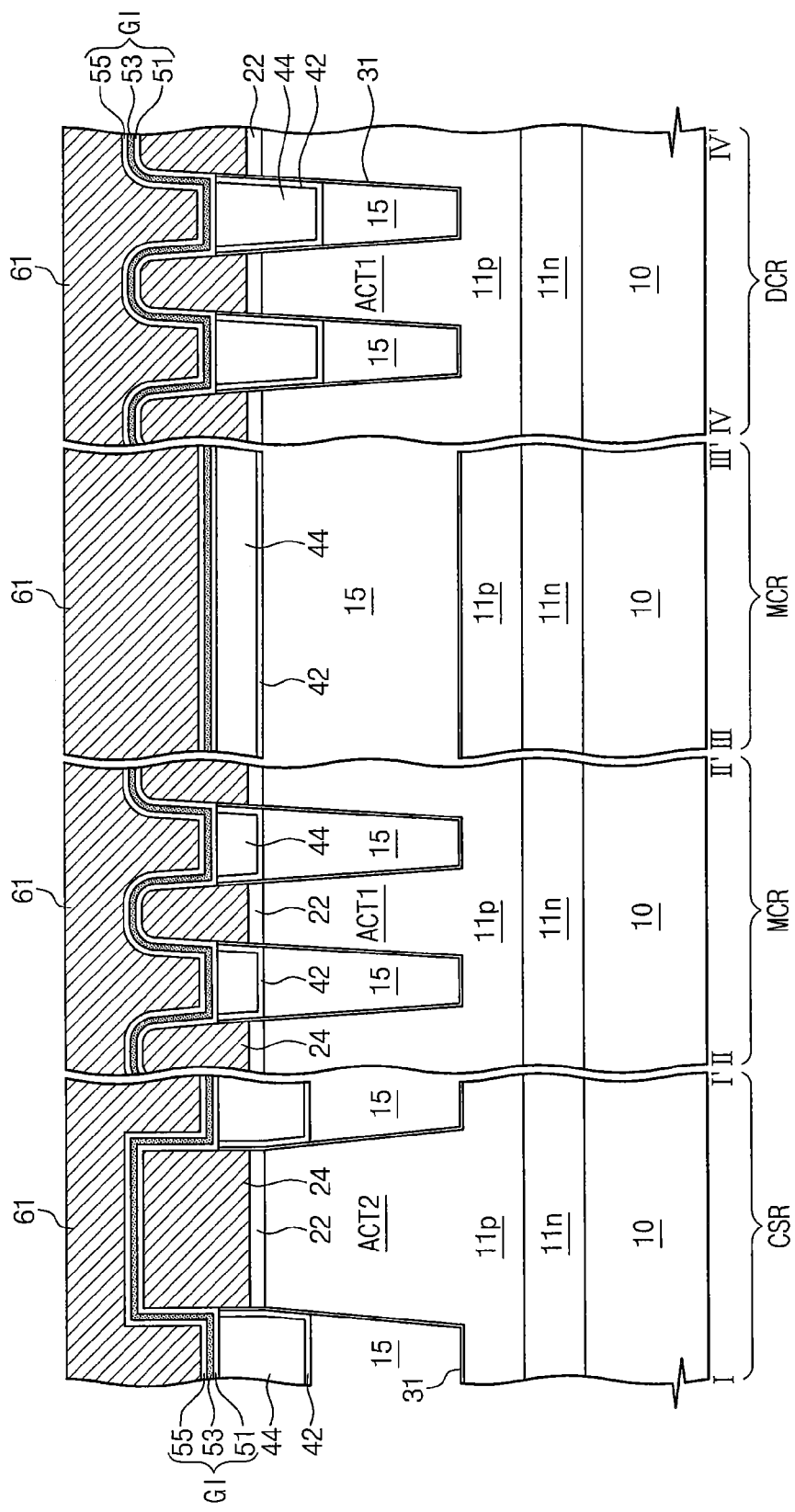

Referring to FIGS. 4 and 12, a blocking insulating layer GI may be formed. In example embodiments, the blocking insulating layer GI may be formed to conformally cover surfaces of the floating gate patterns 24 and top surfaces of the porous insulating pattern 42 and the second sacrificial pattern 44. The blocking insulating layer GI may be formed using a deposition process, such as chemical vapor deposition (CVD), sub-atmospheric CVD (SACVD), low-pressure CVD (LPCVD), plasma-enhanced CVD (PECVD), and/or physical vapor deposition (PVD).

The blocking insulating layer GI may be formed of a material whose dielectric constant is higher than that of the tunnel insulating pattern 22. For example, the blocking insulating layer GI may be formed of a silicon oxide layer and a silicon nitride layer or be a multilayered structure including at least one of silicon oxide, silicon nitride, and/or high-k dielectrics (e.g., $Al_2O_3$, $HfO_2$, $ZrO_2$, $La_2O_3$, $Ta_2O_3$, $TiO_2$, $SrTiO_3$ (STO), and/or $(Ba,Sr)TiO_3$ (BST)). In some embodiments, the blocking insulating layer GI may include a first dielectric 51, a second dielectric 53, and a third dielectric 55 that are sequentially stacked on the structure with the floating gate patterns 24. The first dielectric 51 and the second dielectric 53 may have different dielectric constants from each other. For example, the first and third dielectrics 51 and 55 may be formed of a silicon oxide layer, and the second dielectric 53 may be formed of a silicon nitride layer.

Thereafter, a control gate conductive layer 61 may be formed on the blocking insulating layer GI. The control gate conductive layer 61 may be formed by depositing a conductive material on the blocking insulating layer GI, and it may be formed to fill a gap between the floating gate patterns 24.

The control gate conductive layer 61 may include at least one of metals (e.g., tungsten, aluminum, titanium, and/or tantalum), conductive metal nitrides (e.g., titanium nitride and/or tantalum nitride), doped semiconductors (e.g., doped silicon, doped germanium, and/or doped silicon germanium), and/or metal silicides.

Figure 13:
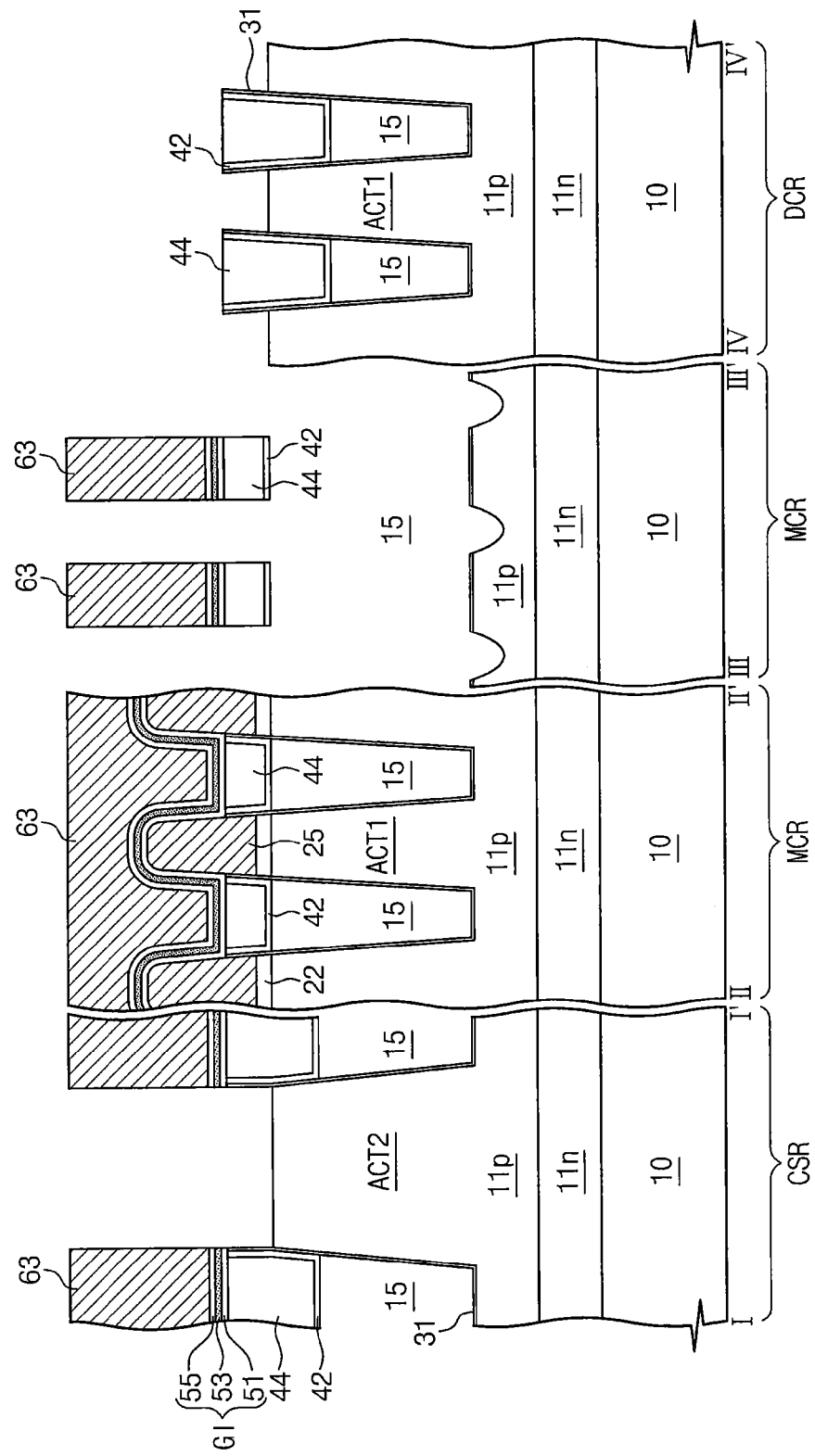

Referring to FIGS. 4 and 13, control gate electrodes 63 may be formed to cross the first active regions ACT1.

In some embodiments, the formation of the control gate electrodes 63 may include forming a mask pattern (not shown) to cross the first active regions ACT1, and sequentially and anisotropically etching the control gate conductive layer 61, the blocking insulating layer GI, and the floating gate pattern 24 using the mask pattern (not shown) as an etch mask. As the result of the anisotropic etching of the floating gate pattern 24, floating gate electrodes 25 may be locally formed on the first active region ACT1. For example, the floating gate electrodes 25 may be formed on the first active region ACT1 to be spaced apart from each other, while the floating gate pattern 24 may be removed from the second active region ACT2. The control gate electrodes 63 may be formed on the memory cell region MCR to extend along the second direction or y-axis direction of FIG. 4 and fill gaps that are provided between the floating gate electrodes 25 along the second direction.

As the result of the formation of the control gate electrode 63, word lines WL1-WLn, ground selection lines GSL, and string selection lines SSL crossing the first active regions ACT1 may be formed. The word lines WL1-WLn may be formed on the memory cell region MCR, the ground selection lines GSL may be formed adjacent the second active region ACT2 on the common source region CSR, and the string selection lines SSL may be formed on the bit line contact region DCR. A pair of the ground selection lines GSL may be formed adjacent, but spaced apart from, each other by the second active region ACT2 interposed therebetween. A pair of the string selection lines SSL may be formed adjacent, but spaced apart from, each other, on the bit line contact region DCR.

As the result of the formation of the control gate electrodes 63, the air gap 15 may be exposed between the control gate electrodes 63 on the memory cell region MCR. Some embodiments provide that the top surface of the semiconductor substrate 10 or the top surface of the tunnel insulating pattern 22 may be exposed between the control gate electrodes 63. Since the second sacrificial pattern 44 is thicker on the common source region CSR and the bit line contact region DCR than on the memory cell region MCR, the air gap 15 can be prevented from being exposed at the common source region CSR and the bit line contact region DCR, during the anisotropic etching process for forming the control gate electrodes 63.

Figure 14:
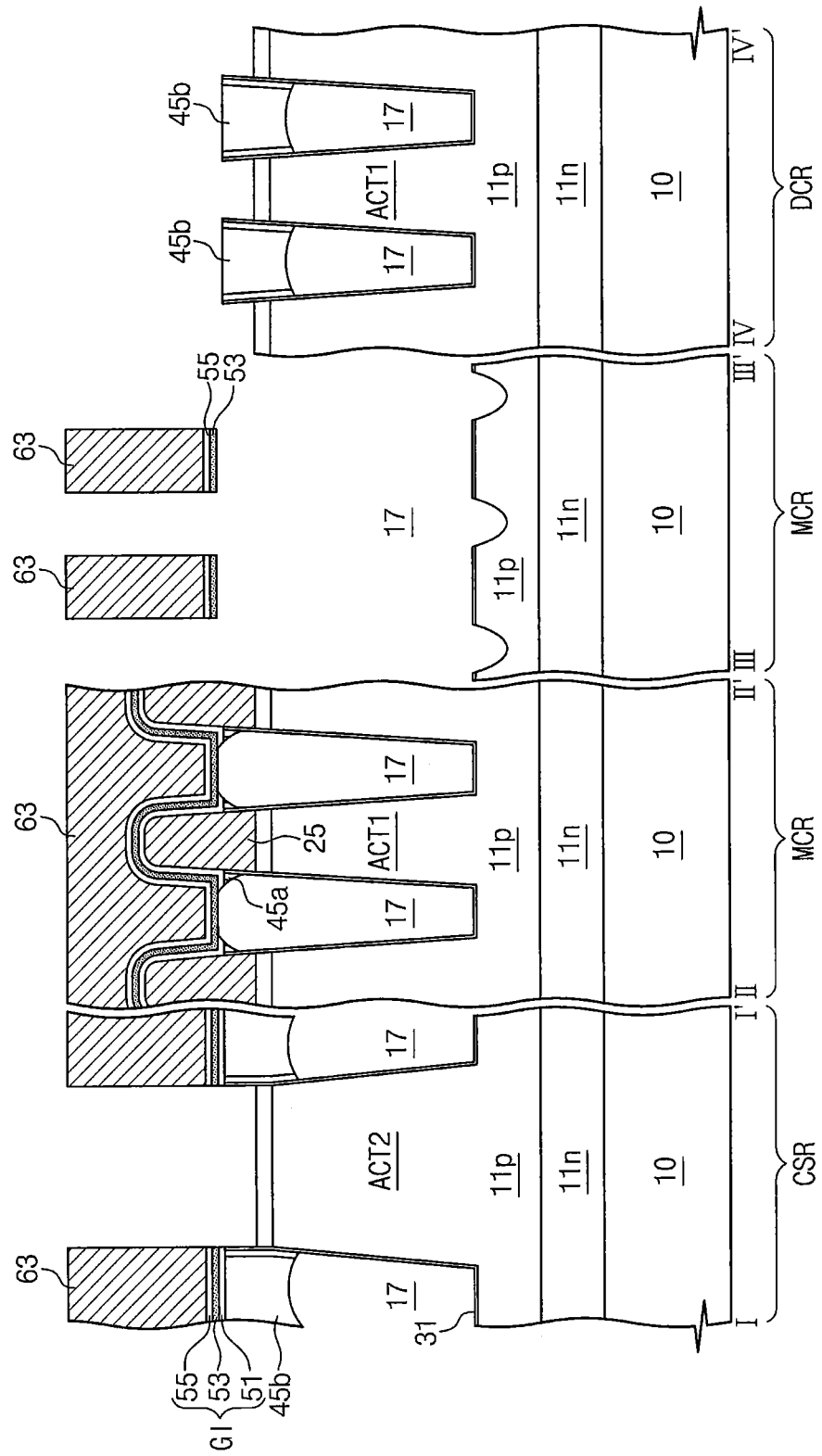

Referring to FIGS. 4 and 14, the porous insulating pattern 42 and the second sacrificial pattern 44 may be removed between the floating gate electrodes 25 to expand the air gap 15.

The expanding of the air gap 15 may include isotropically etching the porous insulating pattern 42 and the second sacrificial pattern 44. For example, an etching solution may be supplied through the air gap 15 exposed between the control gate electrodes 63, and thus, the porous insulating pattern 42 and the second sacrificial pattern 44 may be sequentially etched in a wet etching manner. In some embodiments, the wet etching process may be performed to expose a bottom surface of the blocking insulating layer GI on the memory cell region MCR. As the result of the removal of the porous insulating pattern 42 and the second sacrificial pattern 44, the air gap 15 of the memory cell region MCR may be vertically expanded between the first active regions ACT1 to form an expanded air gap 17. In some embodiments, in the case where the porous insulating pattern 42 and the second sacrificial pattern 44 are formed of silicon oxide based materials, the wet etching process may be performed using at least one of SC1 solution containing NH$_4$OH/H$_2$O$_2$/H$_2$O mixture, diluted HF solution, and/or buffer oxide etchant (BOE).

Furthermore, since the second sacrificial pattern 44 is thicker on the common source region CSR and the bit line contact region DCR than on the memory cell region MCR, the porous insulating pattern 42 and the second sacrificial pattern 44 may remain partially on the common source region CSR and the bit line contact region DCR. For example, a remaining sacrificial pattern 45b may remain on the bit line contact region DCR and the common source region CSR. The remaining sacrificial pattern 45b may have a rounded bottom surface, which may be located below the top surface of the semiconductor substrate 10. In other words, the blocking insulating layer GI may be exposed by the expanded air gap 17 in the memory cell region MCR, but it may not be exposed by the expanded air gap 17 in the common source region CSR and the bit line contact region DCR. A vertical height H1 of the expanded air gap 17 on the memory cell region MCR may be different from a vertical height H2 of the expanded air gap 17 on the common source region CSR and the bit line contact region DCR.

In more detail, as shown in FIG. 16, the porous insulating layer 41, the second sacrificial pattern 44, and the blocking insulating layer GI on the memory cell region MCR may be partially etched by the process of expanding the air gap 15, and thus, the blocking insulating layer GI between the floating gate electrodes 25 may have a reduced thickness. For example, in the case where the first and second dielectrics 51 and 53 are formed of a silicon oxide layer and a silicon nitride layer, respectively, the second dielectric 53 may serve as an etch stop layer in the process of expanding the air gap 15. Accordingly, the expanded air gap 17 may be formed to expose a portion of the second dielectric 53 through the first dielectric 51. Meanwhile, a residue pattern 45a (e.g., with a rounded profile) may remain on a lower sidewall of the floating gate electrode 25, as the result of the wet etching process of expanding the air gap 15. In some embodiments, as shown in FIG. 17, the process of expanding the air gap 15 may be performed to remove the porous insulating layer 41 and the second sacrificial pattern 44 and expose a portion of the first dielectric 51. In other words, the process of expanding the air gap 15 may be performed to etch partially the porous insulating layer 41, the second sacrificial pattern 44, the first dielectric 51. As shown in FIG. 17, the second dielectric 53 may not be exposed by the expanded air gap 17, due to a first dielectric 51a with a recessed bottom surface. In still other embodiments, as shown in FIG. 18, the porous insulating pattern 42 and the second sacrificial pattern 44 may be completely removed using the blocking insulating layer GI as an etch stop layer.

Figure 15:
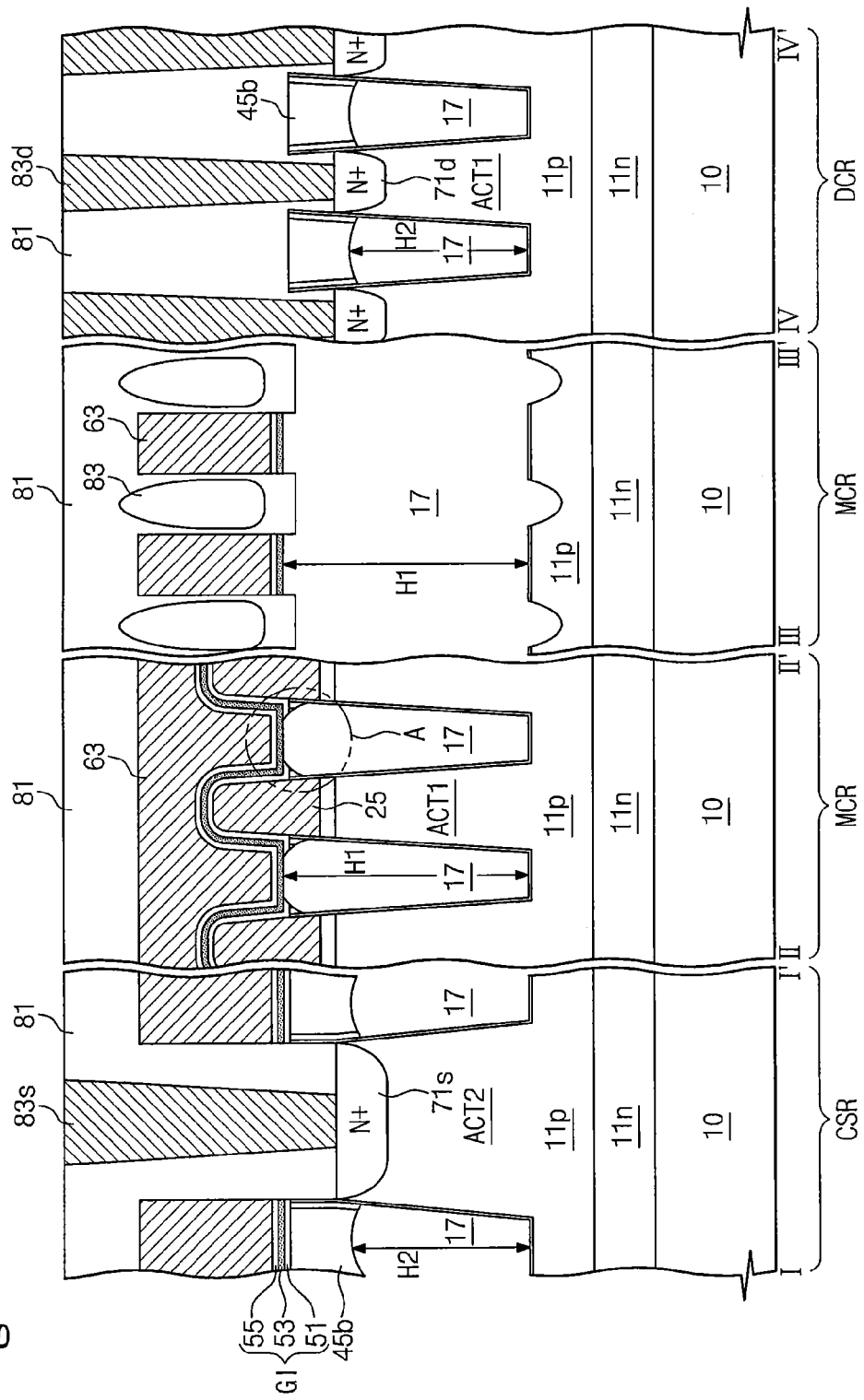

Referring to FIGS. 4 and 15, a common source impurity region 71s may be formed in the second active region ACT2 of the common source region CSR, and a drain impurity region 71d may be formed in the first active regions ACT1 of the bit line contact region DCR.

The common source impurity region 71s may be formed by doping the second active region ACT2 between the pair of the ground selection lines GSL with impurities. The drain impurity region 71d may be formed by doping the first active region ACT1 between the pair of the string selection lines SSL with impurities. In some embodiments, the common source impurity region 71s and the drain impurity region 71d may be formed to have a different (e.g., second) conductivity type from that of the pocket-well doped region 11p.

In addition, cell doped regions may be formed in the first active regions ACT1 between the word lines WL of the memory cell region MCR to have the second conductivity type different from that of the pocket-well doped region 11p. In some embodiments, the doped regions may serve as source/drain regions of the memory cell transistors. In other embodiments, the memory cell transistors may be connected to each other by inversion regions, which may be induced by fringe fields from voltages to be applied to the word lines WL. In this case, it is possible to connect the memory cell transistors electrically to each other without the formation of the cell doped regions.

Thereafter, an interlayered insulating layer 81 may be formed on the structure provided with the control gate electrodes 63. In some embodiments, the interlayered insulating layer 81 may be formed using a deposition process with a poor step coverage property. The interlayered insulating layer 81 may be formed of, for example, a silicon oxide layer. The interlayered insulating layer 81 may be formed to fill spaces between gate structures, each of which includes the floating gate electrodes 25, the blocking insulating layer GI, and the control gate electrode 63.

The interlayered insulating layer 81 may be formed using a physical vapor deposition with a poor step coverage property. As a result, a deposition thickness of the interlayered insulating layer 81 may be smaller on sidewalls of the control gate electrodes 63 than on top surfaces of the control gate electrodes 63. Further, an overhang may be formed near upper corners of the control gate electrodes 63, and thus, inter-gate air gaps 83 may be formed between the control gate electrodes 63.

Referring to FIGS. 4 and 15, a common source line 83s and CSL may be formed on the common source region CSR, and bit line contact plugs 83d may be formed on the bit line contact region DCR.

The common source line 83s and CSL may be electrically connected to the common source impurity region 71s and be elongated parallel to the word lines WL. Accordingly, all of the source regions of the cell strings may have substantially the same potential. The bit line contact plugs 83d may penetrate the interlayered insulating layer 81 and be coupled to the drain impurity regions 71d, respectively.

The common source line 83s and CSL and the bit line contact plugs 83d may be formed by patterning the interlayered insulating layer 81 to form contact holes exposing the common source impurity region 71s and the drain impurity region 71d, and then, filling the contact holes with a conductive layer. Here, the contact holes may be formed by anisotropically etching the interlayered insulating layer 81 between the expanded air gaps 17. Since, during the anisotropic etching process, the remaining sacrificial pattern 45b remains on the expanded air gaps 17 of the common source region CSR and the bit line contact region DCR, the expanded air gaps 17 can be prevented from being exposed by the contact holes. Accordingly, it is possible to prevent a conductive material from being diffused or provided into the expanded air gaps 17, when the common source line 83s and the bit line contact plugs 83d are formed.

A semiconductor device, which may be fabricated by methods according to some embodiments of the inventive concept, will be described in detail with reference to FIGS. 15 through 19.

Figure 19:
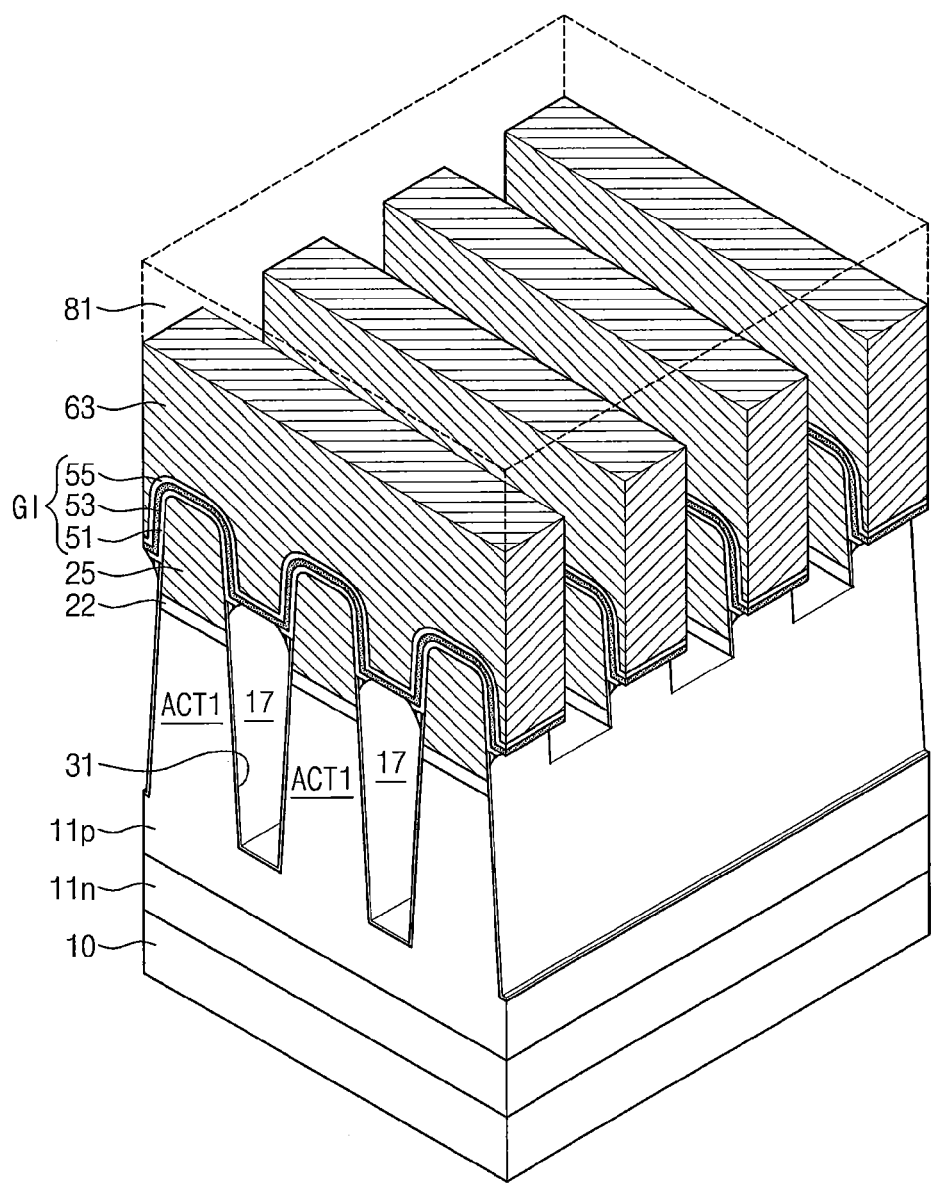
FIG. 19 is a perspective view illustrating a memory cell region of a semiconductor device fabricated by the fabricating method according to some embodiments of the inventive concept.

FIG. 19 is a perspective view illustrating a memory cell region of a semiconductor device fabricated by the fabricating methods according to some embodiments of the inventive concept.

Referring to FIGS. 4 and 19, the trenches 13 may be provided on the semiconductor substrate 10 to define the active regions. In some embodiments, the semiconductor substrate 10 may include the cell array region with the common source region CSR, the bit line contact region DCR, and the memory cell region MCR therebetween. In some embodiments, the trenches 13 may be provided to define the first active regions ACT1, each of which is shaped like a line extending along the first direction, and the second active region ACT2 extending along the second or y-axis direction or perpendicular to the first direction.

A gate structure may be provided on the semiconductor substrate 10. The gate structure may include the tunnel insulating pattern 22, the floating gate electrode 25, the blocking insulating layer GI, and the control gate electrode 63 that are sequentially stacked on the semiconductor substrate 10.

In detail, the tunnel insulating pattern 22 may be formed on the active region of the semiconductor substrate 10. The tunnel insulating pattern 22 may serve as a potential barrier preventing electric charges from moving freely from the semiconductor substrate 10 to the floating gate electrode 25 or vice versa. Programming and erase operations of NAND FLASH memory device may be executed using tunneling phenomenon of the electric charges, which may occur through the tunnel insulating pattern 22.

A plurality of the floating gate electrodes 25 may be locally formed on each of the active regions. For example, a plurality of the floating gate electrodes 25 may be provided spaced apart from each other, on the first active region ACT1. The floating gate electrode 25 may have a sloped sidewall. For example, a lower width of the floating gate electrode 25 may be greater than the upper width thereof. The floating gate electrode 25 may be formed of an n- or p-type doped polysilicon layer. Electric charges may be accumulated into the floating gate electrode 25 by the tunneling through the tunnel insulating pattern 22.

The blocking insulating layer GI may separate the floating gate electrode 25 electrically from the control gate electrode 63. The blocking insulating layer GI may extend over the floating gate electrodes 25. The blocking insulating layer GI may conformally cover the structure provided with the floating gate electrodes 25. For example, the blocking insulating layer GI may cover top and both side surfaces of the floating gate electrode 25. In some embodiments, the blocking insulating layer GI may include the first dielectric 51 and the second dielectric 53, which are stacked in a sequential manner. Here, the first dielectric 51 and the second dielectric 53 may have dielectric constants that are different from each other and greater than that of the tunnel insulating pattern 22. For example, the blocking insulating layer GI may include a silicon nitride layer and a silicon oxide layer, which are stacked in a sequential manner.

The control gate electrode 63 may be provided to cross the first active regions ACT1. The control gate electrode 63 may extend between the floating gate electrodes 25. For example, between the first active regions ACT1, a bottom surface of the control gate electrode 63 may be located below the top surface of the floating gate electrode 25. The control gate electrode 63 may be configured to control an electric potential of the floating gate electrode 25, during operations of the nonvolatile memory device. In addition, since the control gate electrode 63 includes a portion interposed between the floating gate electrodes 25, a coupling ratio between the control and floating gate electrodes 63 and 25 can be increased, and this makes it possible to reduce electrical interference or disturbance between the floating gate electrodes 25 adjacent to each other.

In some embodiments, the expanded air gap 17 may be provided in the trench 13. The expanded air gap 17 may be filled with air to have a lower dielectric constant than those of conventional insulating layers (e.g., silicon oxide), and thus, it is possible to reduce electric interference (i.e., coupling capacitance) among the active regions and the floating gate electrodes 25.

For example, the expanded air gap 17 may be provided between the first active regions ACT1 and between the floating gate electrodes 25. In some embodiments, the vertical height H1 of the expanded air gap 17 on the memory cell region MCR may be different from the vertical height H2 of the expanded air gap 17 on the common source region CSR and the bit line contact region DCR.

According to some embodiments of the inventive concept, the expanded air gap 17 on the memory cell region MCR may be defined by bottom and side surfaces of the trench 13 provided with the insulating liner 31 and a bottom surface of the blocking insulating layer GI. A vertical height of the expanded air gap 17 may be changed depending on a vertical distance between bottoms of the blocking insulating layer GI and the trench 13. In some embodiments, on the memory cell region MCR, a top surface or a highest position of the expanded air gap 17 may be located between top surfaces of the floating gate electrode 25 and the tunnel insulating pattern 22.

The expanded air gap 17 on the common source region CSR and the bit line contact region DCR may be defined by the bottom and side surfaces of the trench 13 provided with the insulating liner 31 and a bottom surface of the remaining sacrificial pattern 45b. In some embodiments, the bottom surface of the remaining sacrificial pattern 45b may be located at a lower level than the top surface of the semiconductor substrate 10. In other words, on the common source region CSR and the bit line contact region DCR, the highest position of the expanded air gap 17 may be located below the top surface of the semiconductor substrate 10. The highest position of the expanded air gap 17 on the common source region CSR and the bit line contact region DCR may be located below that on the memory cell region MCR. That is, the vertical height H1 of the expanded air gap 17 on the memory cell region MCR may be greater than the vertical height H2 of the expanded air gap 17 on the common source region CSR and the bit line contact region DCR.

For example, the expanded air gap 17 may expose the second dielectric 53 of the blocking insulating layer GI in the memory cell region MCR, as shown in FIG. 16, and thus, the first dielectric 51 may be partially removed between the floating gate electrodes 25 to expose the bottom surface of the second dielectric 53. In addition, the rounded residue pattern 45a may remain on the lower sidewall of the floating gate electrode 25. As shown in FIG. 17, some embodiments provide that the expanded air gap 17 may expose the first dielectric 51 of the blocking insulating layer GI in the memory cell region MCR, and a portion of the first dielectric 51 exposed by the expanded air gap 17 may have a reduced thickness.

As shown in FIG. 15, some embodiments provide that the expanded air gap 17 may be provided below the remaining sacrificial pattern 45b in the common source region CSR and the bit line contact region DCR. In this case, the remaining sacrificial pattern 45b may have a bottom surface that is located below the top surface of the semiconductor substrate 10 and have an upward convex profile. In addition, the remaining sacrificial pattern 45b may have a top surface that is located over the top surface of the semiconductor substrate 10.

Since the bottom surface of the blocking insulating layer GI between the floating gate electrodes 25 is located below the top surface of the floating gate electrode 25, an overlapping area between the floating gate electrode 25 and the control gate electrode 63 can be increased. This makes it possible to improve a coupling ratio between the control gate electrode 63 and the floating gate electrode 25. In addition, since the expanded air gap 17 is filled with air, whose dielectric constant is lower than silicon oxide, it is possible to reduce a coupling capacitance between the first active regions ACT1 that are disposed adjacent to each other in the memory cell region MCR. Accordingly, it is possible to decrease an electric interference between adjacent cells of the NAND FLASH memory device.

FIGS. 20 through 28 are sectional views taken along lines I-I', II-II', III-III', and IV-IV' of FIG. 4 and provided to describe methods of fabricating a semiconductor memory device according to some embodiments of the inventive concept.

Figure 20:
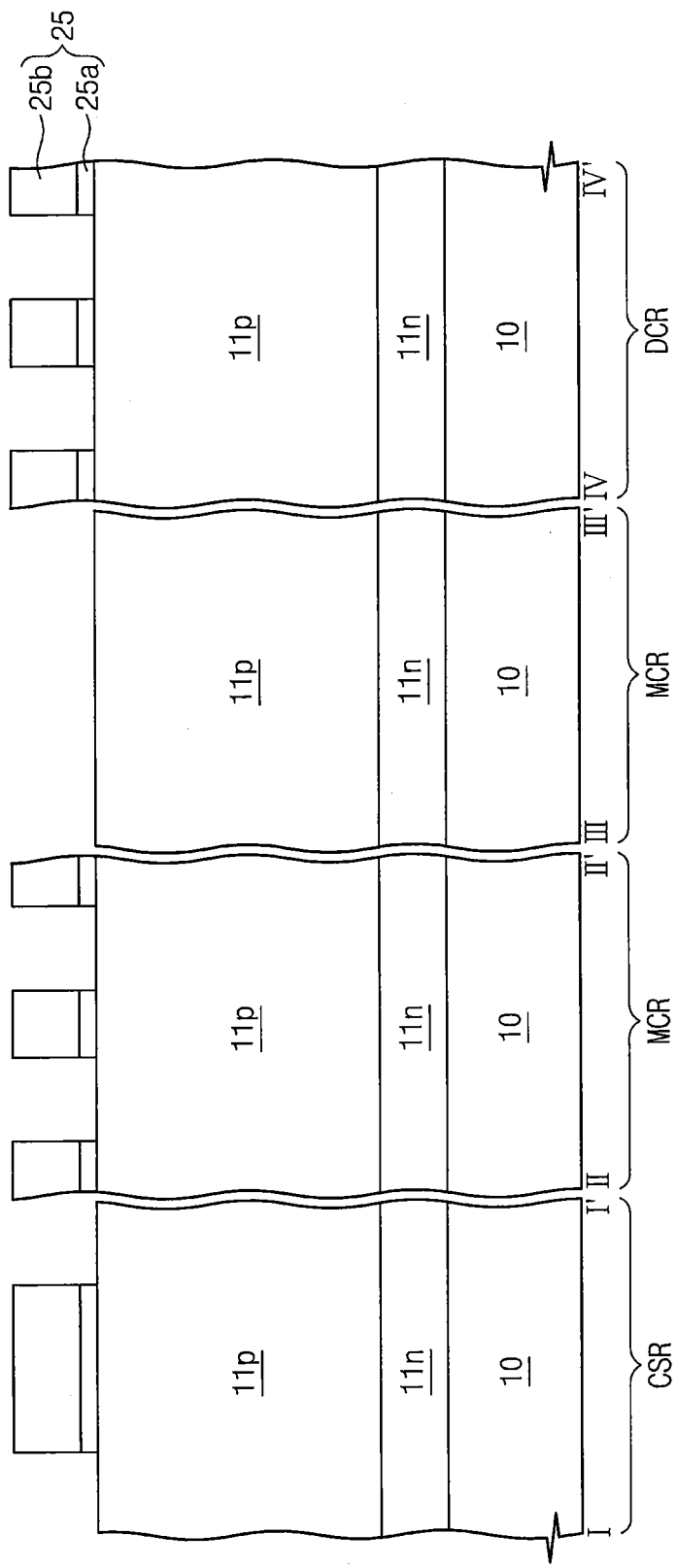
FIGS. 20 through 28 are sectional views taken along lines I-I', II-II', III-III', and IV-IV' of FIG. 4 and provided to describe a method of fabricating a semiconductor memory device according to some other embodiments of the inventive concept.

Referring to FIG. 20, the mask pattern 25 may be formed on the semiconductor substrate 10 to define active regions. According to some embodiments, the mask pattern 25 may include a silicon oxide layer pattern 25a and a silicon nitride layer pattern 25b stacked on the semiconductor substrate 10. In some embodiments, a photoresist layer may be used for the mask pattern 25.

The semiconductor substrate 10 may include one selected from the group consisting of a single crystalline silicon layer, a silicon-on-insulator (SOI) structure, a silicon layer on a silicon germanium (SiGe) layer, a single crystalline silicon layer on an insulating layer, and/or a polysilicon layer on an insulating layer.

As described with reference to FIG. 5, the cell array region of the semiconductor substrate 10 may include the common source region CSR, the bit line contact region DCR, and the memory cell region MCR therebetween. In addition, the semiconductor substrate 10 may have the first conductivity type, and the cell array region of the semiconductor substrate 10 may include the well doped region 11n of the second conductivity type and the pocket-well doped region 11p that is provided in the well doped region 11n to have the first conductivity type.

As described with reference to FIG. 5, the mask pattern 25 may include the first mask patterns extending from the memory cell region MCR and the bit line contact region DCR to be parallel to the first direction and the second mask pattern provided on the common source region CSR to be perpendicular to the first mask patterns.

Figure 21:
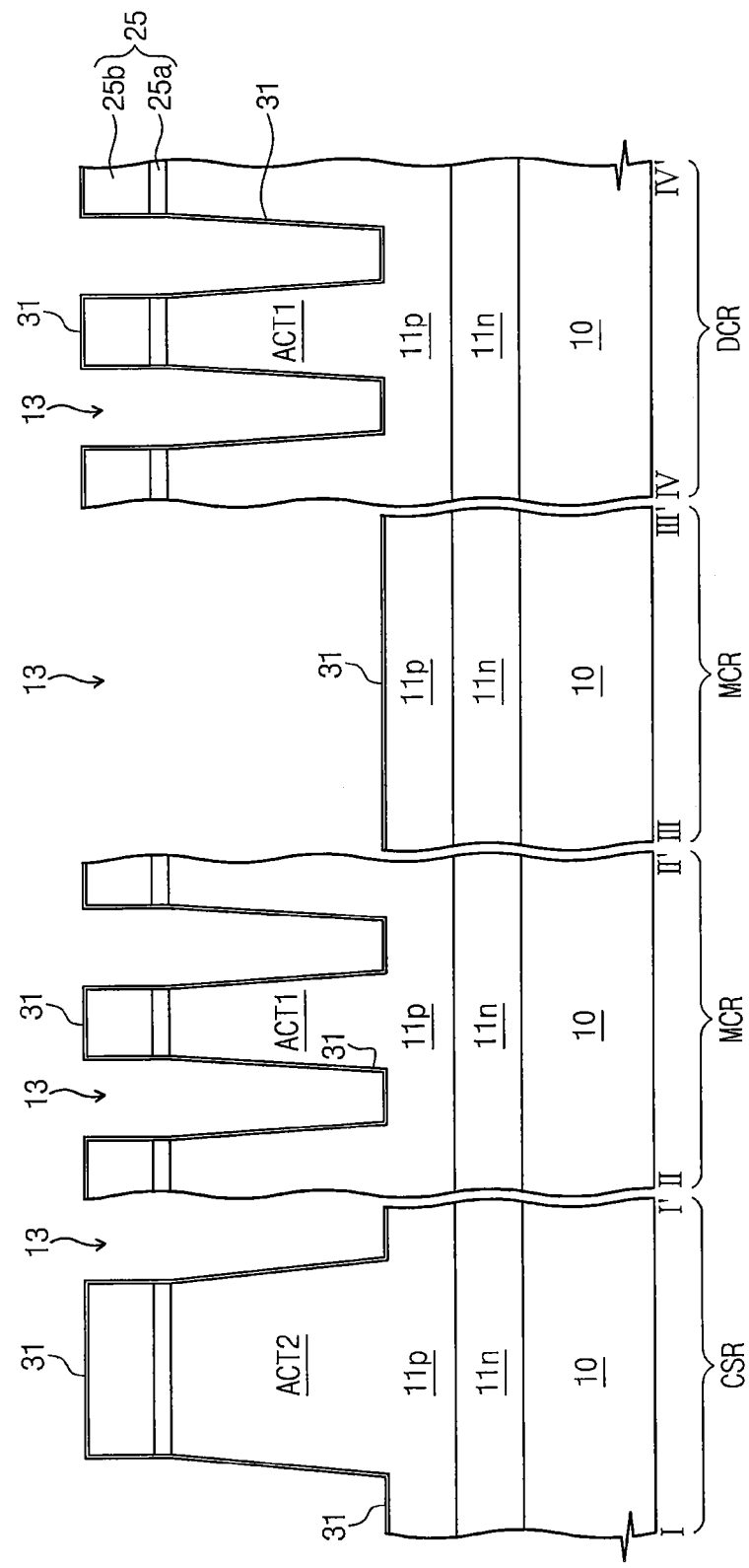

Referring to FIG. 21, the trenches 13 may be formed on the semiconductor substrate 10 using the mask patterns 25 as an etch mask to define the active regions.

As described with reference to FIG. 6, the trenches 13 may be formed to define the first active regions ACT1 on the memory cell region MCR and the bit line contact region DCR and the second active region ACT2 on the common source region CSR. The second active region ACT2 may be connected to the first active regions ACT1.

After the formation of the trenches 13, the insulating liner 31 may be formed on inner surfaces of the trenches 13. The formation of the insulating liner 31 may include sequentially forming an oxide liner and a nitride liner. The oxide liner may be formed to cure an etching damage, which may occur during the formation of the trench 13. The oxide liner may be locally formed on an exposed surface of the semiconductor substrate 10. For example, the oxide liner may not be formed on sidewalls of the mask patterns 25.

Figure 22:
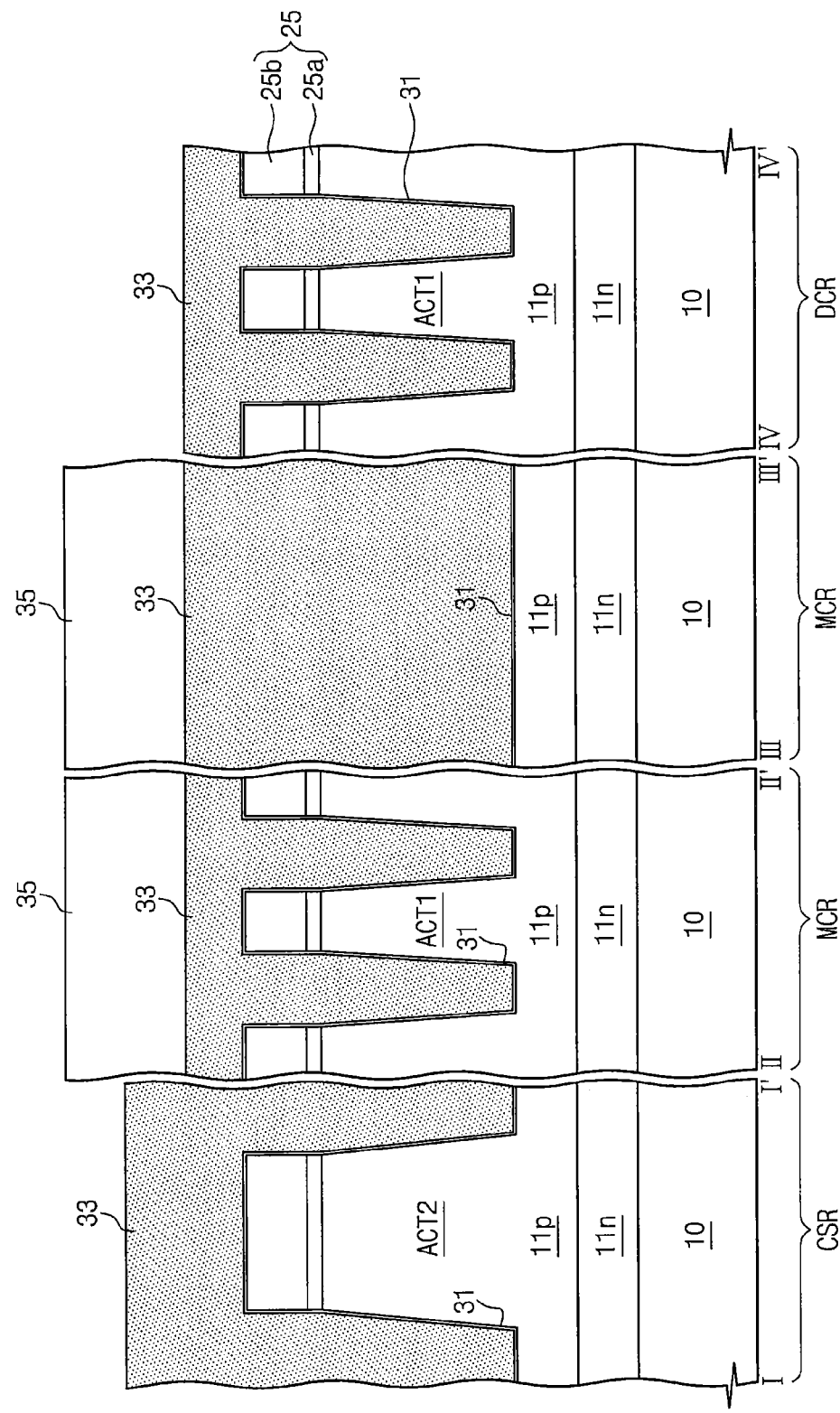

Referring to FIG. 22, the first sacrificial layer 33 may be formed on the insulating liner 31 to fill the trenches 13.

The first sacrificial layer 33 may be formed of a material having an etch selectivity with respect to the mask pattern 25. In some embodiments, the first sacrificial layer 33 may be formed using a spin-on-coating process to fill the trenches 13 and cover the mask patterns 25. As described with reference to FIG. 7, the first sacrificial layer 33 may be formed of a spin-on-hardmask (SOH) layer and/or an amorphous carbon layer (ACL).

Thereafter, as described with reference to FIG. 7, the sacrificial mask pattern 35 may be formed on the first sacrificial layer 33. The sacrificial mask pattern 35 may cover the first sacrificial layer 33 on the memory cell region MCR and expose the top surface of the first sacrificial layer 33 on the common source region CSR and the bit line contact region DCR. The sacrificial mask pattern 35 and the first sacrificial layer 33 may be etched using the same etching gas, and in this case, the sacrificial mask pattern 35 may be formed of a material having an etch selectivity ranging from 1:1 to 1:2 with respect to the first sacrificial layer 33.

Figure 23:
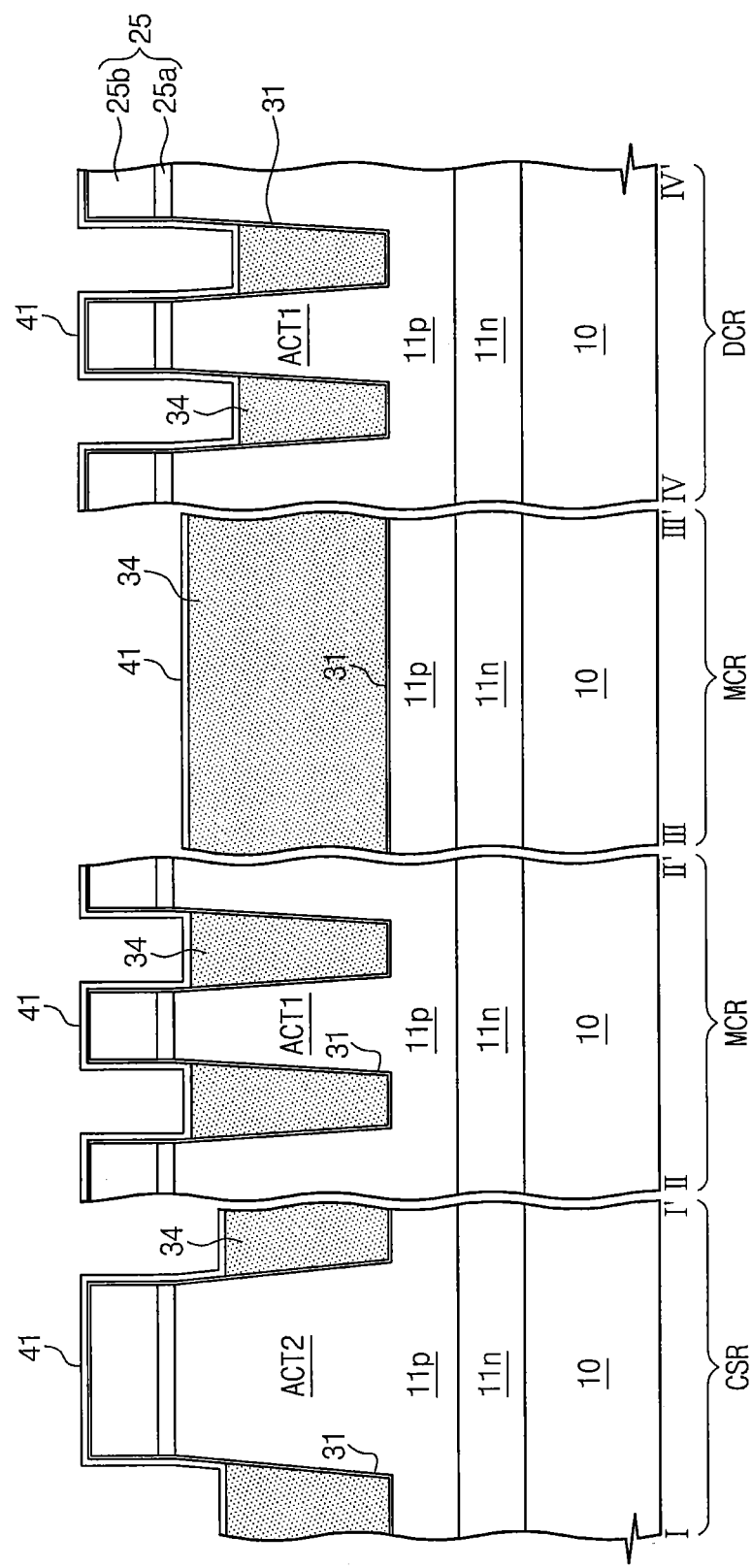

Referring to FIG. 23, the first sacrificial layer 33 and the sacrificial mask pattern 35 may be anisotropically etched to form first sacrificial patterns 34 locally in the trenches 13. According to some embodiments, the top surface of the first sacrificial pattern 34 on the memory cell region MCR may be positioned below that of the semiconductor substrate 10. Since an etching amount in the memory cell region MCR is larger than those in the source region and the bit line contact region DCR, the top surface of the first sacrificial pattern 34 on the common source region CSR and the bit line contact region DCR may be positioned below that of the first sacrificial pattern 34 on the memory cell region MCR.

Thereafter, as described with reference to FIG. 8, the porous insulating layer 41 may be formed on the first sacrificial pattern 34. The porous insulating layer 41 may be formed to conformally cover the top surface of the first sacrificial pattern 34 and the mask pattern 25. The porous insulating layer 41 may be an insulating layer with a plurality of pores. The formation of the porous insulating layer 41 may include forming a carbon-containing silicon oxide layer and then performing a thermal treatment thereto. In some embodiments, the porous insulating layer 41 may be a p-SiCOH layer. The porous insulating layer 41 may have a porosity of 5-50 vol %. The porous insulating layer 41 may be formed in such a way that pores therein have a size or a diameter that ranges from several ten nanometers to several hundred nanometers.

Figure 24:
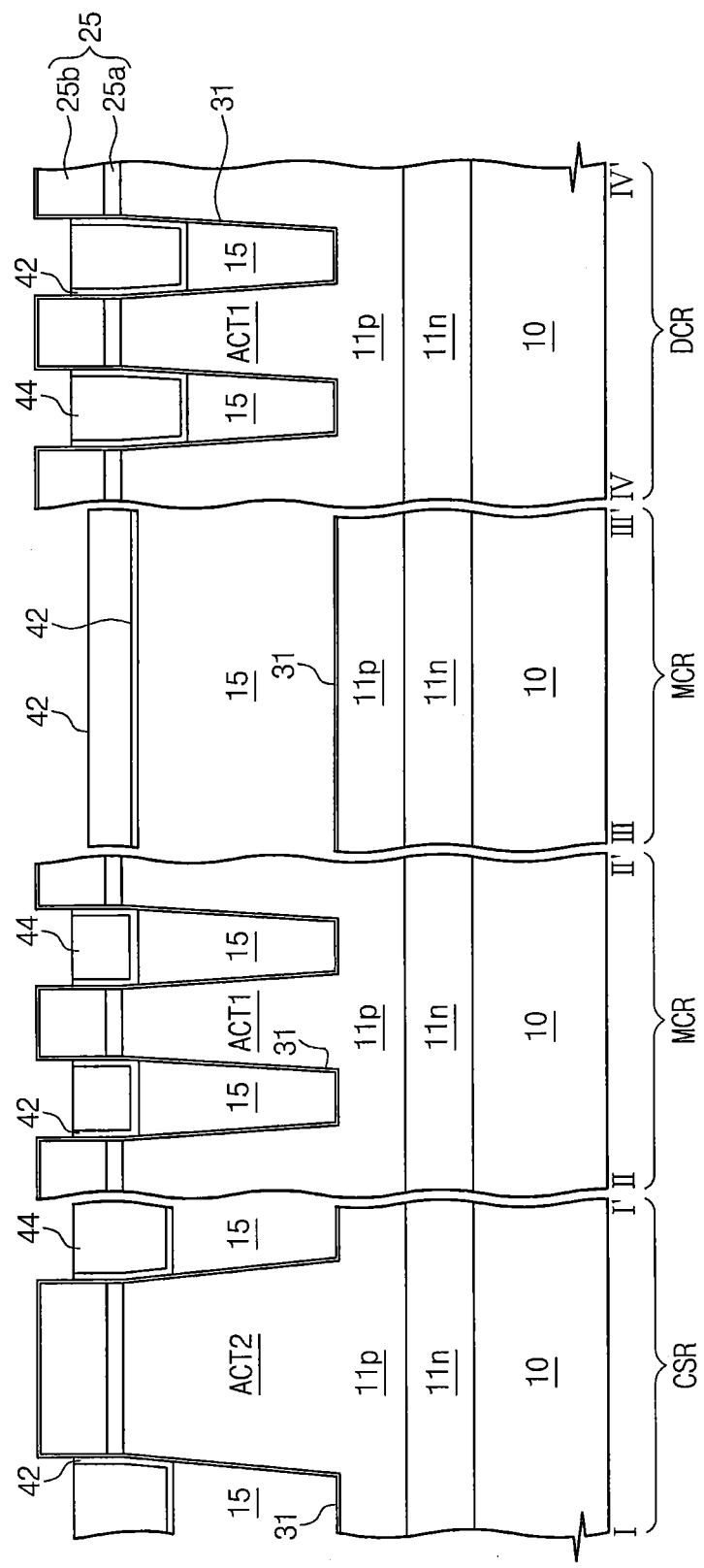

Referring to FIG. 24, as described with reference to FIG. 9, the sacrificial layer may be removed through the porous insulating layer 41 to form the air gap 15 in the trenches 13. The air gap 15 may be defined by the bottom and side surfaces of the trench 13 and the bottom surface of the porous insulating layer 41. Further, the insulating liner provided on the inner surface of the trench 13 may be exposed by the air gap 15.

Since the bottom surface of the porous insulating layer 41 may be positioned at a lower level on the common source region CSR and the bit line contact region DCR than on the memory cell region MCR, a vertical height of the air gap 15 may be smaller on the common source region CSR and the bit line contact region DCR than on the memory cell region MCR.

After the formation of the air gap 15, as described with reference to FIG. 10, the second sacrificial layer 43 may be formed on the porous insulating layer 41 to fill gap regions between the mask patterns 25. The second sacrificial layer 43 may be formed of a silicon oxide layer with a good gap-fill property.

Next, as described with reference to FIG. 11, the porous insulating layer 41 and the second sacrificial layer 43 may be recessed. Accordingly, the porous insulating pattern 42 and the second sacrificial pattern 44 may be formed between the active regions to be spaced apart from the bottom surface of the trench 13. The porous insulating pattern 42 and the second sacrificial pattern 44 may have the top surfaces that are positioned below the top surface of the mask pattern 25 and over the top surface of the semiconductor substrate 10.

After the formation of the porous insulating pattern 42 and the second sacrificial pattern 44, the mask pattern 25 may be removed to expose the active regions. A portion of the insulating liner 31 adjacent the mask patterns 25 may be removed during the removal of the mask pattern 25.

Figure 25:
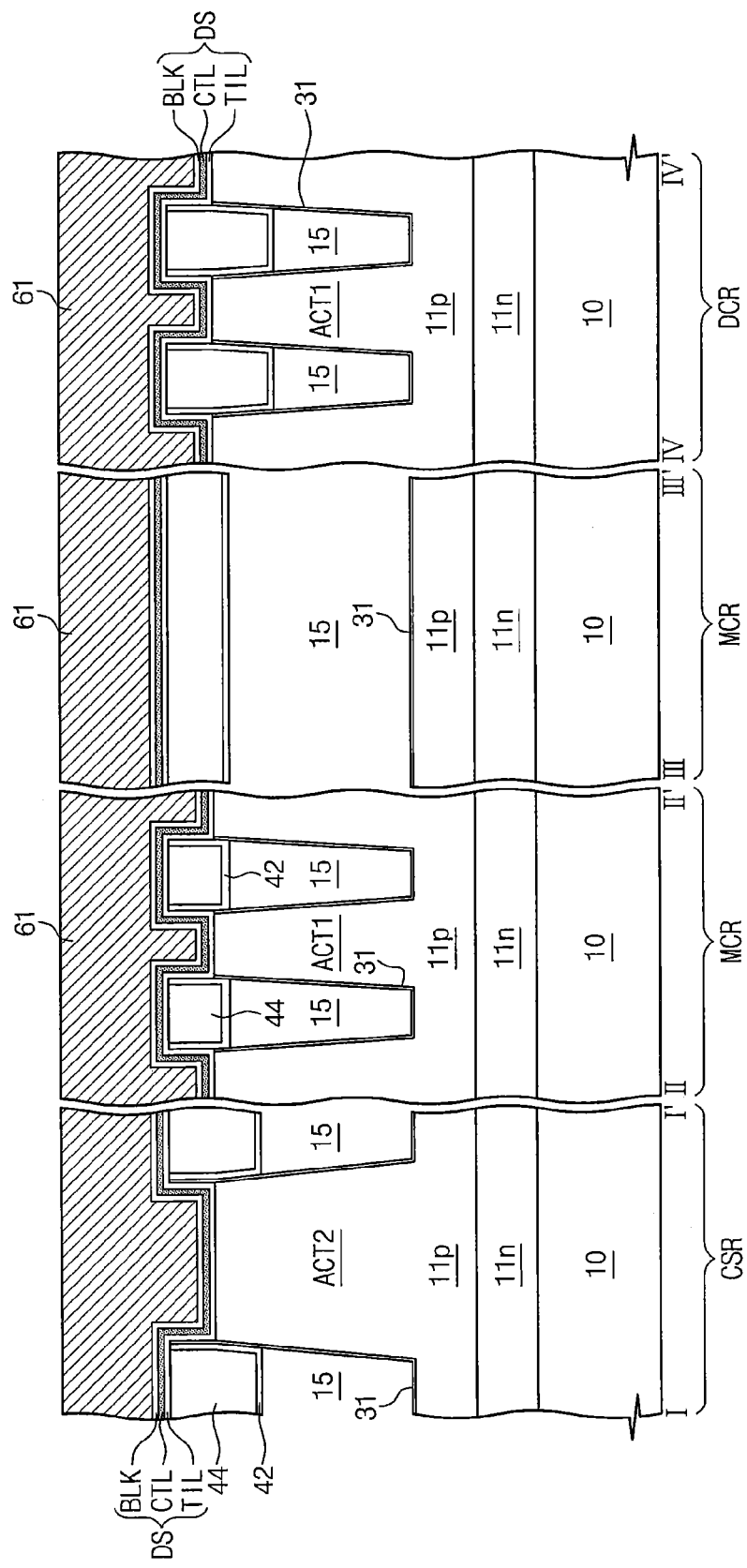

Referring to FIG. 25, a data storing layer DS and the gate conductive layer 61 may be sequentially stacked on the exposed semiconductor substrate 10.

The data storing layer DS may be conformally deposited on the semiconductor substrate 10 provided with the porous insulating pattern 42 and the second sacrificial pattern 44. In some embodiments, the data storing layer DS may include a tunnel insulating layer TIL, a charge trap insulating layer CTL, and a blocking insulating layer BLK, which may be sequentially stacked.

In the case where the data storing layer DS includes the charge trap insulating layer CTL, data stored in the data storing layer DS may be changed through Fowler-Nordheim (FN) tunneling phenomenon, which may occur by a voltage difference between the pocket-well doped region 11p and the word lines WL.

The tunnel insulating layer TIL may be formed of a material, whose dielectric constant is lower than that of the blocking insulating layer BLK. For example, the tunnel insulating layer TIL may include at least one of oxides, nitrides or oxynitrides. The charge trap insulating layer CTL may be formed of an insulating layer with many trap sites (e.g., silicon nitride) or an insulating layer with conductive grains. In some embodiments, the tunnel insulating layer TIL may be a silicon oxide layer, the trap insulating layer CTL may be a silicon nitride layer, and the blocking insulating layer BLK may be an insulating layer including an aluminum oxide layer. The blocking insulating layer BLK may include at least one of a silicon oxide layer, a silicon nitride layer, a silicon oxynitride layer, or high-k dielectrics, and it may have a multilayered structure. Here, the high-k dielectrics may be insulating materials, whose dielectric constants are higher than that of silicon oxide, and they may include tantalum oxide, titanium oxide, hafnium oxide, zirconium oxide, aluminum oxide, yttrium oxide, niobium oxide, cesium oxide, indium oxide, iridium oxide, barium strontium titanate, and/or lead zirconate titanate.

The gate conductive layer 61 may be formed by depositing a conductive material on the data storing layer DS and have a planarized top surface. The gate conductive layer 61 may include at least one of metals (e.g., tungsten, aluminum, titanium, and/or tantalum), conductive metal nitrides (e.g., titanium nitride and/or tantalum nitride), doped semiconductors (e.g., doped silicon, doped germanium, and/or doped silicon germanium), and/or metal silicides.

Figure 26:
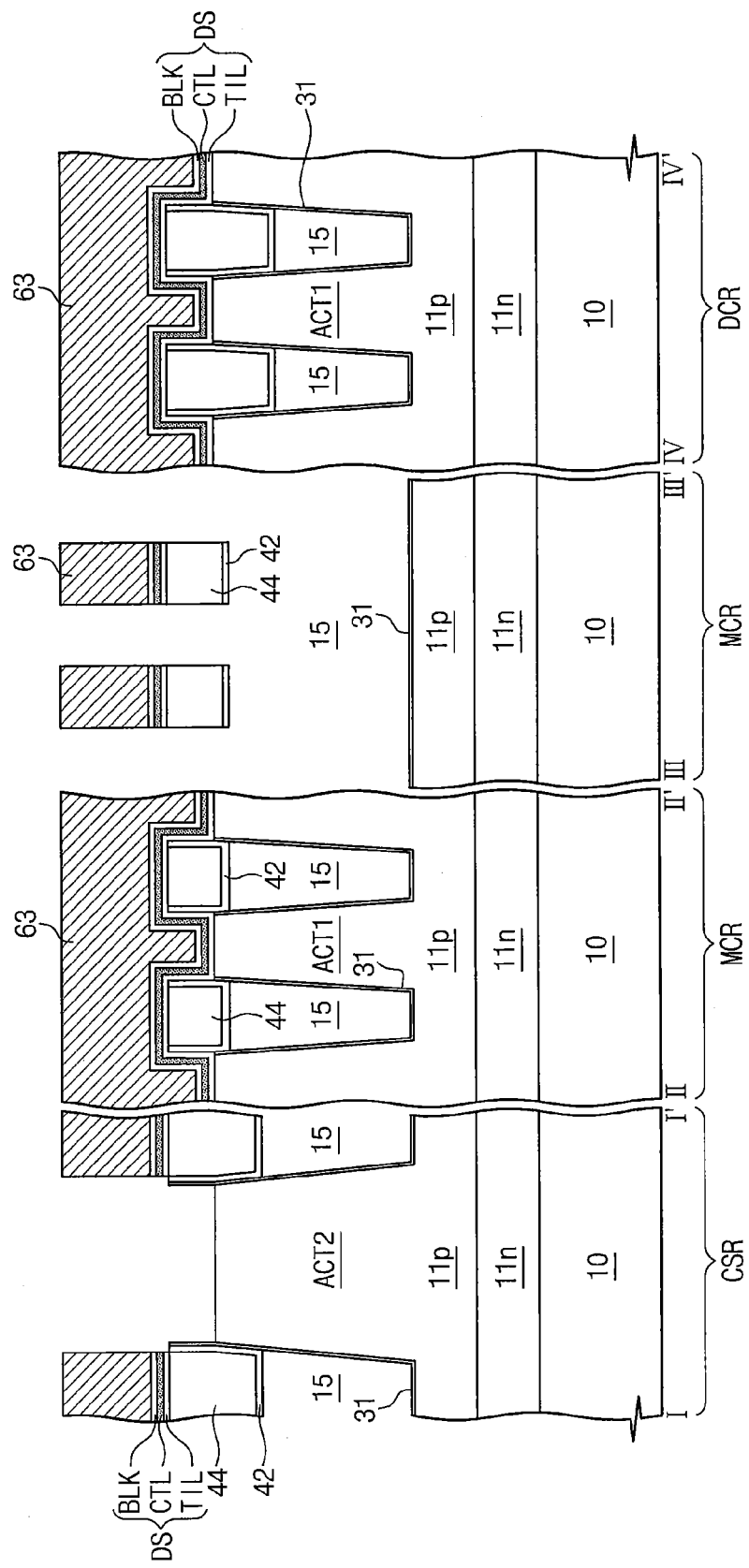

Referring to FIG. 26, the gate electrodes 63 may be formed on the memory cell region MCR to cross the active regions.

For example, the formation of the gate electrodes may include forming a mask pattern (not shown) on the gate conductive layer 61 to cross the active regions and sequentially and anisotropically etching the data storing layer DS and the gate conductive layer 61 using the mask pattern as an etch mask.

As the result of the formation of the gate electrodes 63, the air gap 15 may be exposed between the gate electrodes 63. Here, since the second sacrificial pattern 44 is thicker on the common source region CSR and the bit line contact region DCR than on the memory cell region MCR, it is possible to prevent the air gap 15 from being exposed on the common source region CSR and the bit line contact region DCR, during the formation of the gate electrodes 63. Further, as the result of the formation of the gate electrodes 63 on the memory cell region MCR, the active regions may be exposed on the common source region CSR and the bit line contact region DCR.

Figure 27:
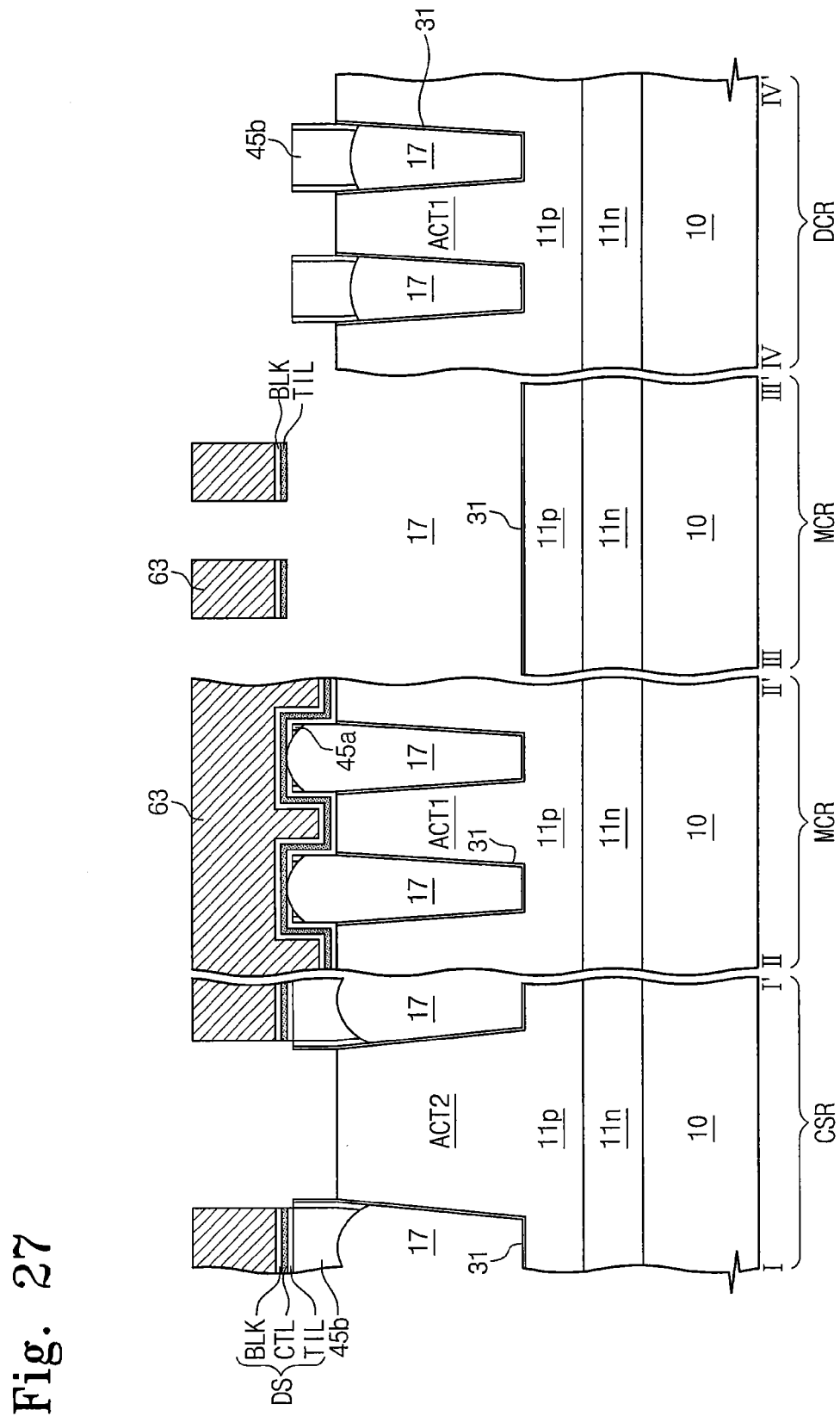

Referring to FIG. 27, the porous insulating layer 41 and the second sacrificial pattern 44 may be removed to expand the air gap 15. For example, as described with reference to FIG. 14, an etching solution may be supplied through the air gap 15 between the gate electrodes of the memory cell region MCR, and thus, the porous insulating pattern 42 and the second sacrificial pattern 44 may be etched in a wet etching manner.

The wet etching process may be performed to expose a bottom surface of the data storing layer DS on the memory cell region MCR. In some embodiments, the charge trap insulating layer CTL of the data storing layer DS may serve as an etch stop layer in the process of expanding the air gap 15. In the case where the porous insulating pattern 42 and the second sacrificial pattern 44 are etched or removed from the memory cell region MCR, the air gap 15 of the memory cell region MCR can have an increased vertical height. In the case where the porous insulating pattern 42 and the second sacrificial pattern 44 are etched using a wet etching process, the rounded residue pattern 45a may remain near an upper corner of the air gap 15.

When the data storing layer DS is exposed on the memory cell region MCR, a portion 45b of the second sacrificial pattern may remain on the bit line contact region DCR and the common source region CSR. The remaining sacrificial pattern 45b may have a rounded bottom surface, which may be positioned below the top surface of the semiconductor substrate 10.

Figure 28:
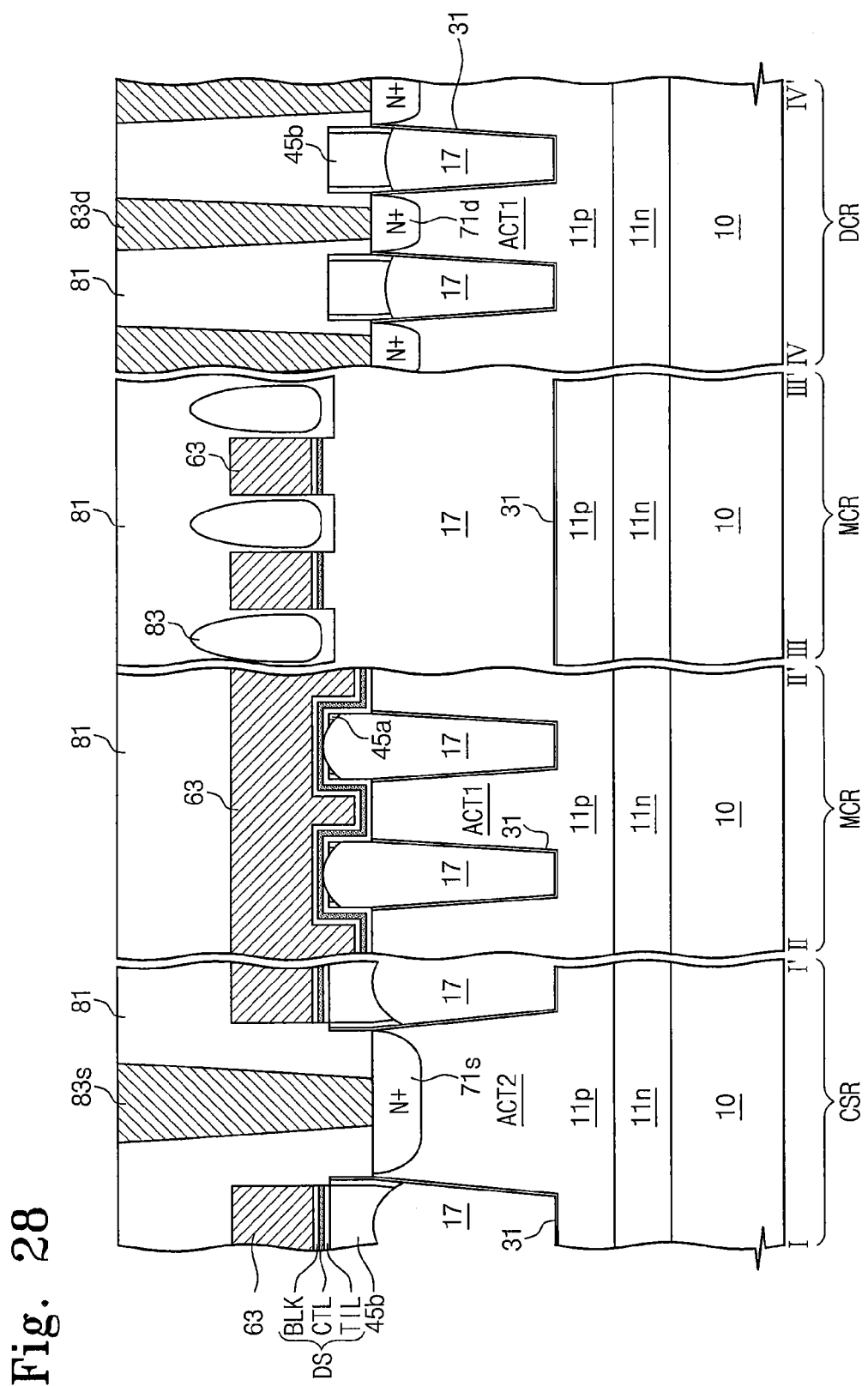

Referring to FIG. 28, as described with reference to FIG. 15, the common source impurity region 71s may be formed in the second active region ACT2 of the common source region CSR, and the drain impurity region 71d may be formed in the first active region ACT1 of the bit line contact region DCR.

Next, the interlayered insulating layer 81 may be formed on the resulting structure provided with the gate electrodes 63. The interlayered insulating layer 81 may be formed to have a poor step coverage property or using a deposition process with a poor step coverage property. Accordingly, the interlayered insulating layer 81 may be formed to define the air gap 15 between the gate electrodes 63.

Thereafter, the common source line (CSL) 83s may be formed through the interlayered insulating layer 81 to be electrically connected to the common source impurity region 71s, and the bit line contact plugs 83d may be formed through the interlayered insulating layer 81 to be electrically connected to the drain impurity region 71d. The bit line contact plugs 83d may be coupled to the drain impurity regions 71d, respectively, between the remaining portions of the second sacrificial patterns 44.

Figure 29:
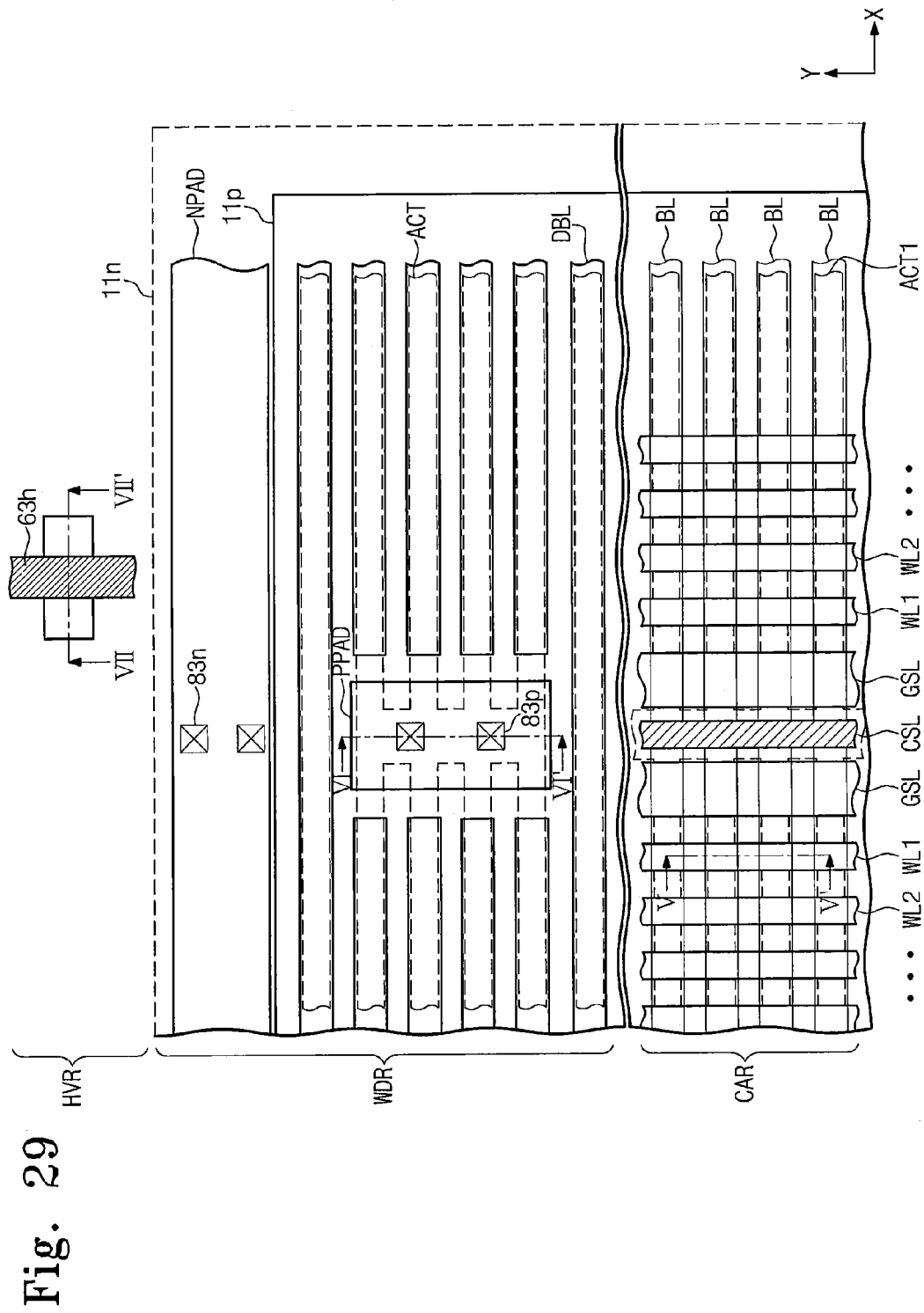
FIG. 29 is a plan view illustrating a cell array region and a peripheral region of a semiconductor memory device, according to some other embodiments of the inventive concept.

FIG. 29 is a plan view illustrating a cell array region and a peripheral region of a semiconductor memory device, according to some other embodiments of the inventive concept. FIGS. 30 through 41 are sectional views taken along lines I-I', II-II', III-III', and IV-IV' of FIG. 4 and provided to describe methods of fabricating a semiconductor memory device according to some embodiments of the inventive concept.

Figure 30:
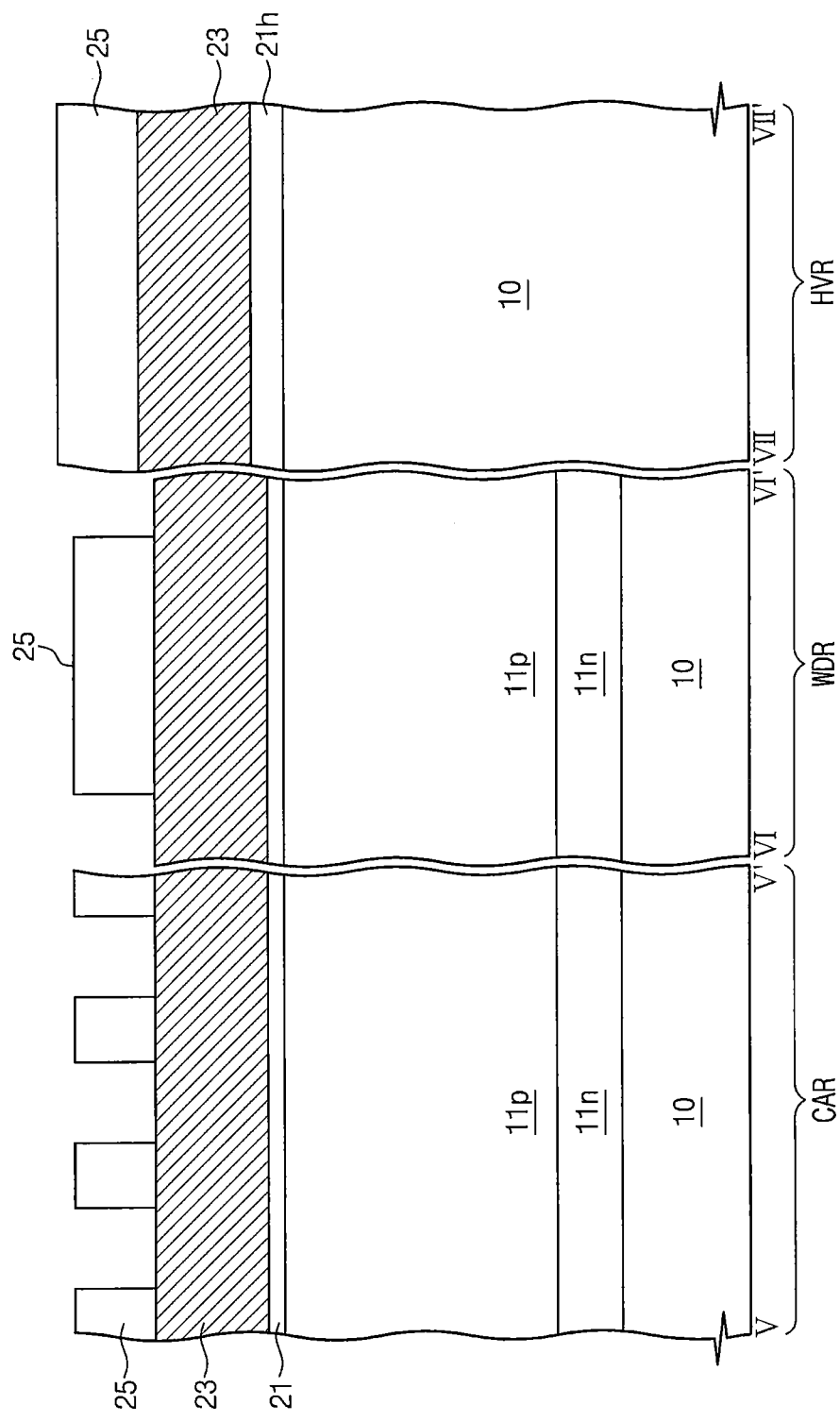
FIGS. 30 through 41 are sectional views taken along lines I-I', II-II', III-III', and IV-IV' of FIG. 4 and provided to describe a method of fabricating a semiconductor memory device according to some other embodiments of the inventive concept.

Referring to FIGS. 29 and 30, the semiconductor substrate 10 may include a cell array region CAR, a well drive region WDR, and a peripheral circuit region HVR. The well drive region WDR may be provided around the cell array region CAR, and the peripheral circuit region HVR may be provided around the well drive region WDR.

The semiconductor substrate 10 may be a silicon wafer, a silicon-germanium wafer, a germanium wafer, or a single-crystalline epitaxial layer grown from a single-crystalline silicon wafer. In some embodiments, the semiconductor substrate 10 may have a first conductivity type and include the well doped region 11n of a first conductivity type and the pocket-well doped region 11p of a second conductivity type in the well doped region 11n.

In detail, the well doped region 11n may be formed in the cell array region CAR and the well drive region WDR of the semiconductor substrate 10. The well doped region 11n may be formed by doping the semiconductor substrate 10 with impurities of the first conductivity type. The pocket-well doped region 11p may be formed by doping the well doped region 11n with impurities of the second conductivity type. The pocket-well doped region 11p may include a central portion and an edge portion provided around the central portion. In some embodiments, the central portion of the pocket well doped region 11n may be the cell array region CAR, and the edge portion may be the well drive region WDR.

In some embodiments, the memory cell arrays may be formed on the pocket-well doped region of the cell array region CAR, and the peripheral circuits (for example, PMOS and NMOS transistors) may be formed on the peripheral circuit region HVR of the semiconductor substrate 10. Further, as described with reference to FIGS. 4 and 5, the cell array region CAR may include the common source region CSR, the bit line contact region DCR, and the memory cell region MCR therebetween.

Referring to FIGS. 29 and 30, the tunnel insulating layer 21 may be formed on the cell array region CAR and the well drive region WDR, and a gate insulating layer 21h may be formed on the peripheral circuit region HVR. In some embodiments, the peripheral circuit region HVR may be a high-voltage transistor region, and thus, the gate insulating layer 21h may be formed to be thicker than the tunnel insulating layer 21.

In some embodiments, the formation of the gate insulating layer 21h may include forming the tunnel insulating layer 21 on the semiconductor substrate 10, forming a mask pattern (not shown) to cover the cell array region CAR, and then, forming the gate insulating layer 21h on the peripheral circuit region HVR. The gate insulating layer 21h may be thicker than the tunnel insulating layer 21. Further, the tunnel insulating layer 21 and the gate insulating layer 21h may be formed to have different thicknesses from each other by other methods.

Next, the floating gate conductive layer 23 may be formed on the tunnel insulating layer 21 and the gate insulating layer 21h. The floating gate conductive layer 23 may be formed by depositing a polysilicon or metal layer. During the deposition of the polysilicon layer, the polysilicon layer may be doped with dopants, such as phosphorus and/or boron.

A mask pattern may be formed on the floating gate conductive layer 23 to define active regions. As described with reference to FIG. 5, the mask pattern 25 may include the first mask patterns extending along the first direction on the cell array region CAR and the well drive region WDR and the second mask pattern extending along the second direction to be connected to the first mask patterns. According to some embodiments, the second mask pattern may be connected to some of the first mask patterns, on the well drive region WDR. Further, the mask pattern 25 may cover the floating gate conductive layer 23 on the peripheral circuit region.

Figure 31:
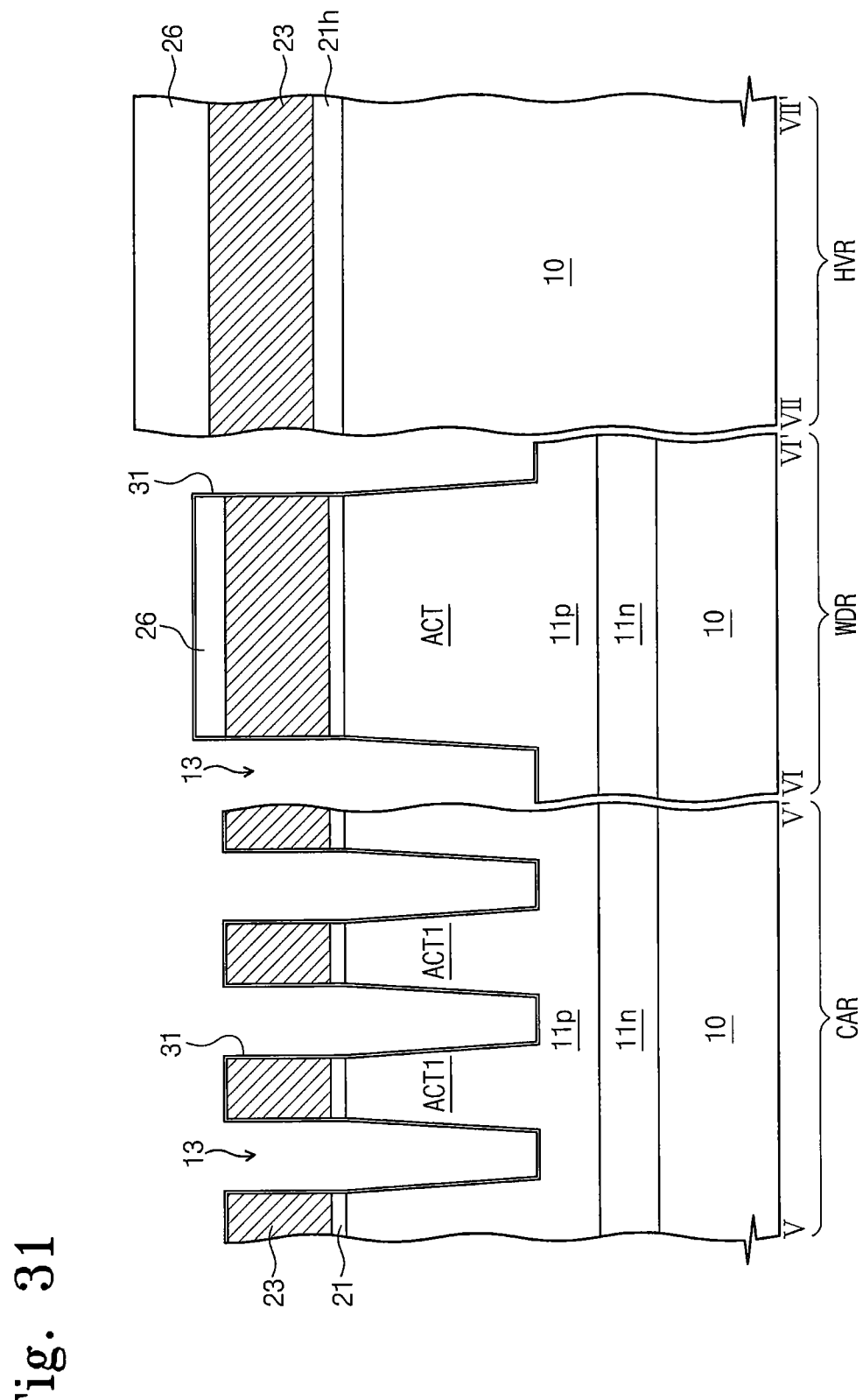

Referring to FIGS. 29 and 31, the trenches 13 may be formed in the cell array region CAR and the well drive region WDR to define the active regions ACT1 and ACT.

As described with reference to FIG. 6, each of the trenches 13 may be formed to have a line shape in plan view and a downward tapered profile in a vertical sectional view.

The trenches 13 may be formed by anisotropically etching the tunnel insulating layer 21, the floating gate conductive layer 23, and the semiconductor substrate 10 using the mask patterns 25 as an etch mask. As the result of the anisotropic etching process, the tunnel insulating pattern 22 and the floating gate pattern 24 may be formed on the first and second active regions ACT1 and ACT of the semiconductor substrate 10.

During the formation of the trenches 13, the mask patterns 25 may be removed from the cell array region CAR, and a portion 26 of the mask pattern may remain on the well drive region WDR. In addition, a remaining thickness of the mask pattern may be greater on the peripheral circuit region HVR than on the well drive region WDR. Accordingly, after the formation of the trenches 13, a height of structures provided on the semiconductor substrate 10 may vary from region to region. In some embodiments, after the formation of the trenches 13, the mask pattern on the floating gate pattern 24 may be removed using an additional process.

Next, as described with reference to FIG. 6, the insulating liner 31 may be formed to cover an inner wall of the trench 13 and a surface of the floating gate pattern 24.

Figure 32:
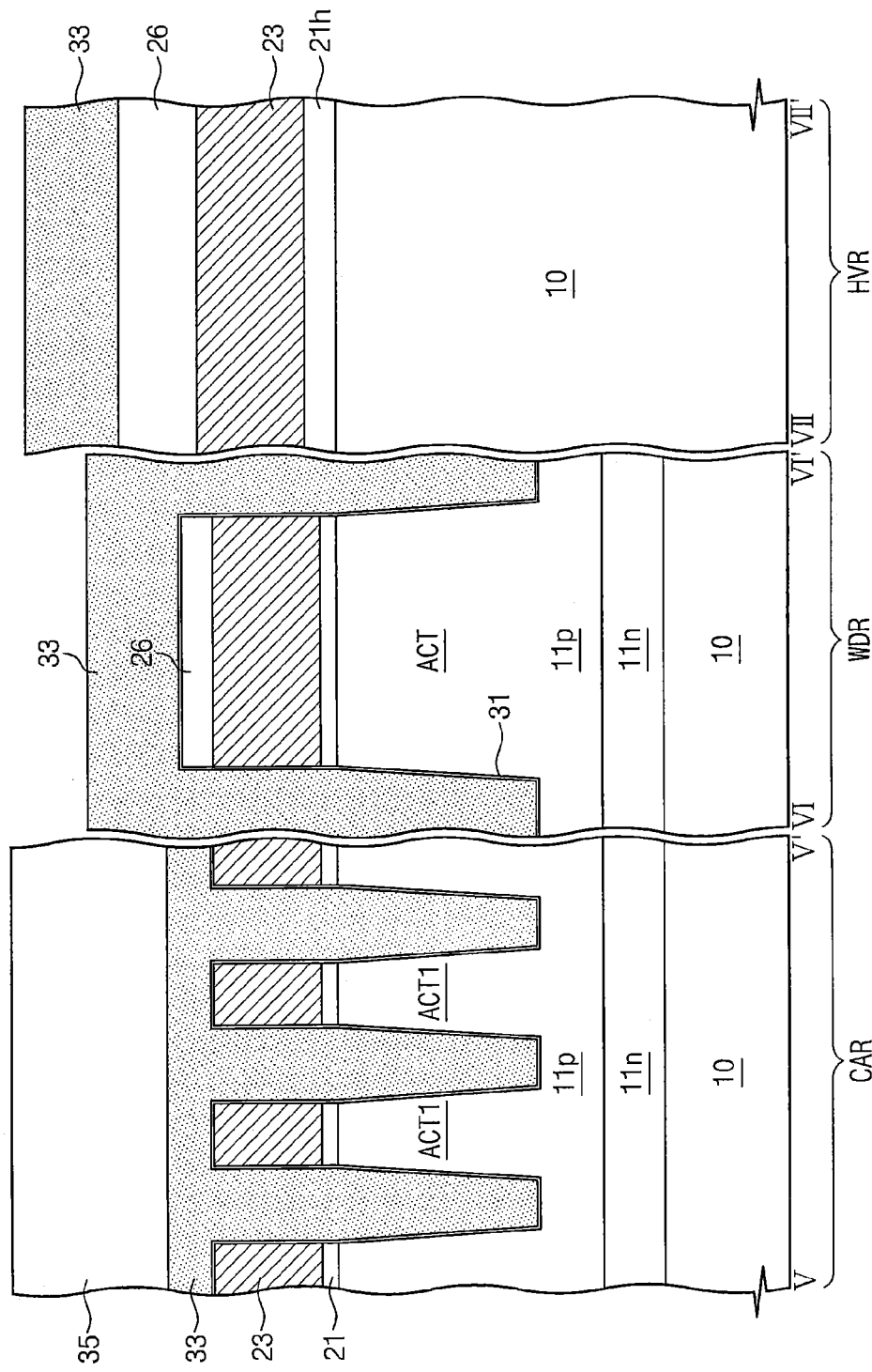

Referring to FIGS. 29 and 32, the first sacrificial layer 33 may be formed to fill the trenches 13. The first sacrificial layer 33 may be formed of a material having an etch selectivity with respect to the floating gate pattern 24. The first sacrificial layer 33 may be formed of a spin-on-hardmask (SOH) layer and/or an amorphous carbon layer (ACL), as described with reference to FIG. 7. The SOH layer may include a carbon-based SOH layer and/or a silicon-based SOH layer. In some embodiments, a sacrificial layer 36 may be formed of a photoresist layer and/or an amorphous silicon layer.

The first sacrificial layer 33 may be formed using a spin-on-coating process, and thus, it may have a slanted top surface, depending on height and integration density of structures provided on the semiconductor substrate 10. For example, the top surface of the first sacrificial layer 33 on the peripheral circuit region HVR may be located at a level lower than that on the cell array region CAR. For example, a thickness of the first sacrificial layer 33 may be different between on the cell array region CAR provided with the line-shaped floating gate patterns 24 and on the peripheral circuit region HVR provided with the wide floating gate pattern 24. The thickness difference may result in non-uniformity in subsequent processes to be performed on the first sacrificial layer 33. The sacrificial mask pattern 35 may be formed on the first sacrificial layer 33. The sacrificial mask pattern 35 may cover the first sacrificial layer 33 of the cell array region CAR and expose a portion of the well drive region WDR and the peripheral circuit region. In some embodiments, the sacrificial mask pattern 35 on the well drive region WDR may cover the line-shaped active regions ACT and locally expose a portion (e.g., PPAD of FIG. 29), to which the line-shaped active regions ACT are connected. Furthermore, the top surface of the sacrificial mask pattern 35 may be located at a level higher than the top surface of the first sacrificial layer 33 on the peripheral circuit region HVR.

As described with reference to FIG. 7, the sacrificial mask pattern 35 may be formed of a material having an etch selectivity ranging from 1:1 to 1:2 with respect to the first sacrificial layer 33, when the same etching gas is used to etch the sacrificial mask pattern 35 and the first sacrificial layer 33. Accordingly, the sacrificial mask pattern 35 may be etched during the etching of the first sacrificial layer 33. In some embodiments, the sacrificial mask pattern 35 may be formed of, for example, a photoresist layer and/or an amorphous carbon layer.

Figure 33:
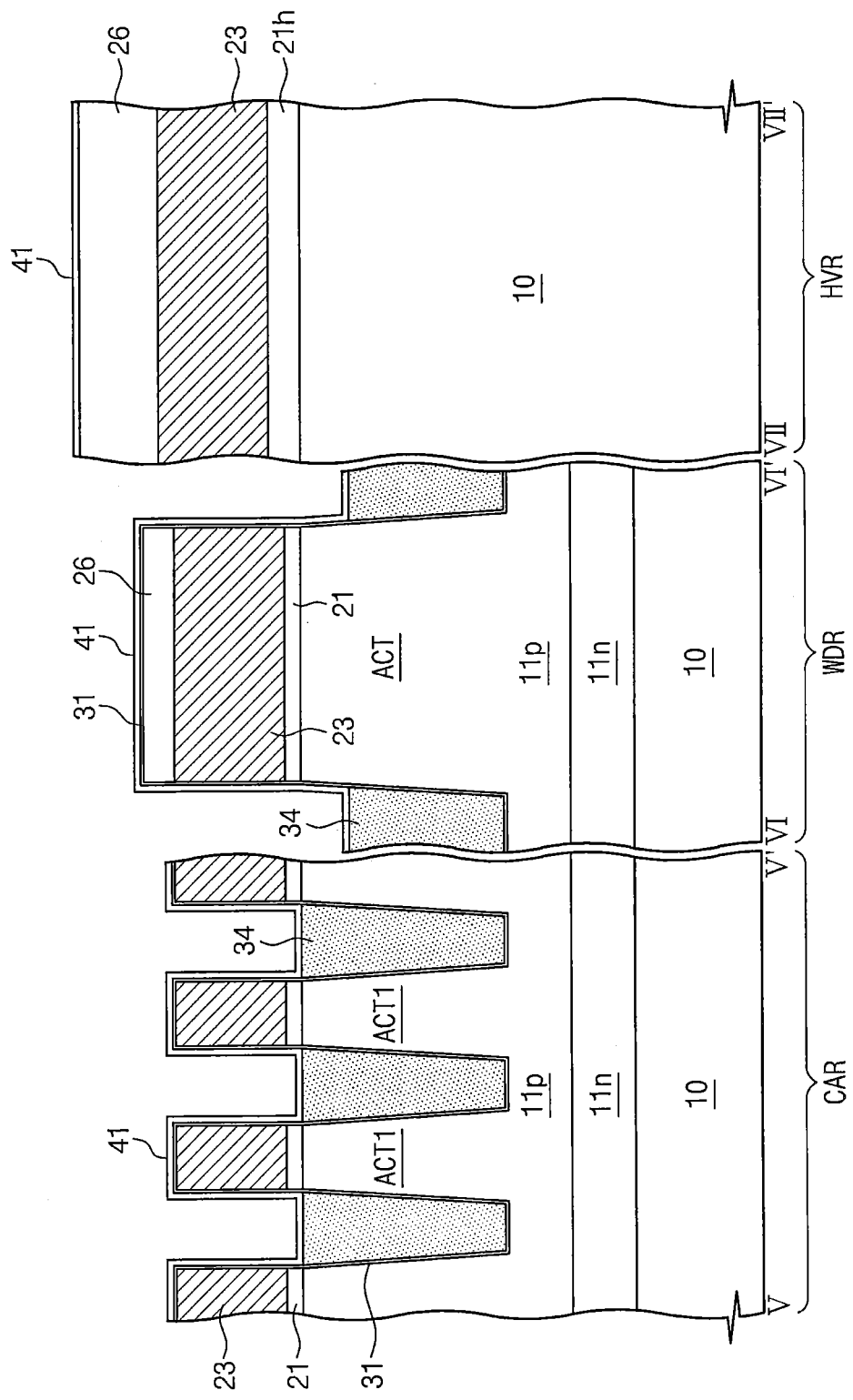

Referring to FIGS. 29 and 33, the first sacrificial layer 33 and the sacrificial mask pattern 35 may be anisotropically etched to form first sacrificial patterns 34 locally in the trenches 13.

As described with reference to FIG. 8, in the cell array region CAR, the first sacrificial layer 33 may be etched after removing the sacrificial mask pattern 35. Accordingly, an etching amount of the first sacrificial layer 33 may be greater in the well drive region WDR and the peripheral circuit region HVR, which are exposed by the sacrificial mask pattern 35, than in the cell array region CAR. For example, during the anisotropic etching process of the first sacrificial layer 33 and the sacrificial mask pattern 35, the sacrificial mask pattern 35 may be etched to an etch rate that is substantially equivalent to that of the sacrificial layer. As a result, the top surface of the first sacrificial pattern 34 on the well drive region WDR may be located below the top surface of the first sacrificial pattern 34 on the memory cell region MCR, and the first sacrificial layer 33 may be removed from the peripheral circuit region HVR. For example, the top surface of the first sacrificial pattern 34 on the cell array region CAR may be located between the top surfaces of the tunnel insulating pattern and the semiconductor substrate 10. Further, the top surface of the first sacrificial pattern 34 on the well drive region WDR may be located below that of the semiconductor substrate 10.

Next, as described with reference to FIG. 8, the porous insulating layer 41 may be formed on the first sacrificial pattern 34. The porous insulating layer 41 may be formed using a deposition process. In some embodiments, the porous insulating layer 41 may extend conformally from the top surface of the first sacrificial pattern 34 to the top surface of the floating gate pattern 24.

As described with reference to FIG. 8, the porous insulating layer 41 may be an insulating layer with a plurality of pores. The porous insulating layer 41 may be a porous low-k dielectric. The porous insulating layer 41 may be formed by, for example, forming a carbon-containing silicon oxide layer and performing a thermal treatment thereto. In some embodiments, the porous insulating layer 41 may be a p-SiCOH layer. The porous insulating layer 41 may have a porosity of 5-50 vol %. The porous insulating layer 41 may be formed in such a way that pores therein have a size and/or a diameter that ranges from several ten nanometers to several hundred nanometers.

Figure 34:
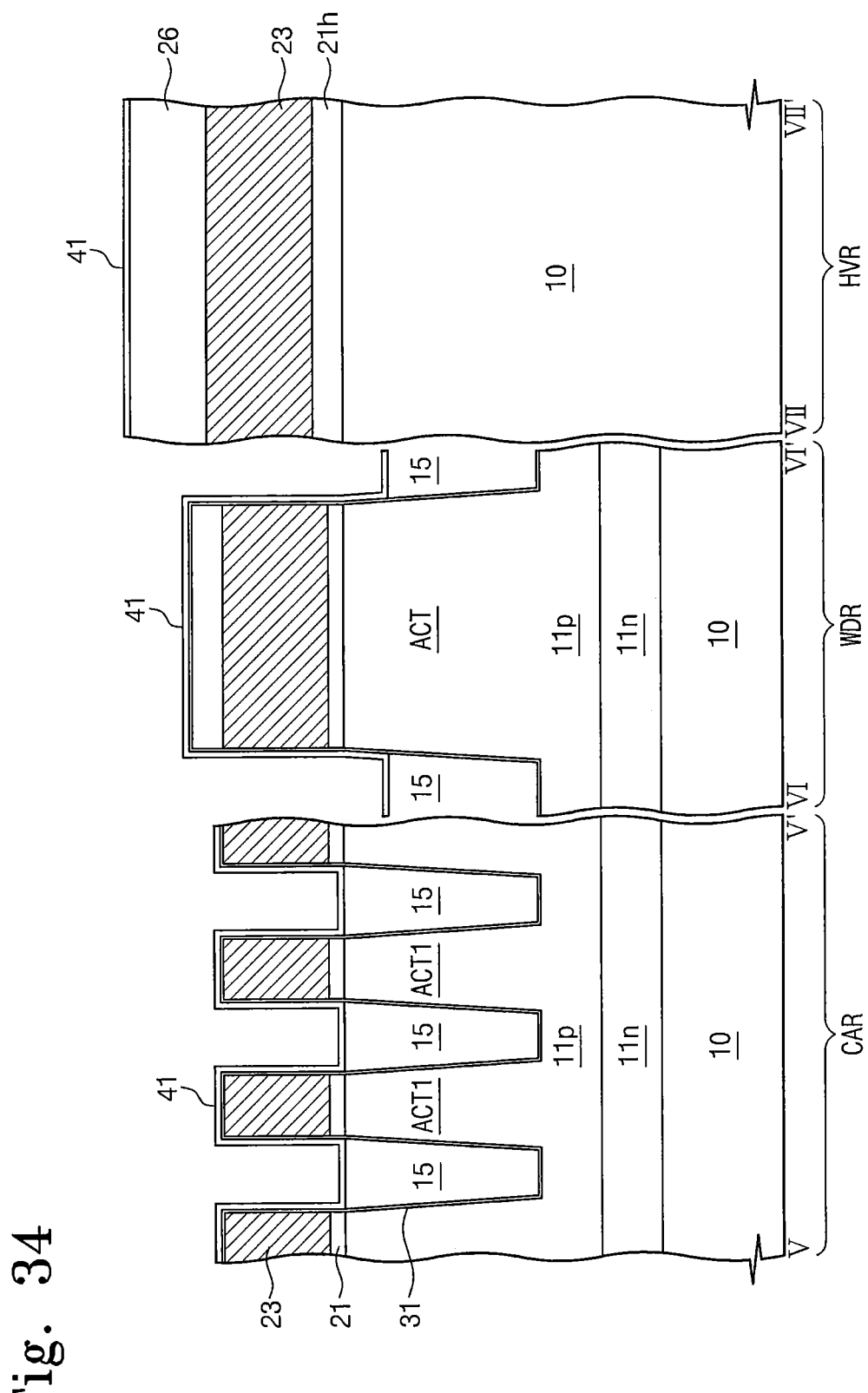

Referring to FIGS. 29 and 34, as described with reference to FIG. 9, the first sacrificial pattern 34 may be removed through the porous insulating layer 41 to form the air gap 15 in the trenches 13. The air gap 15 may be defined by the bottom and side surfaces of the trench 13 and the bottom surface of the porous insulating layer 41. Further, the insulating liner 31 provided on the inner surface of the trench 13 may be exposed by the air gap 15.

In some embodiments, since the bottom surface of the porous insulating layer 41 on the well drive region WDR is lower than that on the cell array region CAR, a vertical height of the air gap 15 on the well drive region WDR may be smaller than that on the cell array region CAR.

As described with reference to FIG. 10, after the formation of the air gap 15, the second sacrificial layer 43 may be formed on the porous insulating layer 41 to fill gap regions between the mask patterns. For example, the second sacrificial layer 43 may be formed of a silicon oxide layer with a good gap-fill property. The second sacrificial layer 43 may be formed of at least one of, for example, high density plasma (HDP) oxide, Tetra Ethyl Ortho Silicate (TEOS), Plasma Enhanced TEOS (PE-TEOS), O3-TEOS, Undoped Silicate Glass (USG), PhosphoSilicate Glass (PSG), Borosilicate Glass (BSG), BoroPhosphoSilicate Glass (BPSG), Fluoride Silicate Glass (FSG), Spin On Glass (SOG), Tonen SilaZene (TOSZ) and/or any combination thereof.

Figure 35:
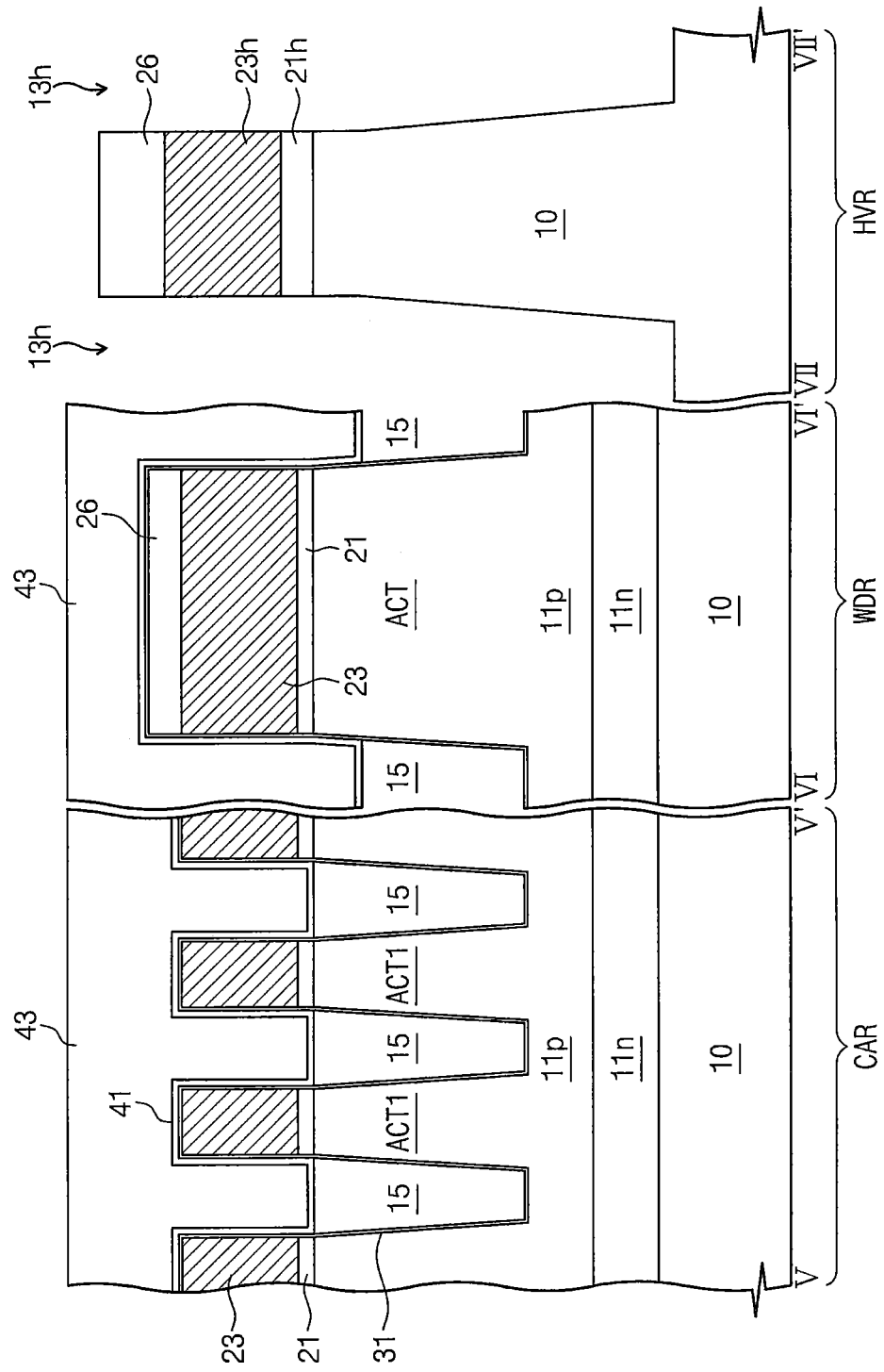

Referring to FIGS. 29 and 35, after forming the second sacrificial layer 43 on the porous insulating layer 41, peripheral trenches 13h may be formed on the peripheral circuit region HVR.

The formation of the peripheral trenches 13h may include forming a peripheral mask pattern (not shown) on the second sacrificial layer 43 to cover the cell array region CAR and the well drive region WDR and expose portions of the peripheral circuit region HVR, and then, anisotropically etching the semiconductor substrate 10 of the peripheral circuit region HVR using the peripheral mask pattern as an etch mask. On the peripheral circuit region HVR, the active regions may be defined and a peripheral conductive pattern 23h may be formed, as the result of the formation of the peripheral trenches 13h.

In some embodiments, the peripheral trenches 13h may be formed to be deeper than the trench 13 of the cell array region CAR. In other words, the bottom surface of the peripheral trench 13h may be positioned at a level lower than the bottom surface of the trench 13 of the cell array region CAR. Further, the bottom surface of the peripheral trench 13h may be positioned at a level lower than the well doped region 11n of the cell array region CAR.

According to the afore-described embodiments, the peripheral trench 13h may be formed after forming the trenches 13 in the cell array region CAR. However, according to other embodiments, the peripheral trench 13h may be formed before forming the trenches 13 in the cell array region CAR.

Figure 36:
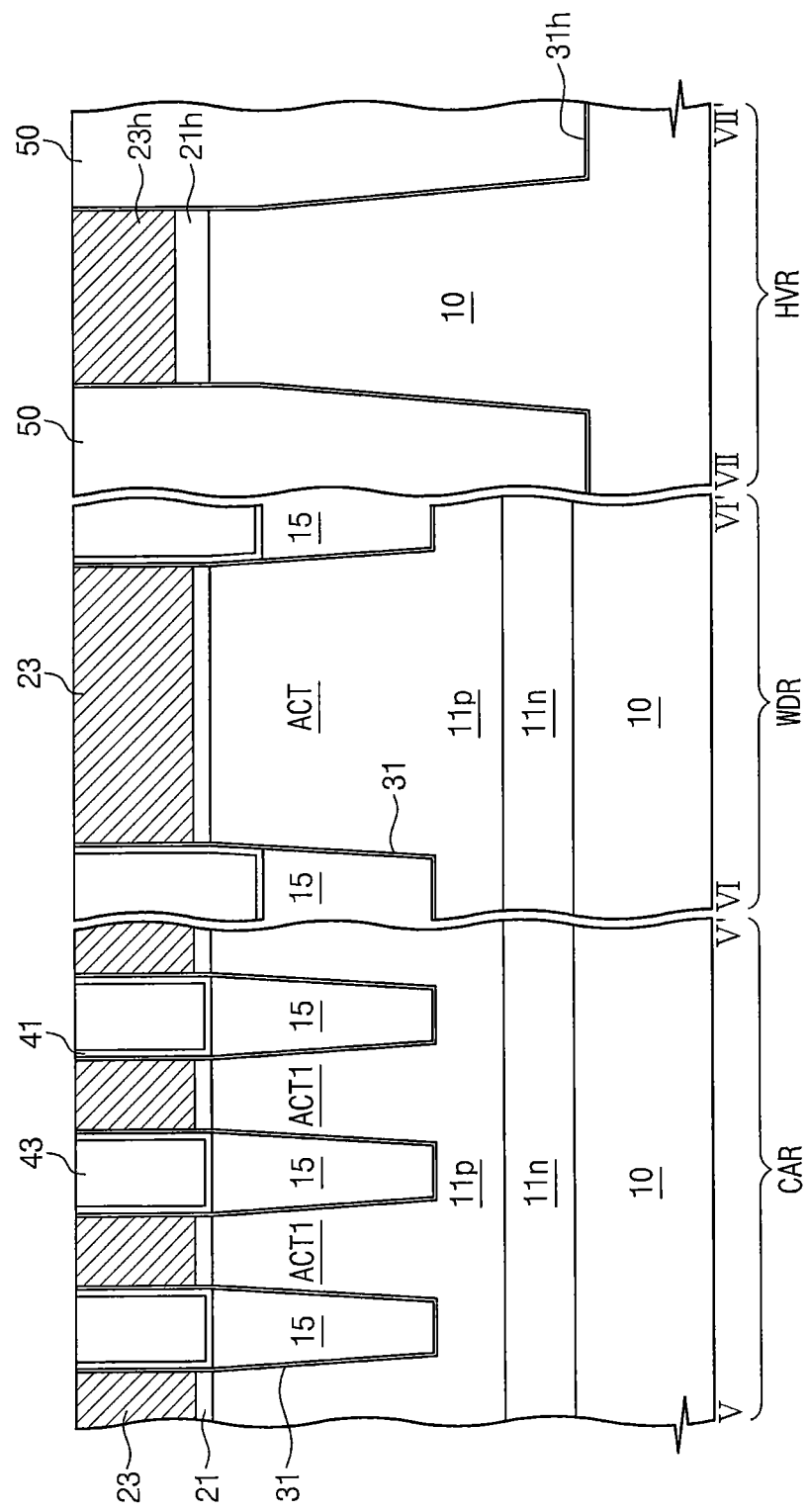

Referring to FIGS. 29 and 36, an insulating gapfill layer 50 may be formed in the peripheral trench 13h.

The insulating gapfill layer 50 may be formed by forming an insulating layer on the semiconductor substrate 10 to fill the peripheral trench 13h, and then, planarizing the insulating gapfill layer 50 to expose top surfaces of the floating gate pattern 24 and the peripheral conductive pattern 23h.

The insulating gapfill layer 50 may be formed of a silicon oxide layer with a good gap-fill property. For example, the insulating gapfill layer 50 may be formed of at least one of, for example, high density plasma (HDP) oxide, Tetra Ethyl Ortho Silicate (TEOS), Plasma Enhanced TEOS (PE-TEOS), $O_3$-TEOS, Undoped Silicate Glass (USG), PhosphoSilicate Glass (PSG), Borosilicate Glass (BSG), BoroPhosphoSilicate Glass (BPSG), Fluoride Silicate Glass (FSG), Spin On Glass (SOG), Tonen SilaZene (TOSZ) and/or any combination thereof.

Figure 37:
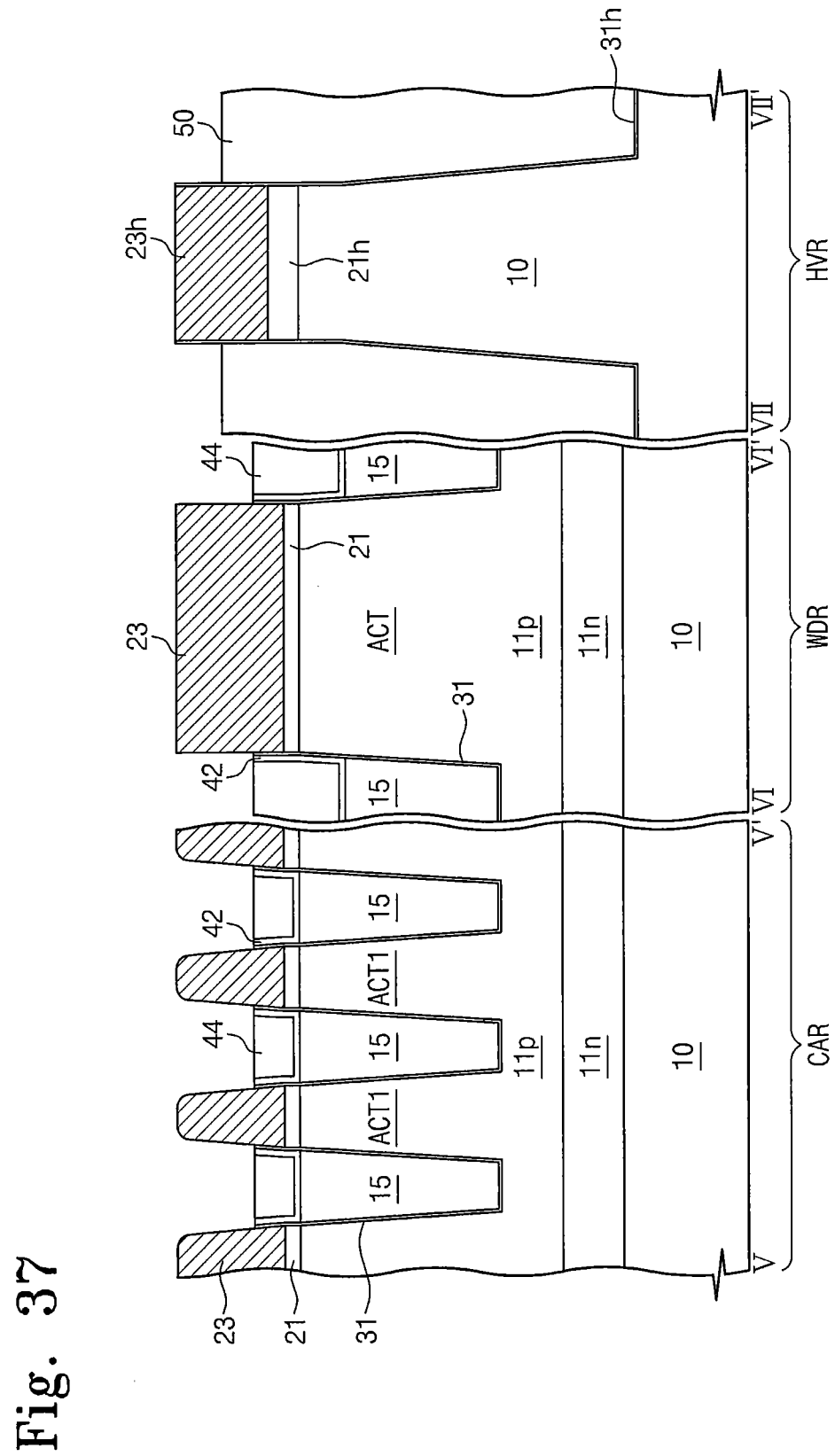

Referring to FIGS. 29 and 37, the second sacrificial layer 43 and the porous insulating layer 41 may be recessed to expose a portion of a sidewall of the floating gate pattern 24. Top surfaces of the second sacrificial layer 43 and the porous insulating layer 41 may be recesses by an isotropic or anisotropic etching process to form the porous insulating pattern 42 and the second sacrificial pattern 44, which may be formed between the active regions to be spaced apart from the bottom surfaces of the trenches 13. The top surfaces of the porous insulating pattern 42 and the second sacrificial pattern 44 may be located lower than the top surface of the floating gate pattern 24 and higher than the top surface of the tunnel insulating pattern 22. Further, the bottom surface of the porous insulating pattern 42 may be lower on the well drive region WDR than on the cell array region CAR. Upper corners of the floating gate pattern 24 may become rounded during the formation of the porous insulating pattern 42 and the second sacrificial pattern 44.

Figure 38:
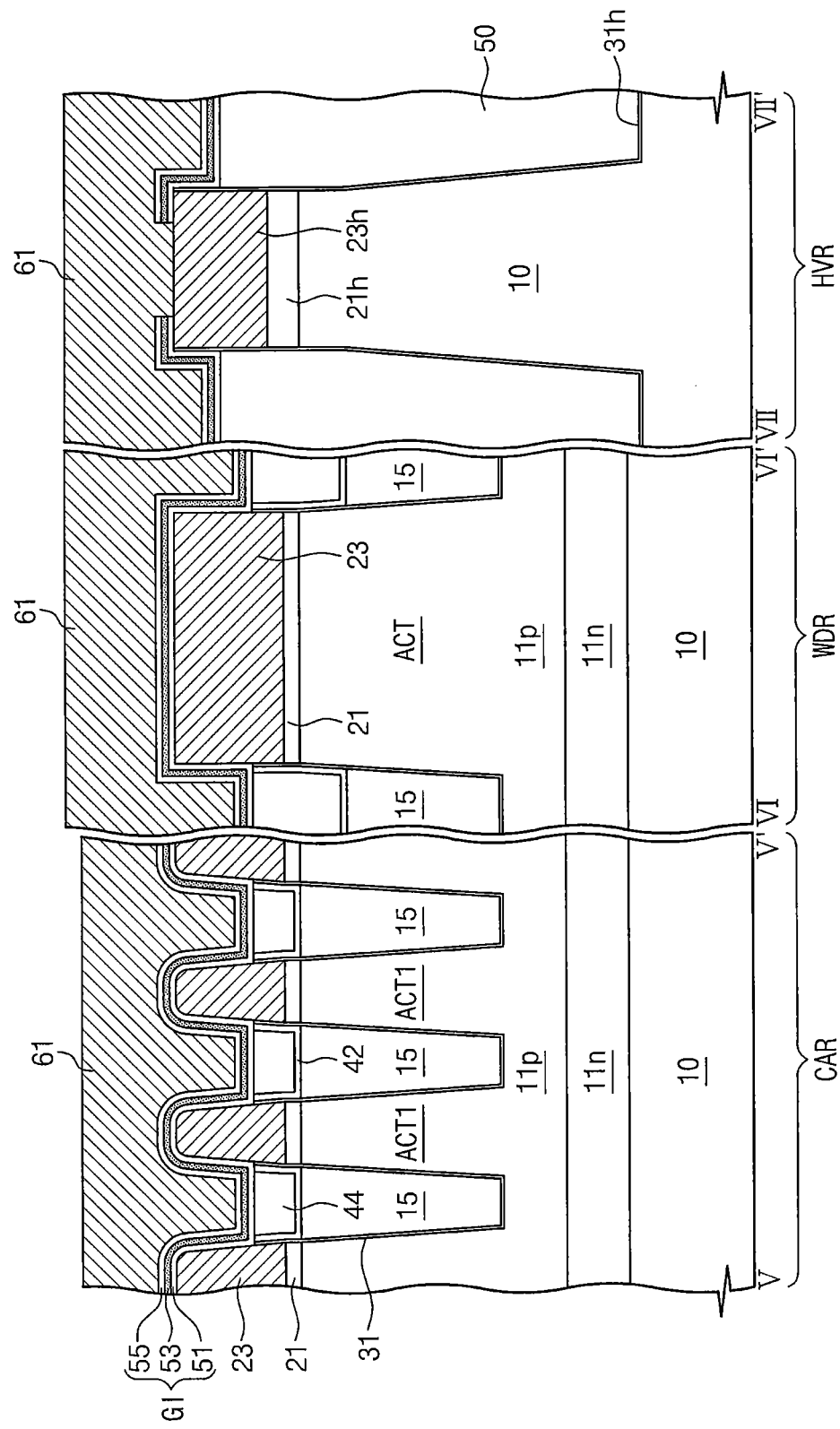

Referring to FIGS. 29 and 38, the blocking insulating layer GI and the control gate conductive layer 61 may be sequentially stacked on the semiconductor substrate 10.

The blocking insulating layer GI may be formed to conformally cover surfaces of the floating gate patterns 24 and top surfaces of the porous insulating pattern 42 and the second sacrificial pattern 44. The blocking insulating layer GI may be formed of a material whose dielectric constant is higher than that of the tunnel insulating pattern 22. As described with reference to FIG. 12, the blocking insulating layer GI may include the first dielectric 51, the second dielectric 53, and the third dielectric 55 that are sequentially stacked on the structure with the floating gate patterns 24. The first dielectric 51 and the second dielectric 53 may have different dielectric constants from each other. For example, the first and third dielectrics 51 and 55 may be formed of a silicon oxide layer, and the second dielectric 53 may be formed of a silicon nitride layer.

As described with reference to FIG. 12, the control gate conductive layer 61 may be formed by depositing a conductive material on the blocking insulating layer GI, and it may be formed to fill a gap between the floating gate patterns 24.

According to some embodiments, before the formation of the control gate conductive layer 61, the blocking insulating layer GI may be partially removed to expose a portion of the floating gate pattern 24. For example, the top surface of the peripheral conductive pattern 23h may be partially exposed on the peripheral circuit region HVR. Accordingly, the control gate conductive layer 61 may cover and/or be in direct contact with the top surface of the peripheral conductive pattern 23h on the peripheral circuit region HVR.

Figure 39:
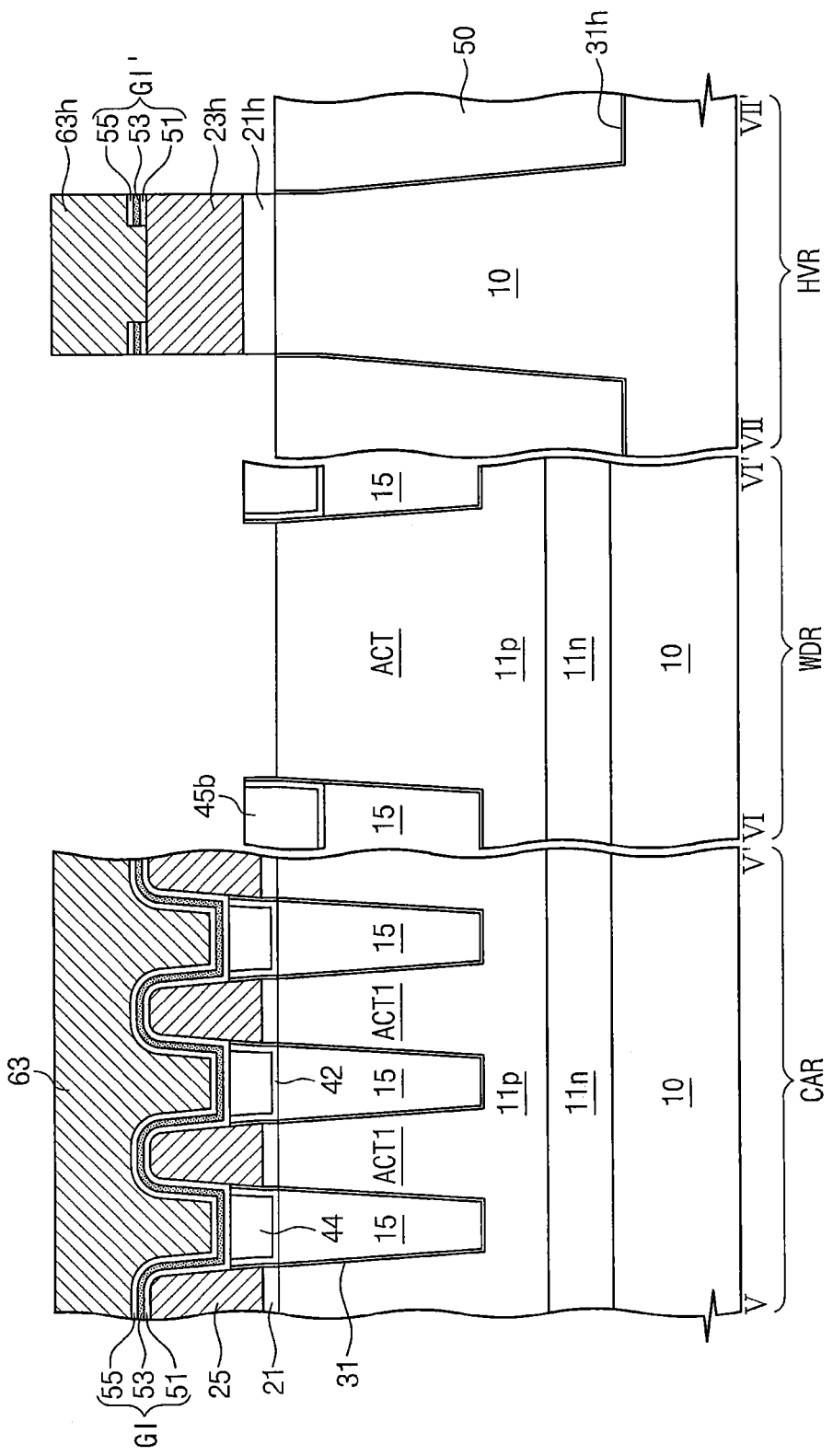

Referring to FIGS. 29 and 39, the control gate conductive layer 61, the blocking insulating layer GI, and the floating gate pattern 24 may be patterned to form the control gate electrode 63 on the cell array region CAR and a peripheral gate electrode on the peripheral circuit region HVR.

The forming of the control gate electrode 63 and the peripheral gate electrode may include forming a mask pattern (not shown) on the control gate conductive layer 61, and then, anisotropically and sequentially etching the floating gate pattern 24, the blocking insulating layer GI, and the control gate conductive layer 61 using the mask pattern (not shown) as an etch mask. Here, the mask pattern (not shown) may be formed to cross the first active regions ACT1 of the cell array region CAR and expose the control gate conductive layer 61 of the well drive region WDR.

During the formation of the control gate electrode 63 on the cell array region CAR, the floating gate electrodes 25 may be locally formed on the first active region ACT1. As described with reference to FIG. 13, the formation of the control gate electrodes 63 on the cell array region CAR may include forming the word lines WL crossing the first active regions ACT1, the ground selection lines GSL disposed adjacent the second active region ACT2 on the common source region CSR, and the string selection lines SSL disposed on the bit line contact region DCR. The ground and string selection lines GSL and SSL may be disposed to cross the first active regions ACT1.

The peripheral gate electrode may include the peripheral conductive pattern 23h, an inter-gate insulating pattern GI', and the upper conductive pattern 63h, which may be stacked on the peripheral circuit region HVR. On the well drive region WDR, the control gate conductive layer 61 and the floating gate pattern 24 may be removed to expose the active region. Since, in the anisotropic etching process for forming the control gate electrodes 63, the second sacrificial pattern 44 is thicker on the well drive region WDR than on the cell array region CAR, it is possible to prevent the air gap 15 from being exposed on well drive region WDR, when the control gate electrodes 63 are formed.

Figure 40:
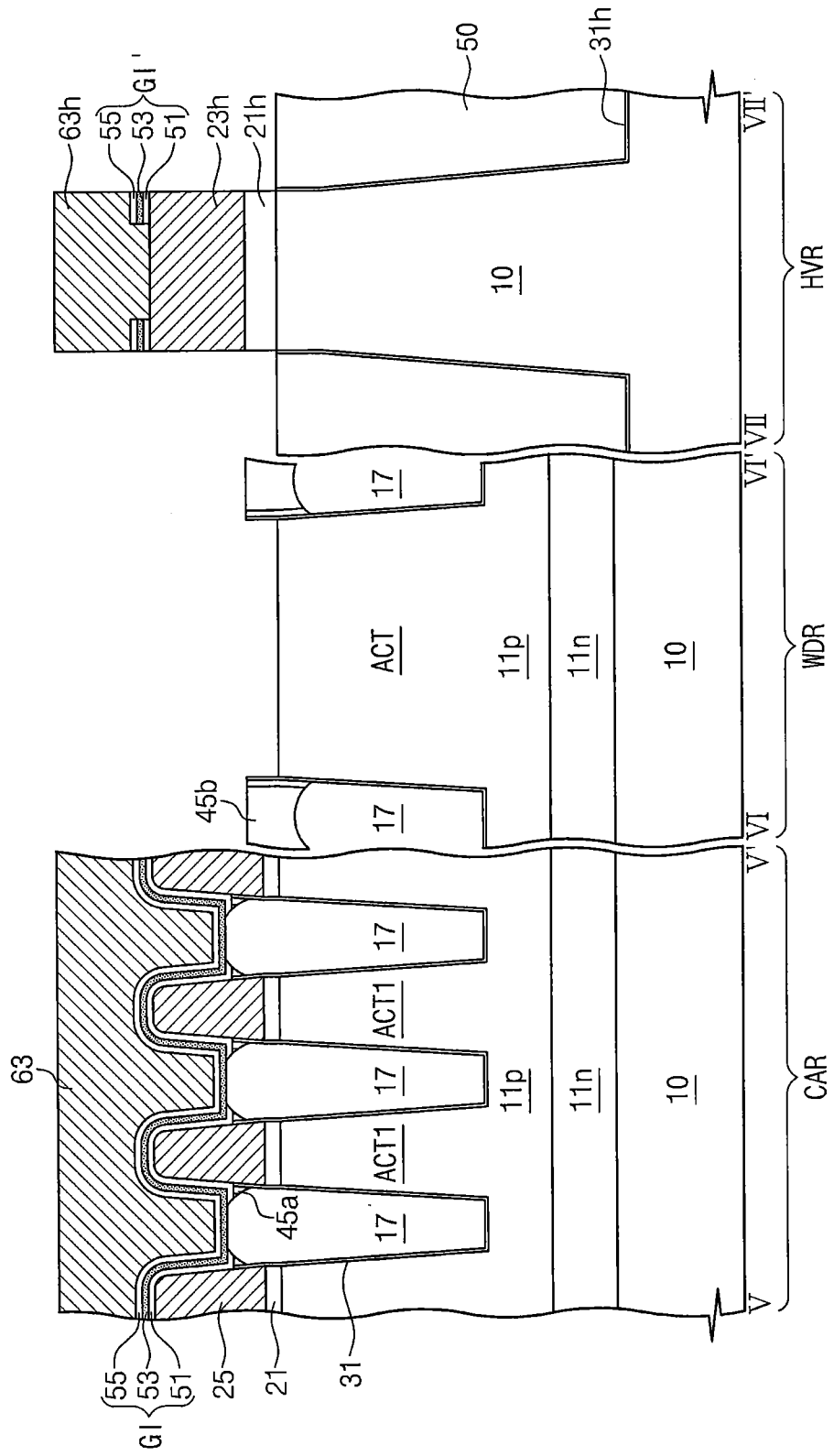

Referring to FIGS. 29 and 40, the porous insulating layer 41 and the second sacrificial pattern 44 may be removed to expand the air gap.

For example, as described with reference to FIG. 14, an etching solution may be supplied through the air gap 15 exposed between the control gate electrodes 63, and thus, the porous insulating pattern 42 and the second sacrificial pattern 44 may be sequentially etched in a wet etching manner. In some embodiments, the wet etching process may be performed to expose a bottom surface of the blocking insulating layer GI on the cell array region CAR. As the result of the removal of the porous insulating pattern 42 and the second sacrificial pattern 44, the air gap 15 of the cell array region CAR may be vertically expanded between the first active regions ACT1 to form the expanded air gap 17. The blocking insulating layer GI between the first active regions ACT1 may be exposed by the expanded air gap 17, and a portion of the blocking insulating layer GI may be etched during the formation of the expanded air gap 17. For example, as described with reference to FIG. 16, the second dielectric 53 of the blocking insulating layer GI may be exposed by the expanded air gap 17. Further, the rounded residue pattern 45a may remain on the lower sidewall of the floating gate electrode 25.

In some embodiments, the second sacrificial pattern 44 may be thicker on the well drive region WDR than on the cell array region CAR, when the wet etching process is performed. Accordingly, the remaining sacrificial pattern 45b may remain on the well drive region WDR. The remaining sacrificial pattern 45b, on the well drive region WDR, may have a rounded bottom surface, which may be located below the top surface of the semiconductor substrate 10. For example, the vertical height H1 of the expanded air gap 17 on the cell array region CAR may be different from the vertical height H3 of the expanded air gap 17 on the well drive region WDR.

Figure 41:
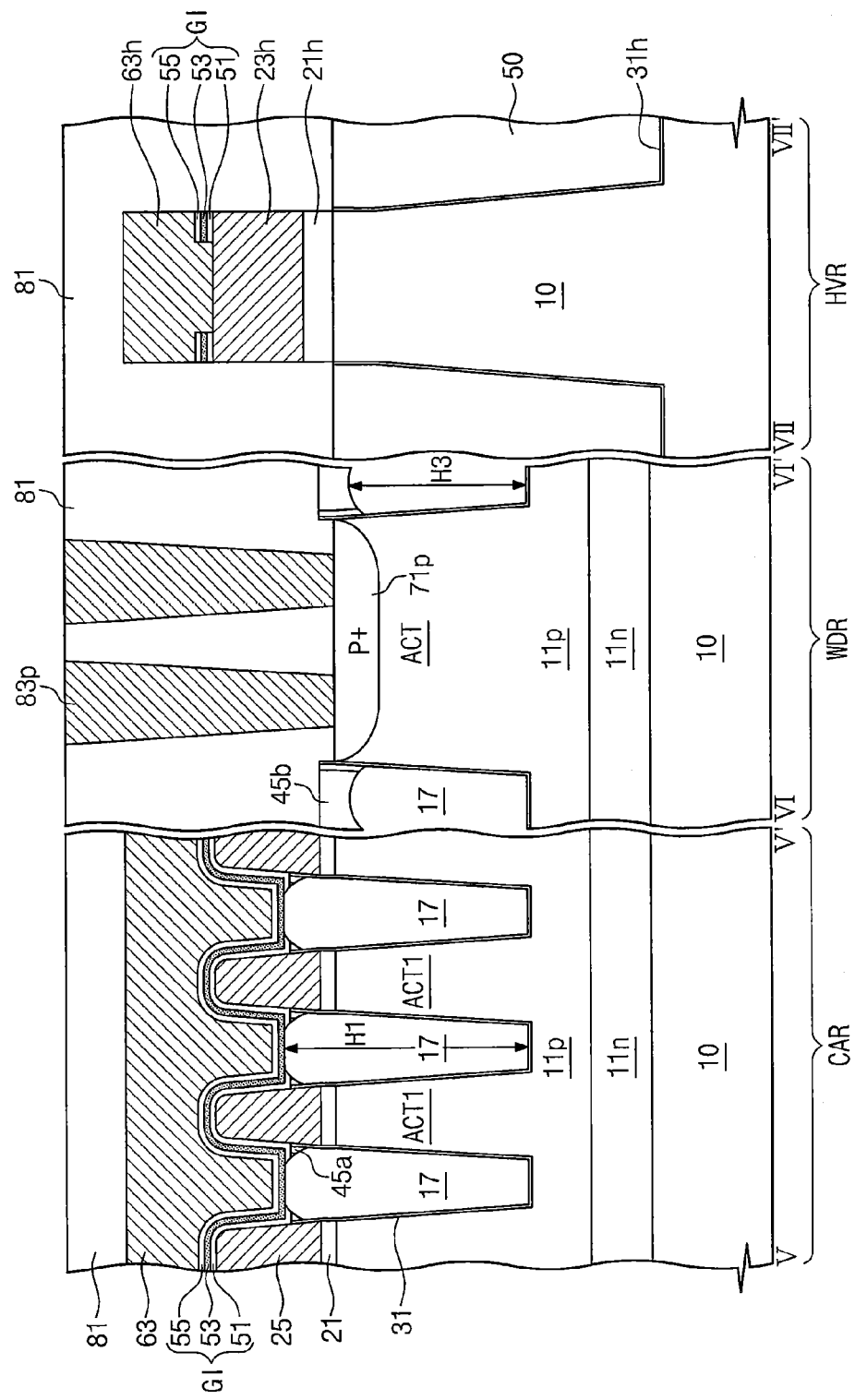

Referring to FIGS. 29 and 41, a first well pick-up region 71p may be formed in the pocket-well doped region 11p of the well drive region WDR. Further, a second well pick-up region may be formed in the well doped region 11n of the well drive region WDR. In addition, source/drain doped regions (not shown) may be formed in the peripheral circuit region HVR at both sides of the peripheral gate electrode 63h.

The first well pick-up region 71p may be formed to include a contact region between the pocket-well doped region 11p and a first well contact plug 83p thereon. The first well pick-up region 71p may be formed by an ion implantation process and have the same conductivity type (e.g., the first conductivity type) as that of the pocket-well doped region 11p. In some embodiments, the first well pick-up region 71p may have an impurity concentration higher than that of the pocket-well doped region 11p.

The second well pick-up region may be formed to include a contact region between the well doped region 11n and a second well contact plug 83h thereon. The second well pick-up region may be formed by an ion implantation process and have the same conductivity type (e.g., the second conductivity type) as that of the well doped region 11n. In some embodiments, the second well pick-up region may have an impurity concentration higher than that of the well doped region 11n.

Thereafter, the interlayered insulating layer 81 may be formed on the semiconductor substrate 10 provided with the control gate electrodes 63. The interlayered insulating layer 81 may cover the gate structures, each of which may include the floating gate electrode 25, the blocking insulating layer GI, and the control gate electrode 63, and the peripheral gate electrode 63h.

Referring to FIGS. 29 and 41, the first well contact plugs 83p and second well contact plugs 83n may be formed on the well drive region WDR.

The first well contact plugs 83p may be electrically connected to the first well pick-up region, and the second well contact plugs 83n may be electrically connected to the second well pick-up region. A predetermined voltage may be applied to the first well pick-up region through the first well contact pad PPAD and the first well contact plugs 83p, and thus, the voltage can be uniformly applied to the pocket-well doped region 11p. Accordingly, it may be possible to prevent the semiconductor memory device from malfunctioning. Further, a predetermined voltage may be applied to the second well pick-up region through the second well contact pad NPAD and the second well contact plugs 83n, and thus, the voltage can be (for example, uniformly) applied to the well doped region 11n.

The first well contact plugs 83p and the second well contact plugs 83n may be formed by forming contact holes in the interlayered insulating layer 81 and filling the contact holes with a conductive material. When the contact holes are formed on the well drive region WDR, the second sacrificial pattern 44 may remain on the expanded air gaps 17, and thus, it is possible to prevent the expanded air gap 17 from being exposed by the contact hole.

Figure 42:
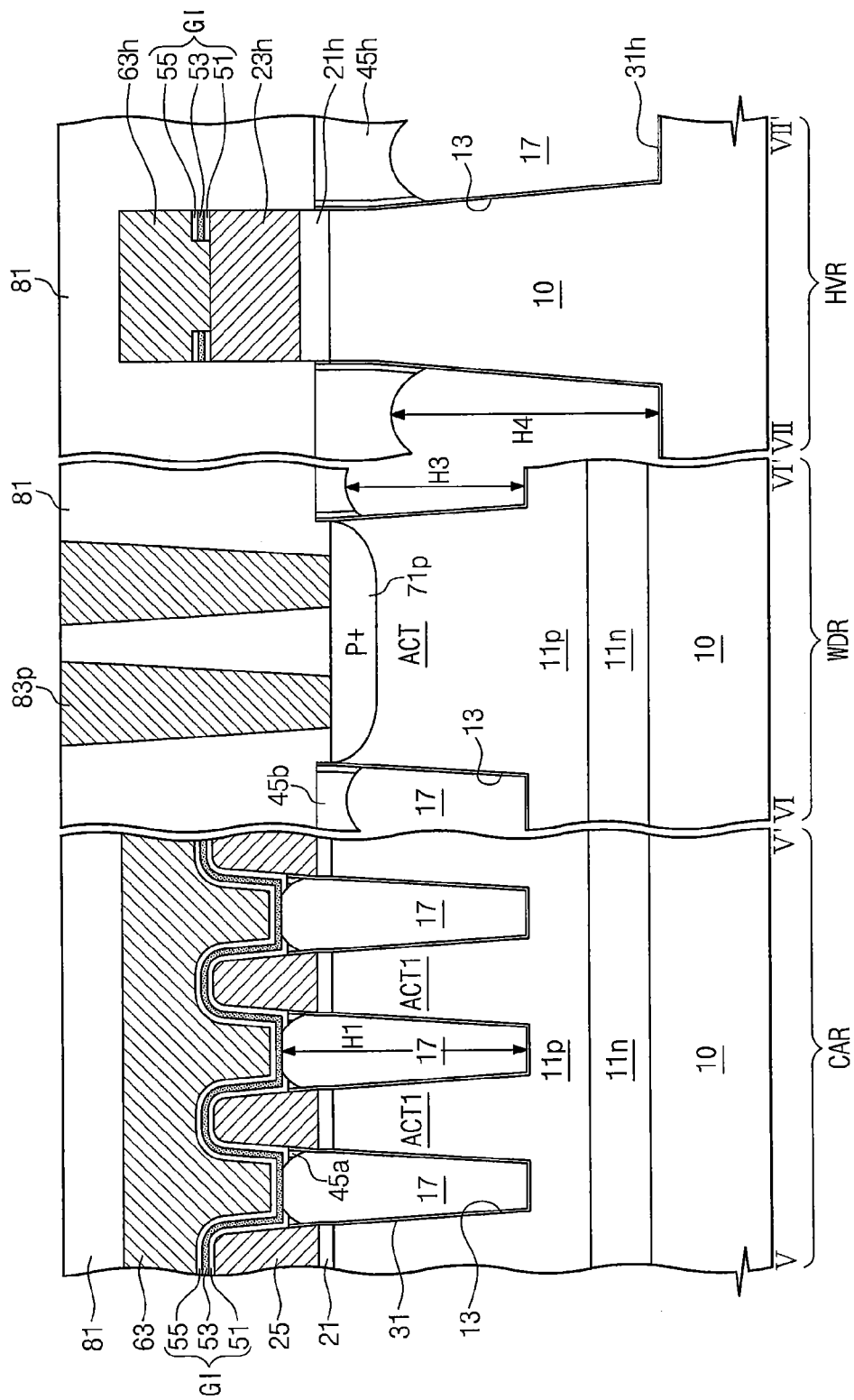
FIG. 42 is a sectional view illustrating a semiconductor memory device and a method of fabricating the same, according to some embodiments of the inventive concept.

FIG. 42 is a sectional view illustrating a semiconductor memory device and methods of fabricating the same, according to still some other embodiments of the inventive concept.

Referring to FIG. 42, as described with reference to FIGS. 30 through 41, the semiconductor substrate 10 may include the cell array region CAR, the well drive region WDR, and the peripheral circuit region HVR. The semiconductor substrate 10 may include the well doped region 11n and the pocket-well doped region 11p provided in the cell array region CAR and the well drive region WDR. In some embodiments, the well doped region 11n and the pocket-well doped region 11p may be formed to have the first conductivity type and the second conductivity type, respectively.

The trenches 13 may be formed in the semiconductor substrate 10 of the cell array region CAR and the well drive region WDR to define the active regions ACT1 and ACT, and the peripheral trenches 13h may be formed in the semiconductor substrate 10 of the peripheral circuit region HVR.

In some embodiments, the trenches 13 may be provided to define the first active regions ACT1, each of which is shaped like a line extending along the first direction, and the second active region ACT2 extending along the second or y-axis direction or perpendicular to the first direction. Further, the peripheral trenches 13h may be formed to be deeper than the trench 13 of the cell array region CAR. In other words, the bottom surface of the peripheral trench 13h may be positioned at a level lower than the bottom surface of the trench 13 of the cell array region CAR. Further, the bottom surface of the peripheral trench 13h may be positioned at a level lower than the well doped region 11n of the cell array region CAR.

As described with reference to FIG. 19, gate structures may be provided on the first active regions ACT1 of the cell array region CAR. Each of the gate structures may include the tunnel insulating pattern 22, the floating gate electrode 25, the blocking insulating layer GI, and the control gate electrode 63 sequentially stacked on the semiconductor substrate 10.

In some embodiments, the expanded air gap 17 may be provided in the trenches 13 or 13h of the cell array region CAR and the well drive region WDR.

For example, in the cell array region CAR, the expanded air gap 17 may be defined between the first active regions ACT1 and between the floating gate electrodes 25. In the cell array region CAR, the expanded air gap 17 may be defined by bottom and side surfaces of the trench 13 provided with the insulating liner 31 and the bottom surface of the blocking insulating layer GI. In some embodiments, a vertical height of the expanded air gap 17 may be changed depending on a vertical distance between bottoms of the blocking insulating layer GI and the trench 13. In some embodiments, on the cell array region CAR, a top surface or a highest position of the expanded air gap 17 may be located between top surfaces of the floating gate electrode 25 and the tunnel insulating pattern 22.

In the well drive region WDR, the expanded air gap 17 may be defined by the bottom and side surfaces of the trench 13 provided with the insulating liner 31 and a bottom surface of the remaining sacrificial pattern 45b. In the well drive region WDR, the expanded air gap 17 may be positioned below the remaining sacrificial pattern 45b. In this case, the remaining sacrificial pattern 45b may have a bottom surface that is located below the top surface of the semiconductor substrate 10 and have an upward convex profile. Further, the remaining sacrificial pattern 45b may have a top surface higher than that of the semiconductor substrate 10.

In well drive region WDR, the highest position of the expanded air gap 17 may be located below the top surface of the semiconductor substrate 10. For example, in the well drive region WDR, the highest position of the expanded air gap 17 may be located below that on the cell array region CAR. That is, the vertical height H1 of the expanded air gap 17 on the cell array region CAR may be greater than the vertical height H3 of the expanded air gap 17 on the well drive region WDR.

According to some embodiments, the expanded air gap 17 may be formed in the peripheral trench 13h of the peripheral circuit region HVR. The expanded air gap 17 in the peripheral trench 13h may be spaced apart from the bottom surface of the peripheral trench 13h and be formed below a remaining insulating pattern 45h, whose bottom surface has a rounded profile and is located below the top surface of the semiconductor substrate 10. Since the trench 13 of the well drive region WDR has a different depth from that of the peripheral trench 13h of the peripheral circuit region HVR, the vertical height H4 of the expanded air gap 17 in the peripheral trench 13h may be greater than the vertical height H3 of the expanded air gap 17 in the trench 13 of the well drive region WDR.

For example, the lowermost position of the expanded air gap 17 on the cell array region CAR may be located over that on the peripheral circuit region HVR. The uppermost position of the expanded air gap 17 on the cell array region CAR may be located over that on the peripheral circuit region HVR. Furthermore, the uppermost position of the expanded air gap 17 on the cell array region CAR may be located between the top surfaces of the floating gate electrode 25 and the tunnel insulating pattern 22. The uppermost position of the expanded air gap 17 on the peripheral circuit region HVR may be located below the top surface of the semiconductor substrate 10. Further, the bottom surface of the remaining insulating pattern 45h of the peripheral circuit region HVR may be provided below that of the remaining sacrificial pattern 45b of the well drive region WDR.

According to embodiments shown in FIG. 42, a process of forming the peripheral trench 13h, described with reference to FIG. 35, may be performed before a process of filling the trenches 13 of the cell array region CAR and the well drive region WDR with the first sacrificial layer 33 described with reference to FIG. 32. Accordingly, when the first sacrificial patterns 34 are formed in the trenches 33 of the cell array region CAR and the well drive region WDR as described with reference to FIG. 33, the first sacrificial pattern may be formed in the peripheral trench 13h of the peripheral circuit region HVR. Here, similar to the first sacrificial pattern 34 of the well drive region WDR, the first sacrificial pattern provided in the peripheral trench 13h may have a bottom surface that is located below the top surface of the semiconductor substrate 10.

Further, when the air gaps 15 are formed in the trenches 13 of the cell array region CAR and the well drive region WDR as described with reference to FIG. 34, the air gap 15 may be formed in the peripheral trench 13h. When the expanded air gaps 17 are formed in the trenches 13 of the cell array region CAR and the well drive region WDR as described with reference to FIG. 40, the expanded air gap 17 may be formed in the peripheral trench 13h. That is, the remaining sacrificial pattern 45h may be formed to have a rounded bottom surface that is spaced apart from the bottom surface of the peripheral trench 13h and is located below the top surface of the semiconductor substrate 10.

Figure 43:
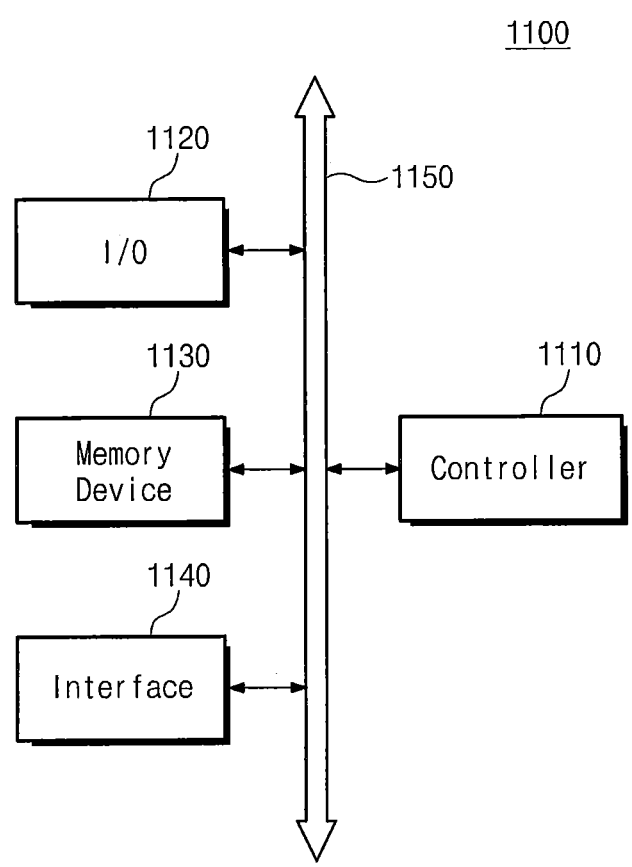
FIG. 43 is a schematic block diagram illustrating an example of memory systems including a semiconductor memory device according to some embodiments of the inventive concept.

FIG. 43 is a schematic block diagram illustrating an example of memory systems including a semiconductor memory device according to some embodiments of the inventive concept.

Referring to FIG. 43, a memory system 1100 can be applied to, e.g., a personal digital assistant (PDA), a portable computer, a web tablet, a wireless phone, a mobile phone, a digital music player, a memory card and/or all the devices that can transmit and/or receive data in a wireless communication environment.

The memory system 1100 may include a controller 1110, an input/output device 1120, e.g., such as a keypad and a display device, a memory 1130, an interface 1140, and a bus 1150. The memory 1130 and the interface 1140 communicate with each other through the bus 1150.

The controller 1110 may include at least one microprocessor, at least one digital signal processor, at least one micro controller and/or other process devices similar to the microprocessor, the digital signal processor, and the micro controller. The memory 1130 may be used to store an instruction that may be executed by the controller 1110. The input/output device 1120 may receive data or a signal from the outside of the system 1100 and/or transmit data and/or a signal to the outside of the system 1100. For example, the input/output device 1120 may include a keyboard, a keypad and/or a display device, among others.

The memory 1130 includes at least one of the semiconductor memory devices according to some embodiments of the inventive concept. The memory 1130 may further include a different kind of memory, a semiconductor memory device capable of random access and various kinds of memories.

The interface 1140 transmits data to a communication network or receives data from a communication network.

Furthermore, a semiconductor memory device according to the inventive concept may be packaged in various kinds of ways. For instance, the semiconductor memory device may be employed in a Package on Package (PoP), Ball Grid Array (BGA), Chip Scale Package (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP). The package in which the semiconductor device according to one of the above embodiments is mounted may further include at least one semiconductor device (e.g., a controller and/or a logic device) that controls the nonvolatile memory device.

Figure 44:
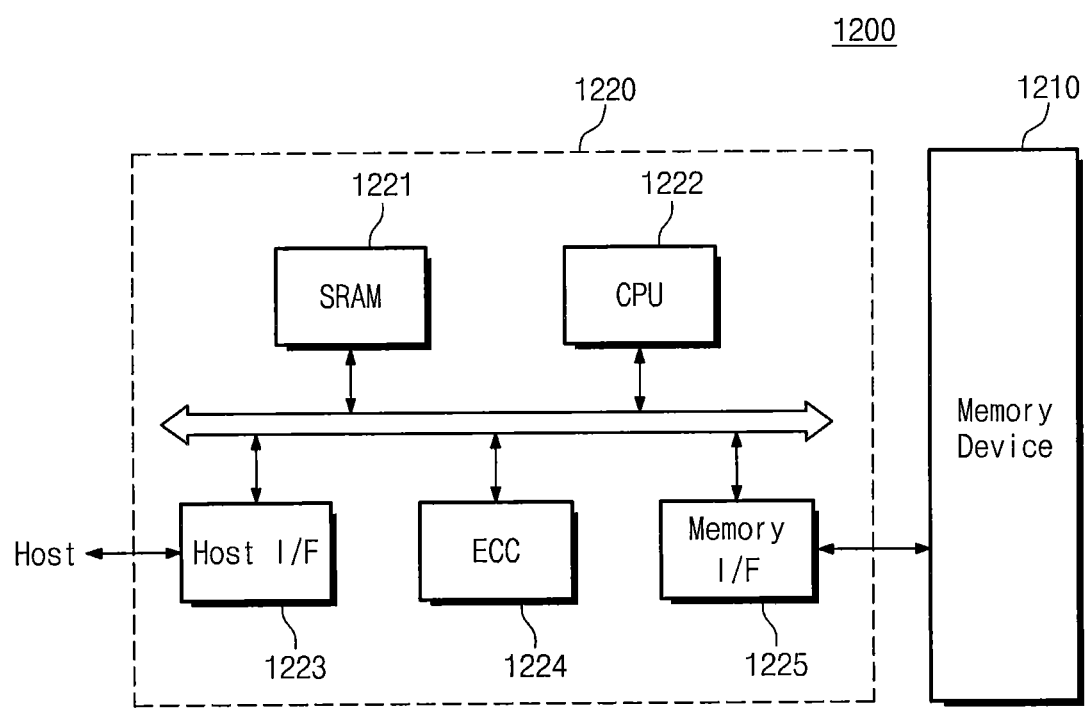
FIG. 44 is a schematic block diagram illustrating an example of memory cards including a semiconductor memory device according to some embodiments of the inventive concept.

FIG. 44 is a schematic block diagram illustrating an example of memory cards including a semiconductor memory device according to some embodiments of the inventive concept.

Referring to FIG. 44, the memory card 1200 for supporting a storage capability of a large capacity is fitted with a semiconductor memory device 1210, which may be the semiconductor memory devices according to some embodiments of the inventive concept. The memory card 1200 includes a memory controller 1220 that is configured to control data exchanged between a host and the semiconductor memory device 1210.

A static random access memory (SRAM) 1221 is used as an operation memory of a processing unit 1222. A host interface 1223 includes data exchange protocols of a host to be connected to the memory card 1200. An error correction block 1224 detects and corrects errors included in data readout from a multi bit semiconductor memory device 1210. A memory interface 1225 interfaces with the semiconductor memory device 1210. The processing unit 1222 performs every control operation for exchanging data of the memory controller 1220. Even though not depicted in drawings, it is apparent to one of ordinary skill in the art that the memory card 1200 according to some embodiments of the inventive concept may further include a ROM (not shown) storing code data for interfacing with the host.

Figure 45:
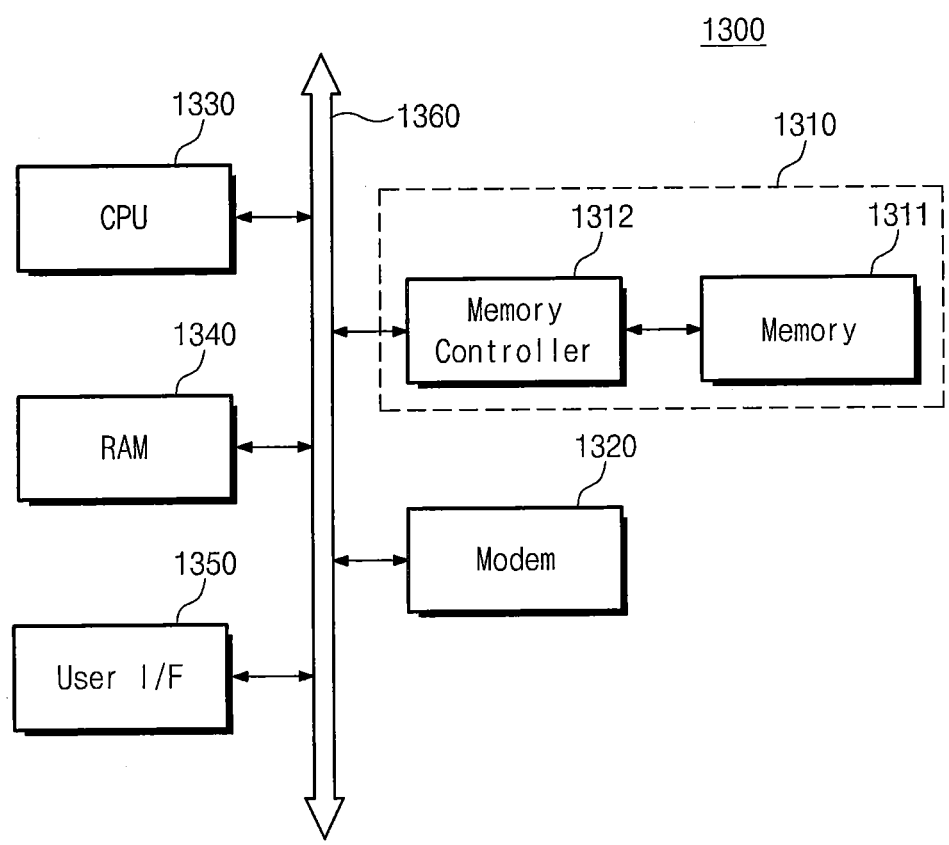
FIG. 45 is a schematic block diagram illustrating an example of information processing systems including a semiconductor memory device according to some embodiments of the inventive concept.

FIG. 45 is a schematic block diagram illustrating an example of information processing systems including a semiconductor memory device according to some embodiments of the inventive concept.

Referring to FIG. 45, an information processing system 1300 may be realized using a memory system 1310 including at least one of the semiconductor memory devices according to some embodiments of the inventive concept. For instance, the information processing system 1300 may be a mobile device and/or a desktop computer. In some embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312. In some embodiments, the memory system 1310 may be configured substantially identical to the memory system 1100 or the memory card 1200. Data processed by the CPU 1330 and/or input from the outside may be stored in the memory system 1310. In some embodiments, the memory system 1310 may be used as a portion of a solid state drive (SSD), and in this case, the information processing system 1300 may stably and reliably store a large amount of data in the memory system 1310. Although not illustrated, it is apparent to those skilled in the art that, for example, an application chipset, a camera image sensor, a camera image signal processor (ISP), an input/output device, or the like may further be included in the information processing system 1300 according to the inventive concept.

According to some embodiments of the inventive concept, the semiconductor memory device may include an air gap provided between active regions and/or between floating gate electrodes. Due to the presence of the air gap, the gap region between the active regions and between the floating gate electrodes can have a dielectric constant of about 1. Accordingly, it is possible to reduce parasitic capacitance between the active regions. As a result, it is possible to improve performance of the semiconductor memory device.

The semiconductor memory device may be configured in such a way that air gaps therein are formed to have different vertical heights from region to region. This makes it possible to prevent the air gap from being exposed when contact plugs to be connected to the active region are formed. Accordingly, it is possible to suppress electric failures of the semiconductor memory device from occurring.

While some embodiments of the inventive concept have been particularly shown and described, it will be understood by one of ordinary skill in the art that variations in form and detail may be made therein without departing from the spirit and scope of the attached claims.

What is claimed is:

1. A method of fabricating a semiconductor memory device, comprising:
    forming patterns that are adjacent one another on a semiconductor substrate;
    forming a trench in the semiconductor substrate between the patterns;
    forming a sacrificial pattern in the trench that defines an air gap and that covers lower sidewalls of the patterns;
    forming a blocking insulating layer and a gate electrode on the patterns and the sacrificial pattern; and
    removing the sacrificial pattern through the air gap to form an expanded air gap exposing a bottom surface of the blocking insulating layer between the patterns,
    wherein forming the sacrificial pattern comprises:
    forming a first sacrificial layer in the trench to expose sidewalls of the patterns;
    forming a porous insulating layer with pores on the patterns, the porous insulating layer extending on a top surface of the first sacrificial layer;
    removing the first sacrificial layer through the pores of the porous insulating layer to form the air gap below the porous insulating layer;
    forming a second sacrificial layer on the porous insulating layer to fill a gap between the patterns; and
    recessing the porous insulating layer and the second sacrificial layer to expose sidewalls of the patterns.

2. The method of claim 1, wherein the first sacrificial layer is formed of a SOH layer and/or a photoresist layer.

3. The method of claim 1, wherein forming the expanded air gap comprises isotropically etching the sacrificial pattern exposed by the air gap.

4. The method of claim 1,
    wherein forming the blocking insulating layer comprises sequentially stacking a first dielectric, a second dielectric, and a third dielectric, and
    wherein forming the expanded air gap comprises removing a portion of the first dielectric between the patterns to expose a portion of the second dielectric.

5. The method of claim 1, further comprising, before forming the sacrificial layer, forming an insulating liner conformally covering an inner surface of the trench.

6. The method of claim 1, wherein forming the patterns comprises forming a tunnel insulating layer and a floating gate electrode that are sequentially stacked on the semiconductor substrate.

7. A method of fabricating a semiconductor memory device, comprising:
    preparing a semiconductor substrate with a first region and a second region that are adjacent one another;
    patterning the semiconductor substrate to form a trench crossing the first and second regions;
    forming a first sacrificial layer on the semiconductor substrate to fill the trench;
    forming a sacrificial mask pattern on the first sacrificial layer to expose the first sacrificial layer of the second region;
    anisotropically etching the sacrificial mask pattern and the first sacrificial layer to form a first sacrificial pattern in the trench, a top surface of the first sacrificial pattern being positioned higher on the first region than on the second region;
    forming a porous insulating layer on the first and second regions to cover the first sacrificial pattern;
    removing the first sacrificial pattern through pores of the porous insulating layer to form an air gap in the trench; and
    forming a gate electrode on the porous insulating layer of the first region to cross the trench,
    wherein a vertical height of the air gap is greater on the first region than on the second region, and
    wherein forming the first sacrificial pattern comprises anisotropically etching the sacrificial mask pattern and the first sacrificial layer using an etch recipe such that an etch rate of the sacrificial mask pattern is greater than that of the first sacrificial layer.

8. The method of claim 7, wherein the first sacrificial layer is formed of a SOH layer and/or a photoresist layer.

9. The method of claim 7, wherein the top surface of the first sacrificial pattern on the second region is formed below a top surface of the semiconductor substrate.

10. The method of claim 7, wherein forming the trench comprises:
    forming data storing patterns on the semiconductor substrate; and
    anisotropically etching the semiconductor substrate between the data storing patterns.

11. The method of claim 10, before forming the gate electrode, further comprising:
    forming a second sacrificial pattern on the porous insulating layer between the data storing patterns to expose top and side surfaces of the data storing patterns; and
    forming a blocking insulating layer to conformally cover the top and side surfaces of the data storing patterns and extend over the second sacrificial pattern.

12. The method of claim 11, wherein a bottom surface of the second sacrificial pattern is positioned lower on the second region than on the first region.

13. The method of claim 11, after forming the gate electrode, further comprising removing the porous insulating layer and the second sacrificial pattern between the data storing patterns through the air gap to form an expanded air gap that exposes a bottom surface of the blocking insulating layer.

14. The method of claim 13, wherein forming the expanded air gap comprises removing a portion of the second sacrificial pattern on the second region.

15. The method of claim 13,
wherein an uppermost position of the expanded air gap on the first region is positioned between top and bottom surfaces of the data storing pattern, and
wherein an uppermost position of the expanded air gap on the second region is positioned below a top surface of the semiconductor substrate.

* * * * *